United States Patent
Lee et al.

(10) Patent No.: US 9,646,407 B2
(45) Date of Patent: May 9, 2017

(54) FLEXIBLE DISPLAY APPARATUS AND FLEXIBLE DISPLAY APPARATUS CONTROLLING METHOD

(71) Applicant: SAMSUNG ELECTRONICS CO., LTD., Suwon-si (KR)

(72) Inventors: Chang-soo Lee, Seosan-si (KR); Kyung-a Kang, Seoul (KR); Geun-ho Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 14/047,051

(22) Filed: Oct. 7, 2013

(65) Prior Publication Data
US 2014/0098095 A1    Apr. 10, 2014

(30) Foreign Application Priority Data
Oct. 5, 2012  (KR) .................. 10-2012-0110913

(51) Int. Cl.
*G06T 15/00*    (2011.01)
*G06F 3/041*    (2006.01)
(Continued)

(52) U.S. Cl.
CPC ............ *G06T 15/00* (2013.01); *G06F 1/1652* (2013.01); *G06F 3/041* (2013.01); *G06F 3/0482* (2013.01);
(Continued)

(58) Field of Classification Search
CPC .............. G06F 1/1652; G06F 3/0487; G06F 2203/04102; G06F 1/1641;
(Continued)

(56) References Cited

U.S. PATENT DOCUMENTS

2008/0254882 A1 * 10/2008 Watanabe ............ A63F 13/005
463/31
2009/0059018 A1 * 3/2009 Brosnan ............ H04N 5/23238
348/218.1
(Continued)

FOREIGN PATENT DOCUMENTS

EP    0 899 651 A2    3/1999
EP    1 178 460 A2    2/2002
(Continued)

OTHER PUBLICATIONS

Communication dated Nov. 26, 2013, issued by the European Patent Office in counterpart European Application No. 13187444.8.
(Continued)

*Primary Examiner* — Gregory J Tryder
*Assistant Examiner* — Scott E Sonners
(74) *Attorney, Agent, or Firm* — Sughrue Mion, PLLC

(57) ABSTRACT

A flexible display apparatus and a method configured to display three-dimensional (3D) space is disclosed. The flexible display apparatus includes a display that is deformable and is configured to display three-dimensional (3D) image data, a sensor configured to sense deformation of the display, and a controller configured to display some of the 3D image data corresponding to the sensed deformation of the display. The method for controlling a flexible display apparatus with a display includes sensing deformation of a display, and displaying some three-dimensional (3D) image data corresponding to the deformation when the deformation is bending of the display.

14 Claims, 45 Drawing Sheets

(51) Int. Cl.
*G06F 1/16* (2006.01)
*G09G 3/00* (2006.01)
*G06F 3/0481* (2013.01)
*G06F 3/0482* (2013.01)
*G06F 3/0483* (2013.01)
*G09G 3/20* (2006.01)
*G09G 3/3208* (2016.01)
*H01L 27/32* (2006.01)
*G06F 1/32* (2006.01)

(52) U.S. Cl.
CPC ........ *G06F 3/0483* (2013.01); *G06F 3/04815* (2013.01); *G09G 3/003* (2013.01); *G09G 3/006* (2013.01); *G09G 3/20* (2013.01); *G09G 3/3208* (2013.01); *G06F 1/3265* (2013.01); *G06F 2203/04102* (2013.01); *G09G 2354/00* (2013.01); *G09G 2380/02* (2013.01); *H01L 27/3225* (2013.01); *H01L 2251/5338* (2013.01); *Y02B 60/1242* (2013.01)

(58) Field of Classification Search
CPC ...... G06F 2203/04803; G09G 2354/00; G09G 2380/02; G09G 3/003; G06T 5/006; H04N 5/2628
See application file for complete search history.

(56) References Cited

U.S. PATENT DOCUMENTS

| | | |
|---|---|---|
| 2009/0275366 A1 | 11/2009 | Schilling |
| 2011/0158505 A1 | 6/2011 | Sun |
| 2011/0188189 A1 | 8/2011 | Park et al. |
| 2011/0227855 A1 | 9/2011 | Kim et al. |
| 2012/0092363 A1 | 4/2012 | Kim et al. |
| 2013/0044240 A1* | 2/2013 | Leskela ................ H04N 5/2253 348/239 |
| 2013/0241921 A1* | 9/2013 | Kurtenbach et al. ......... 345/419 |

FOREIGN PATENT DOCUMENTS

| | | |
|---|---|---|
| EP | 2 333 756 A1 | 6/2011 |
| KR | 10-2010-0081161 A | 7/2010 |
| KR | 10-1063882 B1 | 9/2011 |
| KR | 10-2011-0133861 A | 12/2011 |
| KR | 10-2012-0038334 A | 4/2012 |

OTHER PUBLICATIONS

Search Report dated Jan. 22, 2014, issued by the International Searching Authority in counterpart International Application No. PCT/KR2013/008912.

Written Opinion dated Jan. 22, 2014, issued by the International Searching Authority in counterpart International Application No. PCT/KR2013/008912.

\* cited by examiner

FIG. 5
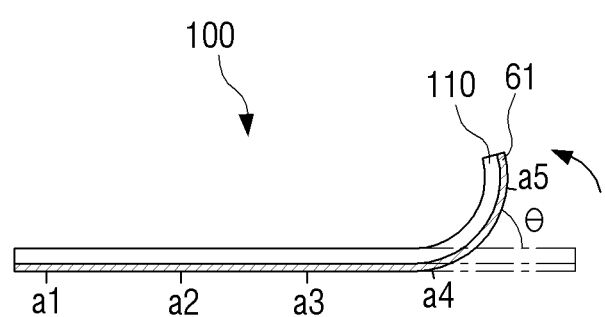
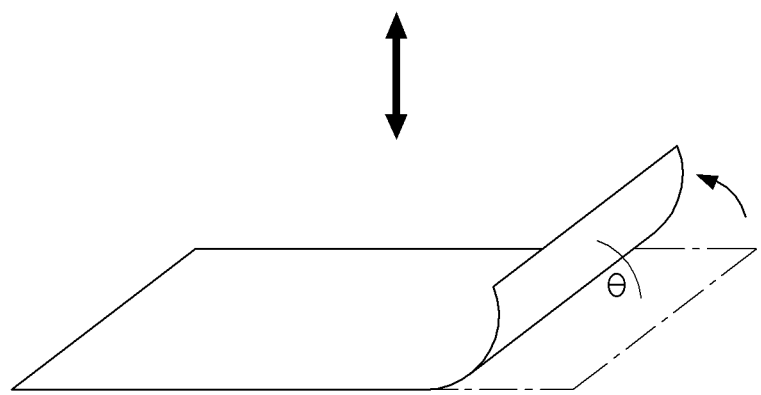

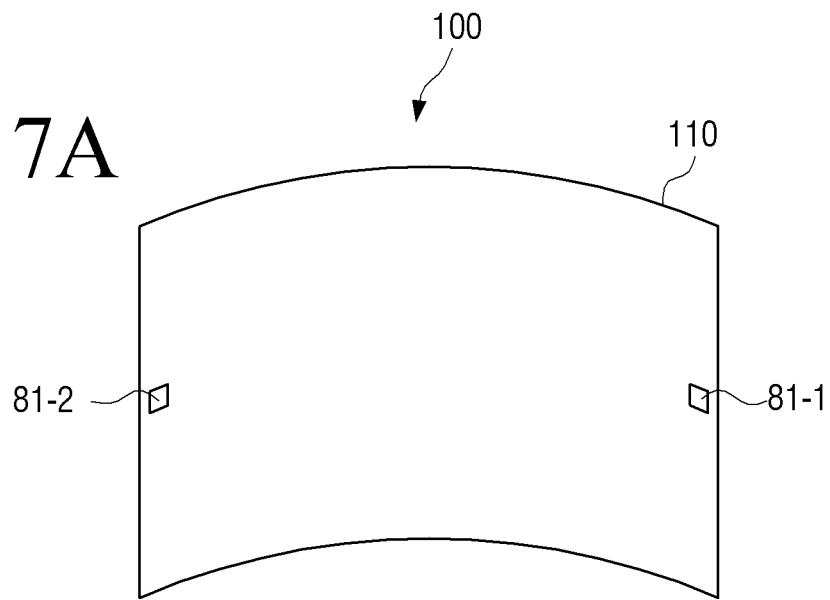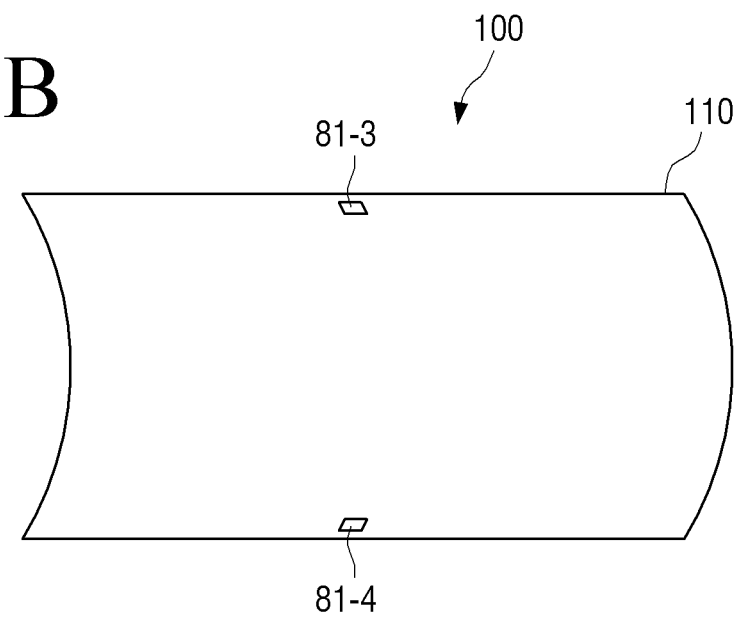

FIG. 18A
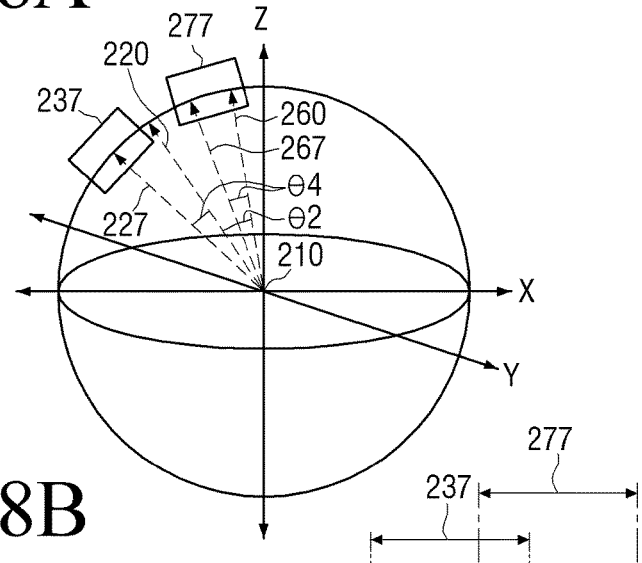
FIG. 18B
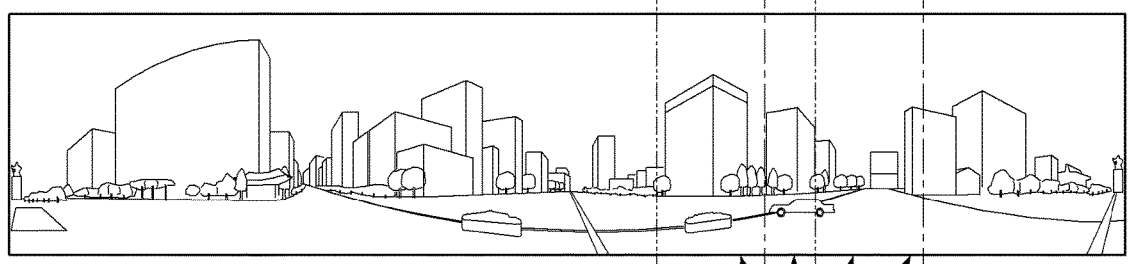
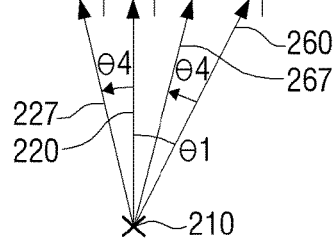
FIG. 18C
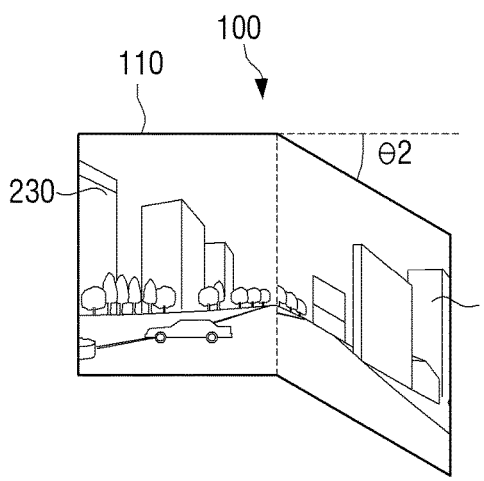
FIG. 18D
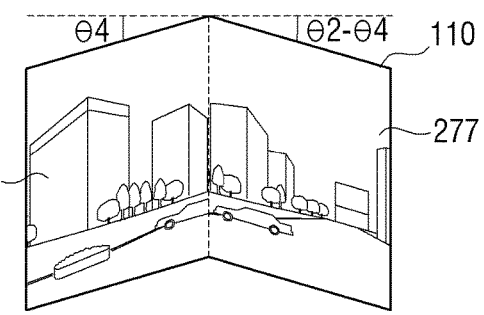

FIG. 21
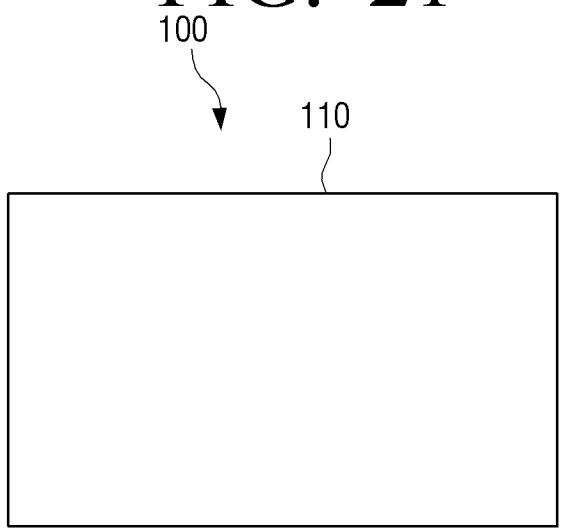
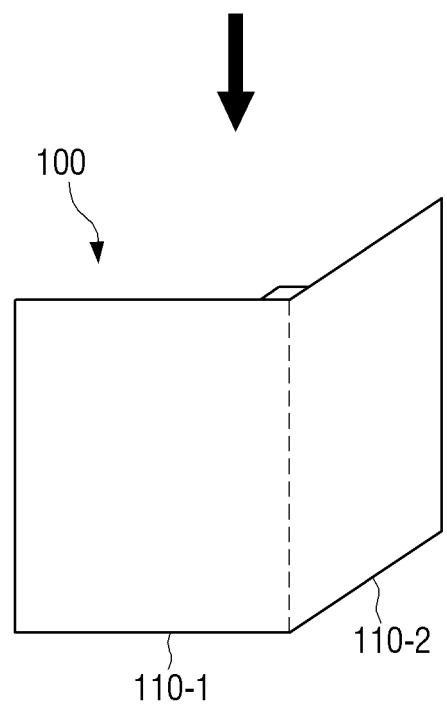

FIG. 22
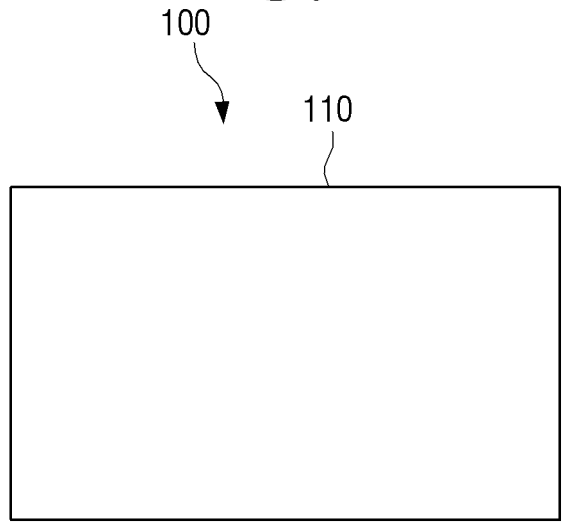
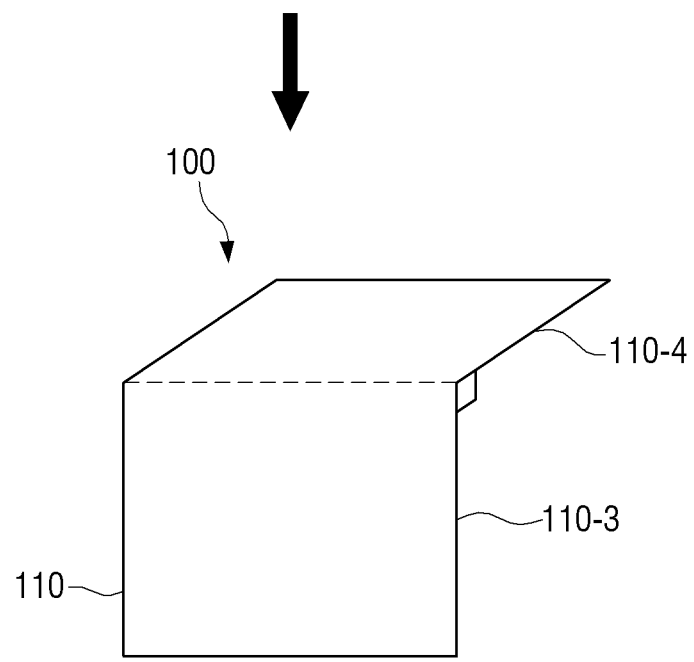

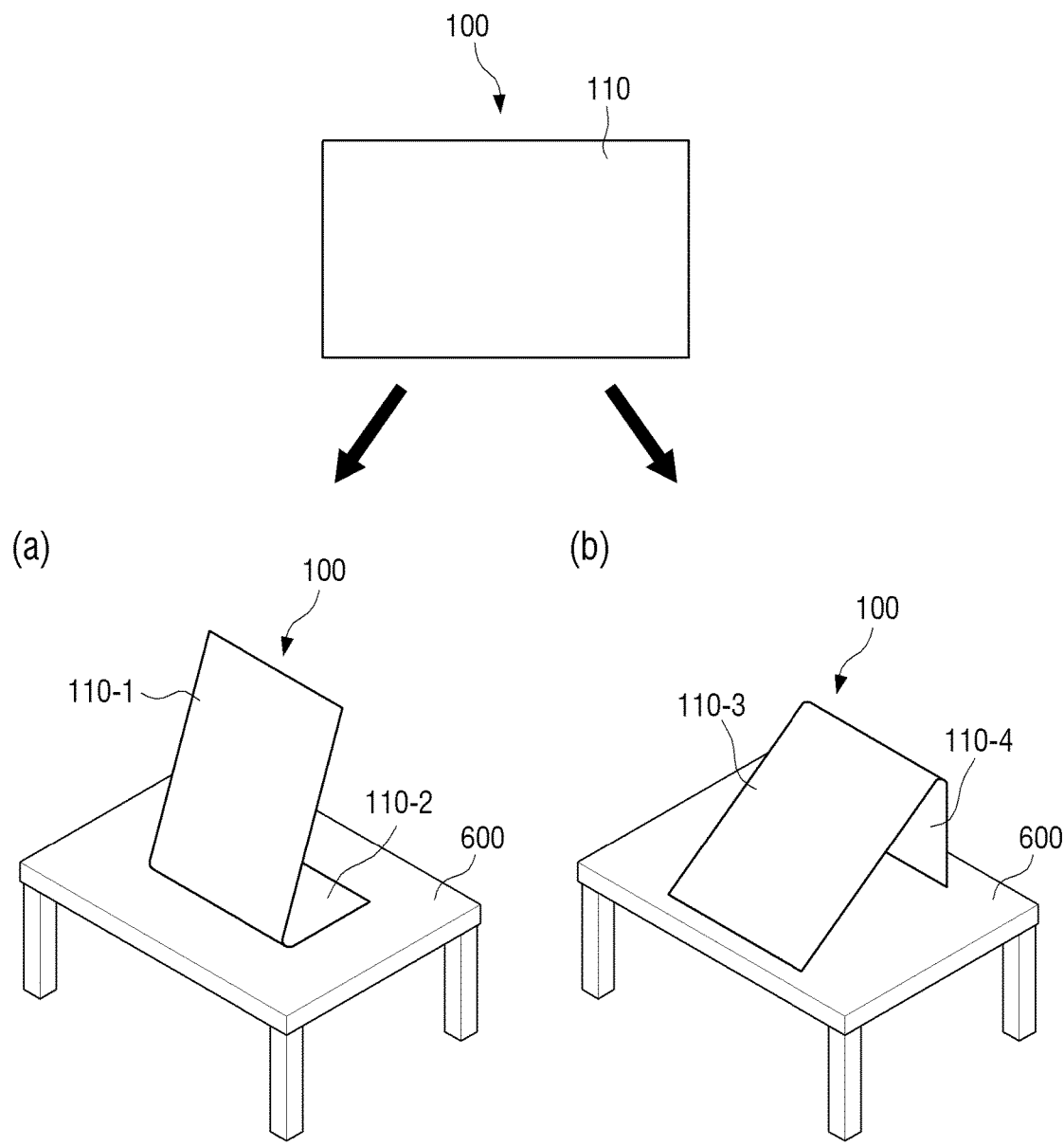

FLEXIBLE DISPLAY APPARATUS AND FLEXIBLE DISPLAY APPARATUS CONTROLLING METHOD

CROSS-REFERENCE TO RELATED APPLICATION

This application claims priority from Korean Patent Application No. 10-2012-0110913, filed in the Korean Intellectual Property Office on Oct. 5, 2012, the disclosure of which is incorporated herein by reference in its entirety.

BACKGROUND

1. Field

Apparatuses and methods consistent with what is disclosed herein relate to a flexible displaying apparatus and a control method thereof, and more particularly, to a display apparatus having a display which is changeable in form, and a control method thereof.

2. Description of the Related Art

The advanced electronic technology has enabled development and implementation of various display apparatus applications. For example, a variety of display kinds, such as Cathode ray tube display (CRT), Light-emitting diode display (LED), Electroluminescent display (ELD), Electronic paper (E-Ink), Plasma display panel (PDP), Liquid crystal display (LCD), High-Performance Addressing display (HPA), Thin-film transistor display (TFT), and Organic light-emitting diode display (OLED) displays have been developed which have been implements into various types of display apparatuses. Among the display apparatuses are included TVs, PCs, laptop computers, tablet PCs, mobile phones, or MP3 players which are widely distributed for use at homes as well as offices.

To meet various user's needs for newer and diversified functions, efforts are made to develop newer forms of display apparatuses. The 'next-generation display' has been introduced in those efforts.

The flexible display apparatus is one example of the next-generation display apparatus. The flexible display apparatus mainly refers to a display apparatus which can change its form like a paper sheet.

Unlike other related art display apparatuses, the flexible display apparatus provides flexibility. In consideration of the above, a method is necessary, which can display appropriate screen on a flexible apparatus which is changed in its form.

SUMMARY

One or more exemplary embodiments may overcome the above disadvantages and other disadvantages not described above. Also, the exemplary embodiments are not required to overcome the disadvantages described above, and an exemplary embodiment may not overcome any of the problems described above.

According to an aspect of an exemplary embodiment, there may be provided a flexible display apparatus including a display that may be deformable and may be configured to display three-dimensional (3D) image data, a sensor configured to sense deformation of the display, and a controller configured to display some of the 3D image data corresponding to the sensed deformation of the display.

The 3D image data may be obtained from at least one of photographing a three-dimensional (3D) space, rendering the 3D space, and modeling the 3D space. The rendering includes at least one of wireframe rendering, polygon-based rendering, scanline rendering, ray tracing, or radiosity. The modeled 3D space may be represented by at least one of polygonal modeling, curve modeling, and digital sculpting. The modeling may be performed by at least one of a constructive solid geometry technique, an implicit surfaces technique, and a subdivision surfaces technique.

The controller may be further configured to determine a viewpoint regarding the 3D space that corresponds to an arrangement state of a plurality of sub-areas, and display the 3D image data at the determined viewpoint on the plurality of sub-areas, in response to the deformation being a bending of the display such that the display may be divided into the plurality of sub-areas.

The controller may be further configured to determine a viewpoint regarding the 3D space that corresponds to the plurality of sub-areas with a changed arrangement state, and display the 3D image data at the determined viewpoint on the plurality of sub-areas of the changed arrangement state in response to the display being rotated so that the arrangement state of the plurality of subareas may be changed.

According to an aspect of another exemplary embodiment, there may be provided a flexible display apparatus including a display that may be deformable and may be configured to display an object, a sensor configured to sense deformation of the display, and a controller configured to control the display to display an image, from among a plurality of multi-viewpoint images of the object, that corresponds to an arrangement state of the object being displayed on a plurality of sub-areas, in response to the display being bent and divided into the plurality of sub-areas. The plurality of sub-areas each correspond to at least one from among the multi-viewpoint images of the object.

The display may be further configured to display an object that has been displayed on the display on one of the plurality of sub-areas, and display an image on the rest sub-areas, from among the multi-viewpoint images of the object, that corresponds to an angle of bending of the display.

The sensor may be further configured to sense a rotation with respect to the display. The controller may be further configured to replace the image that has been displayed on the respective sub-areas with an image corresponding to each arrangement state and displays the mage corresponding to each arrangement state in response to the display being rotated and the arrangement state of the plurality of sub-areas being changed.

The controller may be further configured to determine an arrangement state of each of the plurality of sub-areas based on a direction and an angle of rotation of the display. The display may be further configured to display an image, from among multi-viewpoint images of the object that corresponds to the determined arrangement state on each of the plurality of the sub-areas.

According to an aspect of another exemplary embodiment, there may be provided a method for controlling a flexible display apparatus including a display. The method may include sensing deformation of a display, and displaying some three-dimensional (3D) image data corresponding to the deformation in response to the deformation being bending of the display.

The 3D image data may be obtained by at least one of photographing a three-dimensional (3D) space, rendering the 3D space, and modeling the 3D space. The rendering includes at least one of wireframe rendering, polygon-based rendering, scanline rendering, ray tracing, or radiosity. The modeled 3D space may be represented by at least one of polygonal modeling, curve modeling, and digital sculpting. The modeling may be performed by at least one of a constructive solid geometry technique, an implicit surfaces technique, and a subdivision surfaces technique.

The displaying may include determining a viewpoint regarding the 3D space that corresponds to an arrangement state of a plurality of sub-areas in response to the display being bent and divided into the plurality of sub-areas, and displaying the 3D image data at the determined viewpoint on the plurality of sub-areas.

The control method may further include rotating the display so that the arrangement state of the plurality of sub-areas may be changed, determining a viewpoint regarding the 3D space that corresponds to the plurality of sub-areas with changed arrangement state, and displaying the 3D image data at the determined viewpoint on the plurality of sub-areas with the changed arrangement state.

According to an aspect of another exemplary embodiment, there may be provided a method of controlling a flexible display apparatus including a display. The method may include sensing deformation of the display; and displaying an image, from among multi-viewpoint images regarding the object corresponding to an arrangement state of a plurality of sub-areas, on the sub-areas in response to the display being bent and divided into the plurality of sub-areas.

The displaying may include displaying an object that has been displayed on the display on one of the plurality of sub-areas, and displaying an image on the rest sub-areas, from among the multi-viewpoint images of the object, that corresponds to an angle of bending of the display.

The displaying may include replacing the image that has been displayed on the respective sub-areas with an updated image corresponding to each arrangement state and displaying the updated image in response to the display being rotated and the arrangement state of the plurality of sub-areas changing.

The displaying further may include determining the arrangement state of each of the plurality of sub-areas based on a direction and an angle of rotation of the display, and displaying an image, from among multi-viewpoint images of the object, that corresponds to the determined arrangement state on each of the corresponding plurality of the sub-areas.

BRIEF DESCRIPTION OF THE DRAWINGS

The above and/or other aspects will be more apparent by describing certain exemplary embodiments with reference to the accompanying drawings, in which:

FIGS. 3A through 7B are views provided to explain a method of a flexible display apparatus for sensing bending, according to one or more exemplary embodiments;

FIGS. 8A through 18D are views provided to explain a method for displaying a screen on a bent display, according to one or more exemplary embodiments;

FIGS. 21 through 29B are views provided to explain a method for displaying a screen according to an arrangement state of sub-areas, according to one or more exemplary embodiments;

FIG. 31 is a view provided to explain a method of a flexible display apparatus for determining if the display is so arranged that it is adjoined with the supporting surface, according to an exemplary embodiment;

DETAILED DESCRIPTION OF EXEMPLARY EMBODIMENTS

Figure 1:
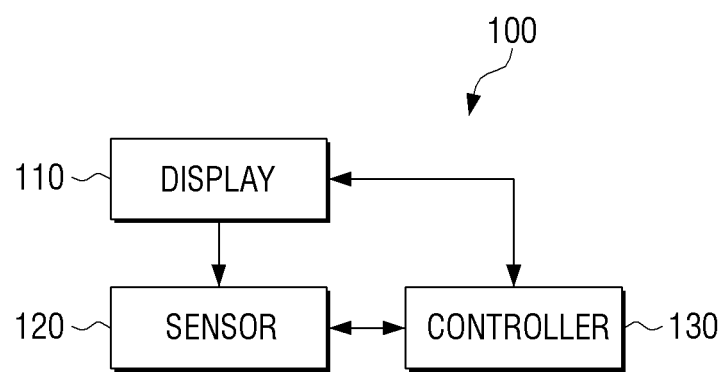
FIG. 1 is a block diagram of a flexible display apparatus according to an exemplary embodiment.

Certain exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding. Accordingly, it is apparent that the exemplary embodiments can be carried out without those specifically defined matters. Also, well-known functions or constructions are not described in detail because they may obscure understanding with unnecessary detail.

FIG. 1 is a block diagram of a flexible display apparatus according to an exemplary embodiment.

Referring to FIG. 1, the flexible display apparatus 100 includes a display 110, a sensor 120 and a controller 130.

The flexible display apparatus 100 as the one illustrated in FIG. 1 may be implemented in the form of various types of apparatus such as mobile phone such as a smart phone, PMP, PDA, tablet PC or GPS, which are mobile and which have display function. In addition to the mobile devices, the flexible display apparatus 100 may be implemented to be stationary, such as a monitor, a TV, or a kiosk.

The display 110 may display various screens. Specifically, the display 110 may display content playback, an executing screen, images, videos, texts, music, or various user interface (UI) screens.

Further, the display apparatus 100 that includes the display 110 may have various bendable characteristics. Particularly, the display 110 is fabricated with a structure and from a material that can allow bending. A detailed constitution according to an exemplary embodiment of the display 110 will be explained below with reference to FIG. 2.

Figure 2:
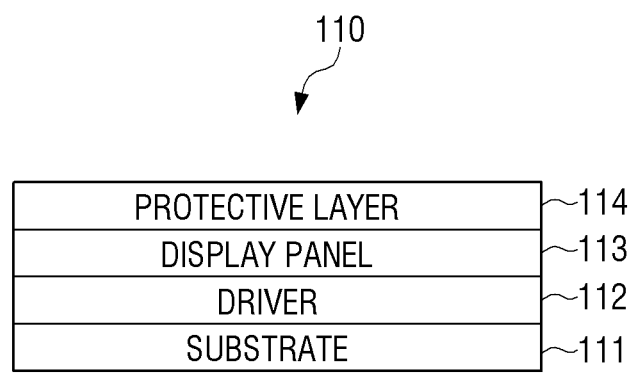
FIG. 2 is a view provided to explain basic structure of a display of a flexible display apparatus, according to an exemplary embodiment.

FIG. 2 is a view provided to explain a basic structure of a display in a flexible display apparatus according to an exemplary embodiment. Referring to FIG. 2, the display 110 may include a substrate 111, a driver 112, a display panel 113 and a protective layer 114.

The 'flexible display apparatus' 100 as used herein generally refers to an apparatus which is bent, curved, folded or scrolled like a sheet of paper, while maintaining a display characteristics of a planar display apparatus. Accordingly, the flexible display apparatus 100 is fabricated on a flexible substrate.

That is, the substrate 111 may be implemented as a plastic substrate (e.g., polymer film) that can deform in response to an external pressure.

The plastic substrate may be configured such that a base film is coated on both sides with barrier coating. The base material may be implemented as various resin including, for example, polyimide (PI), polycarbonate (PC), polyethyleneterephtalate (PET), polyethersulfone (PES), polythylenenaphthalate (PEN), or fiber reinforced plastic (FRP). The barrier coating may be done on the base material to be opposed to each other, and an organic or inorganic film may be used to maintain flexibility.

Meanwhile, in addition to the plastic substrate, the substrate 111 may be formed from a material with flexibility, such as, for example, thin glass or metal foil.

The driver 112 drives the display panel 113. The driver 112 may apply a driving voltage to a plurality of pixels included in the display panel 113, and may be implemented as an a-si TFT, low temperature poly silicon (LTPS) TFT, or organic TFT (OTFT).

The driver 112 may take various configurations depending on how the display panel 113 is implemented. For example, the display panel 113 may include an organic light emitter having a plurality of pixel cells, and electrode layers covering both surfaces of the organic light emitter. In such an exemplary example, the driver 112 may include a plurality of transistors corresponding to the respective pixel cells of the display panel 113. The controller 130 may apply an electric signal to the gate of each transistor, to thus illuminate the pixel cell connected to the transistor. As a result, an image may appear.

Alternatively, the display panel 113 may take a form other than as an OLED, such as, for example, an electrophoretic display (EPD), an electrochromic display (ECD), a liquid crystal display (LCD), an AMLCD, or a plasma display panel (PDP). An LCD implementation may further require use of a separate backlight, or an LCD without backlight may use ambient lighting. Accordingly, an LCD display panel 113 without backlight may be used in particular environments such as outdoor environment where luminosity is abundant.

The protective layer 114 protects the display panel 113. The protective layer 114 may use a material such as ZrO, CeO$_2$, ThO$_2$, etc. The protective layer 114 may be formed as a transparent film that covers the surface of the display panel 113.

Meanwhile, as an alternative to the exemplary embodiment illustrated in FIG. 2, the display 110 may be implemented as an electronic paper ('e-paper'). The e-paper implements characteristics of general paper and ink, and thus is different from general planar display using reflective light. Meanwhile, the e-paper may change image or text with electrophoresis using twist balls or capsules.

When the display 110 is formed of transparent components, a flexible display apparatus 100, which is bendable and also flexible, may be implemented. For example, the substrate 111 may be formed from polymer such as plastic with transparent properties, the driver 112 may be implemented as a transparent transistor, and the display panel 113 may be implemented as a transparent organic light emitting layer and a transparent electrode thus providing a transparent property.

The transparent transistor is generally fabricated by substituting non-transparent silicon of a related art thin transistor with a transparent material such as zinc oxide, titanium oxide, etc. Further, the transparent electrode may be formed from new material such as indium tin oxide or graphene. The graphene has an arrangement of carbon atoms connected into a honeycomb lattice plane, and has transparent property. The transparent organic light emitting layer may also be formed from various materials.

Meanwhile, as explained above, the display 110 may be bent in response to external pressure into different forms, and the flexible display apparatus 100 may sense bending in various manners as illustrated in FIGS. 3A through 5.

FIGS. 3A through 5 are views provided to explain a method of a flexible display apparatus for sensing bending, according to an exemplary embodiment.

The sensor 120 may sense the bending of the display 110. The 'bending' as used herein refers to the bent state of the display 110. To this end, the sensor 120 may include bend sensor(s) arranged on either front or rear surface of the display 110, or on both surfaces.

The 'bend sensor' as used herein refers to a sensor which is so configured that it can bend itself, and has varying resistance depending on the degree of bending. The bend sensor may be implemented as an optical fiber bending sensor, a pressure sensor, a strain gauge, or the like.

FIGS. 3A through 3D are views provided to explain an arrangement of bend sensors according to an exemplary embodiment.

Figure 3A:
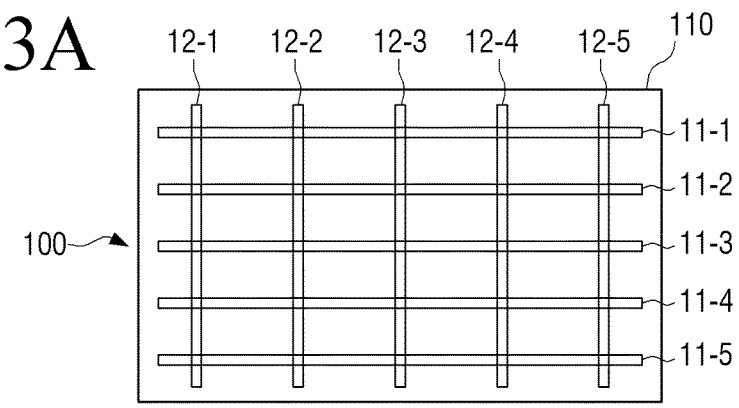

FIG. 3A illustrates a lattice arrangement of bar-shaped bend sensors in horizontal and vertical directions. To be specific, the bend sensors may include bend sensors 11-1 to 11-5 aligned in a first direction, and bend sensors 12-1 to 12-5 aligned in a second direction which is perpendicular to the first direction. The respective bend sensors may be at predetermined intervals from each other. The intervals may be equidistant or may vary between each sensor placement.

Meanwhile, in addition to an exemplary example illustrated in FIG. 3A where five bend sensors 11-1 to 11-5, 12-1 to 12-5 are arranged in horizontal and vertical directions, the number or length of the bend sensors may be varied according to size of the display 110 or the like. As explained above, because the purpose of arranging the bend sensors in vertical and horizontal directions is to sense bending that may occur throughout the entire area of the display 110, the bend sensors may be arranged only on a corresponding location, when the apparatus is partially flexible or when it is necessary to sense the bending only for a certain portion.

In addition to an exemplary example where the bend sensors are embedded in a front surface of the display 110 (see FIG. 3A), other exemplary examples are also possible. For example, the bend sensors may be embedded in a rear surface or in both surfaces of the display 110.

Further, the shape, number or locations of the bend sensors may be variously changed. For example, the display 110 may include one or a combination of a plurality of bend sensors. The one bend sensor may be the one that senses bending data, or the one that has a plurality of sensing channels to sense a plurality of bending data.

Figure 3B:
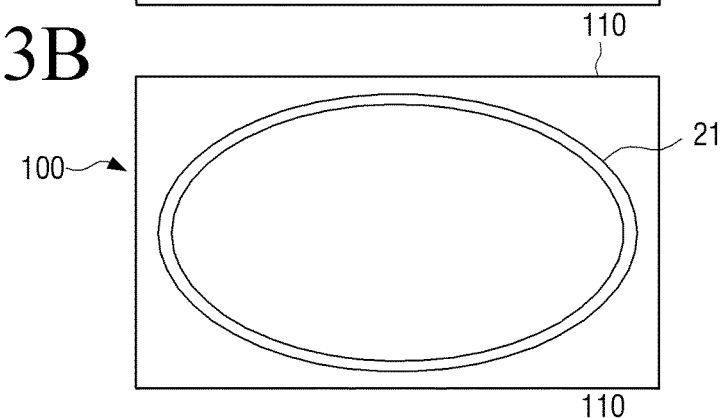

FIG. 3B illustrates an arrangement of one bend sensor on one surface of the display 110. Referring to FIG. 3B, the bend sensor 21 may be arranged in a circular form on a front surface of the display 110, although not strictly limited thereto. Accordingly, the bend sensor may be arranged on a front surface of the display 110, and may be formed into closed curve form such as various polygons.

Figure 3C:
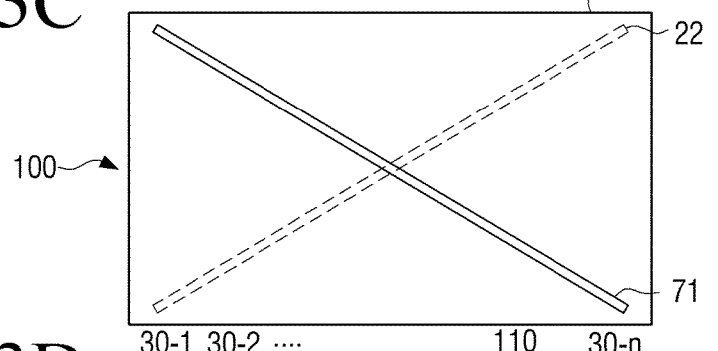

FIG. 3C illustrates a crossing arrangement of two bend sensors. Referring to FIG. 3C, a first bend sensor 21 may be arranged on a first surface of the display 110 in a first diagonal direction, while a second bend sensor 22 may be arranged on a second surface in a second diagonal direction.

Meanwhile, in addition to the line-shaped bend sensors as illustrated and explained above, the sensor 120 may also sense the bending using a plurality of strain gages.

Figure 3D:
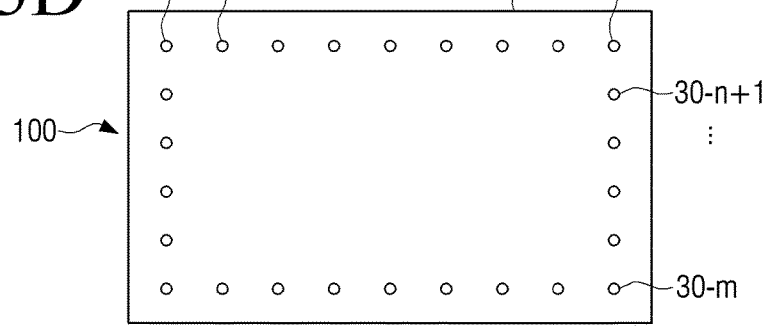

FIG. 3D illustrates an arrangement of a plurality of strain gauges on the display 110. The strain gauges sense deformation on a surface of an object for measure, according to variations in the resistance values, by using a metal or semiconductor that greatly changes resistance according to the size of the force exerted thereto. The material such as metal generally has increasing resistance as the length increases in response to the externally-exerted force, while it has decreasing resistance as the length reduces. Accordingly, it is possible to sense the bending of the display 110 by sensing the variations in the resistance.

Meanwhile, referring to FIG. 3D, a plurality of strain gauges may be arranged on an edge of the display 110. The number of the strain gauges may vary, depending on the size, form, preset bending sensing or resolution of the display 110.

A method of the sensor 120 for sensing the bending of the display 110 using a lattice-arrangement of bend sensors or strain gauges will be explained below.

The bend sensor may be implemented as an electric resistive sensor that uses electric resistance, or a micro optical fiber sensor that uses strain of the optical fiber, and among these, an exemplary embodiment will be explained below with reference to an exemplary example where the bend sensor is an electric resistive sensor.

Figure 4A:
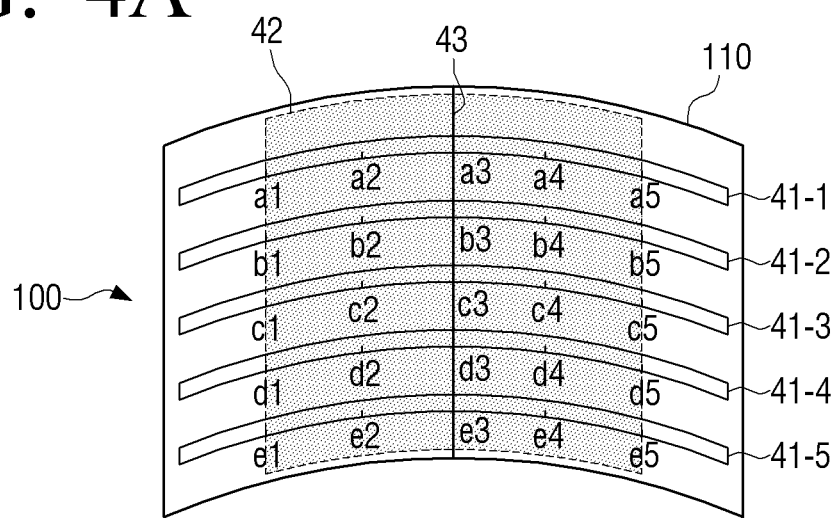
Figure 4B:
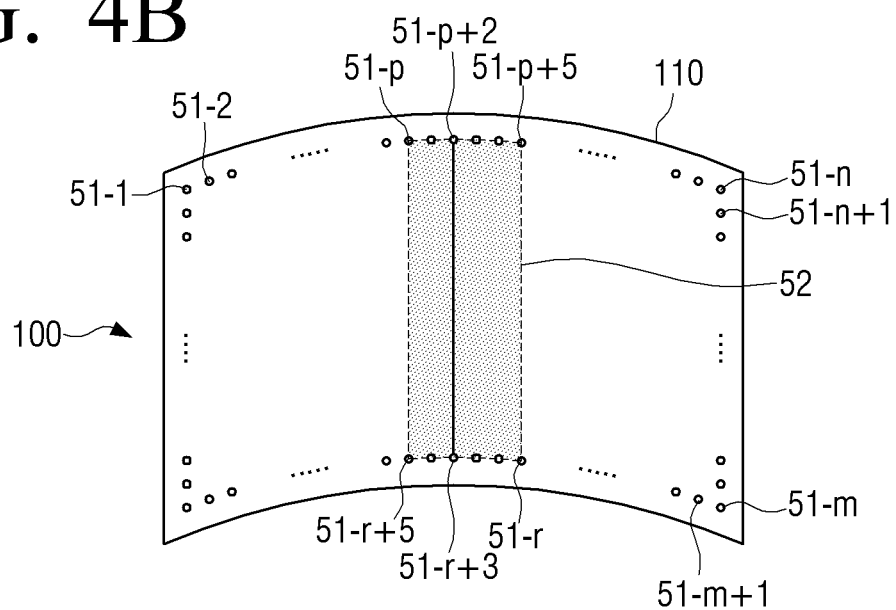

FIGS. 4A and 4B are views are provided to explain a method of a flexible display apparatus for sensing the bending, according to an exemplary embodiment.

When the display 110 bends, the bend sensor(s) arranged on one or both surfaces of the display 110 bend too, according to which the bend sensor(s) outputs resistance that corresponds to the size of the tension exerted thereto. That is, the bend sensor(s) outputs resistance according to a degree of extension, when the bend sensor(s) is extended in accordance with external force.

Accordingly, the sensor 120 senses resistance of the bend sensor, using the size of voltage applied to the bend sensor(s) or the size of electric current flowing the bend sensor(s) and senses the bending of the display 110 using the detected size of the resistance. That is, the sensor 120 may sense that the display 110 is bent, when the bend sensor outputs different resistance from the original state.

For example, when the display 110 bends in a horizontal direction as illustrated in FIG. 4A, the bend sensors 41-1 to 41-5 embedded in the front surface of the display 110 bend too, according to which the resistance based on the size of exerted tension is outputted.

In such a situation, the size of the tension increases in proportion to the degree of bending. That is, when the display 110 bends to the shape as illustrated in FIG. 4A, the degree of bending is maximum at the central area. Accordingly, the bend sensors 41-1, 41-2, 41-3, 41-4, 41-5 have the maximum tension at the central areas a3, b3, c3, d3, e3, so that the areas a3, b3, c3, d3, e3 have the maximum resistance.

On the contrary, the degree of bending decreases to outward direction. Accordingly, the bend sensor 41-1 has decreasing resistance from a3 to left or right direction, so that area a1 without bending and the area on the left side have the same resistance as before the bending. The same applies to the rest bend sensors 41-2 to 41-5.

Meanwhile, the sensor 120 may sense the location, size, and number of bending areas, or the size, location, number, and direction of the bending lines, or frequency of bending, based on the relationship between the points of sensing varied resistance of the bend sensors.

The 'bending area' as used herein refers to an area where the display 110 is bent. That is, as the bend sensors are bent when the display 110 is bent, the bending area may be defined as all the areas occupied by the bend sensors that send out different resistances. Meanwhile, the areas having unchanged resistance may be defined as the 'flat' area which means no bending occurs.

The sensor 120 senses one bending area, when there are spots within a preset distance that sense changed resistance. On the contrary, the sensor 120 may distinguish the spots to different bending areas, when there are spots that are farther than a preset distance from the other spots among the spots sensing changed resistance. In this case, the sensor 120 may distinguish different bending areas with reference to the spots that are farther than the other spots.

As explained above, referring to FIG. 4A, the bend sensors 41-1, 41-2, 41-3, 41-4, 41-5 have different resistances from the original state, between a1 and a5, b1 and b5, c1 and c5, d1 and d5, and e1 and e5. In this case, the spots sensing changed resistances at the respective bend sensors 41-1 to 41-5 are within a preset distance, and are successively arranged.

Accordingly, the sensor 120 may sense one bending area based on an area 42 that includes a1 and a5, b1 and b5, c1 and c5, d1 and d5, and e1 and e5 of the bend sensors 41-1 to 41-5.

Meanwhile, the bending area may include bending line. The 'bending line' as used herein may be defined as a line that connects sports sensing the largest resistance from the respective bending areas.

Referring to FIG. 4A for one instance, a3 outputting the largest resistance at the bending sensor 41-1, b3 outputting the largest resistance at the bending sensor 41-2, c3 outputting the largest resistance at the bending sensor 41-3, d3 outputting the largest resistance at the bending sensor 41-4, e3 outputting the largest resistance at the bending sensor 41-5, may be connected to each other by a bending line 43. FIG. 4A illustrates a bending line connecting from the central area of the display surface to vertical direction. Accordingly, the sensor 120 may sense the bending line as this is formed upon bending of the display 110.

Meanwhile, in order to clearly illustrate an exemplary example where the display 110 is bent in a horizontal direction, the bend sensors arranged in horizontal direction are illustrated, while the rest of the bend sensors of the lattice structure are not illustrated. However, one of ordinary skill in the art will understand that the same method applies to sense the vertical bending of the display 110, through the sensor 120 which senses the vertical bending through the bend sensors arranged in vertical direction. Furthermore, because the tension applies to all the bend sensors arranged in horizontal and vertical directions, when the display 110 is bent in diagonal direction, the sensor 120 may sense the diagonal bending of the display 110 based on the outputs from the bend sensors arranged in vertical and horizontal directions.

Meanwhile, the sensor 120 may also sense the bending of the display 110 using the strain gauges.

Accordingly, when the display 110 bends, force is exerted to the strain gauges arranged on the edge of the display 110, according to which the strain gauges output different resistances depending on the size of force exerted thereto. As a result, the sensor 120 may sense the bending of the display 110 based on the outputs of the strain gauges.

Referring to FIG. 4B for one instance, when the display 110 bends in a horizontal direction, the force is exerted on the strain gauges 51-p, . . . , 51-p+5, 51-r, . . . , 51-r+5 arranged at the bent area among a plurality of strain gauges embedded in the front surface of the display 110, and resistances according to the sizes of exerted force are outputted. Accordingly, the sensor 120 detects one bending area 52 which includes all the locations of the strain gauges that output different resistances from the original state.

The sensor 120 may then sense the bending line which connects at least two strain gauges that are in the bending area and that output resistances with large gap from the original state. That is, the sensor 120 may sense a bending line that connects at least two strain gauges to which the largest force is exerted, or at least two strain gauges to which the largest and the second-largest forces are exerted.

For example, referring to FIG. 4B, the bending line maybe sensed, which connects a first strain gauge 51-p+2 and a second strain gauge 51-r+3 outputting the resistance with the largest gap from the original state, when the display 110 bends in horizontal direction.

Meanwhile, in one exemplary embodiment, the strain gauges (51-1, 51-2 . . . ) may be embedded in a front surface of the display 110. The strain gauges (51-1, 51-2 . . . ) may be arranged in the front surface of the display 110, to sense the bending of the display 110 in Z+ direction.

Meanwhile, the strain gauge may be embedded in the rear surface of the display 110 to sense the bending of the display 110 in Z− direction. However, other exemplary embodiments are also possible. For example, the strain gauge may be arranged on one surface of the display 110 to sense the bending in Z+ and Z− directions.

Meanwhile, the sensor 120 may sense the degree of bending, i.e., the angle of bending of the display 110. The 'angle of bending' as used herein may refer to an angle between the display 110 in flat and bent states.

FIG. 5 is a view provided to explain a method of a flexible display apparatus for determining the angle of bending of the display, according to an exemplary embodiment.

The sensor 120 may sense the angle of bending of the display 110. The flexible display apparatus 100 may previously store therein resistance values outputted from the bending lines per angle of bending of the display 110. Accordingly, when the display 110 bends, the sensor 120 may sense the angle of bending that matches the sensed size of the resistance by comparing the sizes of the resistance values outputted from the bend sensor or strain gauge at a bending line with the previously stored resistance value and finding the angle of bending that matches the sensed size of the resistance.

For example, referring to FIG. 5, when the display 110 bends, the bend sensor spot a4 at the bending line outputs the largest resistance value. The sensor 120 may determine the angle of bending (θ) that matches the resistance value outputted from a4, using the previously stored resistances per angle of bending.

Meanwhile, as explained above, the bending of the display 110 may be divided into Z+ and Z− directions. Meanwhile, the sensor 120 may sense the direction of bending of the 110 which will be explained in detail below with reference to FIGS. 6 and 7.

Figure 6A:
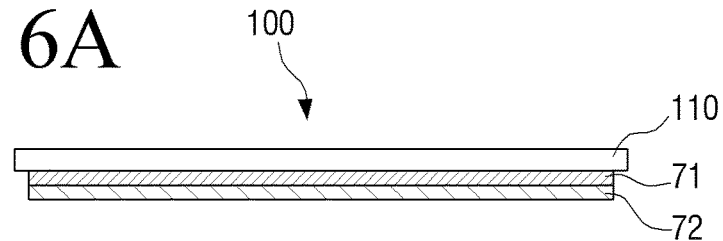
Figure 6B:
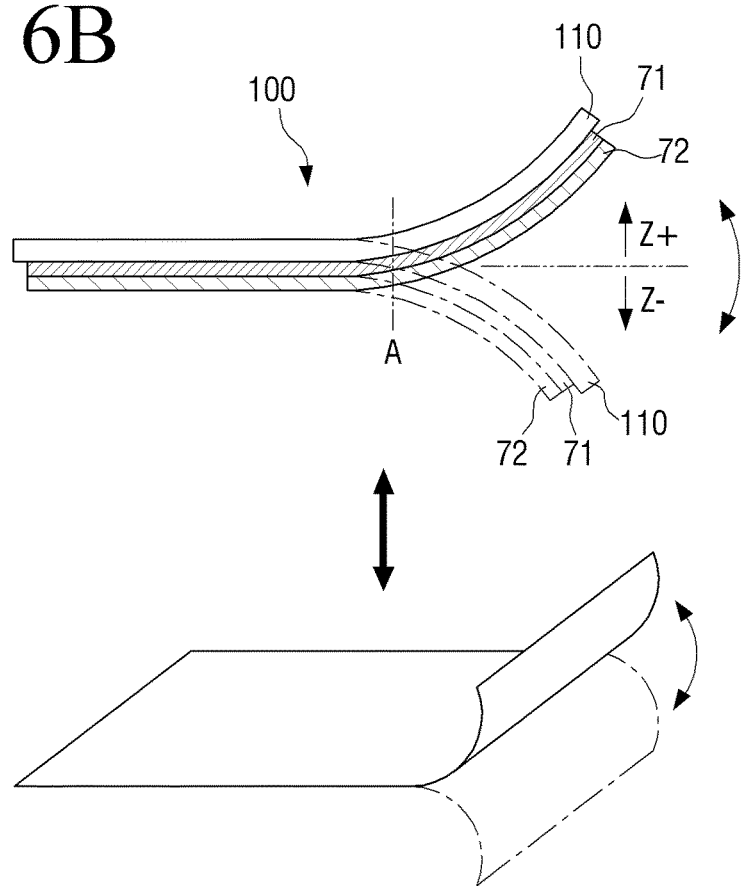
Figure 6C:
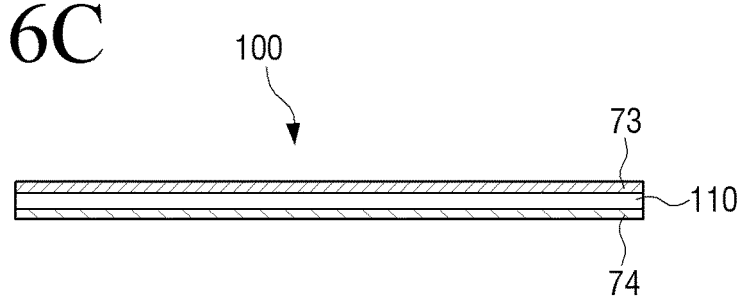

FIGS. 6A through 6C are views provided to explain a method for sensing a direction of bending, using overlapped bend sensors according to an exemplary embodiment.

The sensor 120 may sense the direction of bending of the display 110. To this end, the sensor 120 may include bend sensors in various arrangements.

For example, referring to FIG. 6A, the sensor 120 may include two bend sensor 71, 72 overlapped on one side of the display 110. In response to bending to a certain direction, the bend sensor 71 above with reference to the bent portion and the bend sensor 72 below with reference to the bent portion sense different resistance values. Accordingly, it may be possible to sense the direction of bending by comparing the resistance values of the two bend sensors 71, 72 at the same spot. The direction of bending may be divided into Z+ and Z− directions. The direction of bending may be defined as a direction on Z axis which the bent portion of the display 110 directs when it is assumed that the display 110 is the two-dimensional x-y plane.

When the right-side area of the display 110 bends to Z+ direction as illustrated in FIG. 6B, at spot A that corresponds to the bending line, the bend sensor 71 above is subject to less tension than the bend sensor 72 below. On the contrary, when the right-side area of the display 110 bends in Z− direction, the bend sensor 71 above is subject to greater tension than the bend sensor 72 below.

Accordingly, by comparing the resistance values of the two bend sensor 71, 72 corresponding to spot A, the sensor 120 may sense the direction of bending with respect to the edge area of the display 110. That is, the sensor 120 may sense bending in Z+ direction, when the resistance value outputted from the bend sensor placed above is greater than the resistance value outputted from the bend sensor placed below among the two overlapped bend sensors at the same spot.

Meanwhile, in the exemplary embodiments explained above, the direction of bending is sensed, when the right-side area of the display 110 bends. In another exemplary embodiment, the sensor 120 may also sense the direction of bending of the display 110 in the same manner explained above, when the edge of the display 110, such as left-side area, upper-side area or lower-side area of the display 110 bends.

The sensor 120 may also sense the direction of bending of the display 110, when the center area of the display 110 bends. For example, when the center area of the display 110 bends, the sensor 120 may sense that the center area of the display 110 bends convexly in Z+ direction, when the resistance value outputted from the bend sensor placed above is greater than the resistance value outputted from the bend sensor placed below among the two overlapped bend sensors at the same spot. Alternatively, when the center area of the display 110 bends, and when the resistance value outputted from the bend sensor above is less than the resistance value outputted from the bend sensor below at the same spot, the sensor 120 may sense that the center area of the display 110 bends convexly in Z− direction.

Meanwhile, in addition to an arrangement of the two bend sensors overlapped on each other on one side of the display 110 as illustrated in FIGS. 6A, 6B, the sensor 120 may also include bend sensors arranged on both surfaces of the display 110 as illustrated in FIG. 6C.

FIG. 6C illustrates arrangement of two bend sensors 73, 74 on both surfaces of the display 110.

Referring to FIG. 6C, again, the bend sensor arranged on the first surface of the display 110 and the bend sensor 74 arranged on the second surface of the display 110 output different resistance values from each other at the same spot. That is, when the edge area of the display 110 bends in Z− direction, the bend sensor 73 on the first surface is subject to greater degree of tension at a bending line spot, while, the bend sensor 74 on the second surface is subject to greater degree of tension at a bending line spot when the edge area of the display 110 bends in Z+ direction.

Accordingly, by comparing the resistance values of the two bend sensors 73, 74 corresponding to the same spot, the sensor 120 may determine the direction of bending of the edge area of the display 110. For example, when the resistance value outputted from the bend sensor 74 embedded in the rear surface of the display 110 is greater than the resistance value outputted from the bend sensor 73 embedded in the front surface of the display 110, the sensor 120 may determine that the edge area of the display 110 bends in Z+ direction. Further, when the resistance value outputted from the bend sensor 73 embedded in the front surface of the display 110 is greater than the resistance value outputted from the bend sensor 74 embedded in the rear surface of the display 110, the sensor 120 may determine that the edge area of the display 110 bends in Z− direction.

Meanwhile, the particular exemplary embodiment where the left or right side of the display 110 bends has been explained above. However, the sensor 120 may sense the direction of bending of the display 110, when the center area of the display 110 bends. For example, when the center area of the display 110 bends, at a spot where the resistance values outputted from the bend sensors embedded in the front surface of the display 110 are equal, the sensor 120 may sense that the center area of the display 110 bends convexly in Z− direction, when the resistance value outputted from the bend sensor embedded in the rear surface of the display 110 is greater than the resistance value outputted from the bend sensor embedded in the front surface.

As explained above, the two bend sensors sense different values from each other according to direction of bending, according to which the sensor 120 may determine the direction of bending based on the detected characteristics of the values.

Meanwhile, in addition to the particular exemplary embodiment explained above where the direction of bending is sensed using two bend sensors (see FIGS. 6A to 6C), other exemplary embodiment are possible For example, it is possible to determine direction of bending only with the strain gauges arranged on one or both surfaces of the display 110. For example, when the resistance value outputted from the strain gauge embedded in the front surface of display 110 is different from the original state, it is determined that the display 110 bends in Z+ direction, while it is determined that the flexible apparatus 100 bends in Z− direction when the resistance value different from the original state is outputted from the strain gauge embedded in the rear surface of the display. However, other exemplary embodiments are possible. For example, the strain gauge may be arranged on one surface of the display 110 to sense bending in Z+ and Z− directions.

FIGS. 7A and 7B are views provided to explain a bending direction sensing method according to another exemplary embodiment. To be specific, FIGS. 7A and 7B are views provided to explain a method for sensing a direction of bending using acceleration sensor.

The sensor 120 may include a plurality of acceleration sensors arranged on edge area of the display 110.

The acceleration sensor (i.e., gravity sensor or G sensor) measures acceleration and direction of the acceleration when a motion occurs. That is, the acceleration sensor outputs a sensed value corresponding to gravity acceleration that changes in accordance with the tilting of an apparatus to which the sensor is attached.

Accordingly, referring to FIG. 7A, the acceleration sensors 81-1, 81-2 may be arranged on edge areas of both sides of the display 110, which sense and output varied values in response to bending of the display 110. The sensor 120 calculates pitch angle and roll angle using the output values respectively sensed at the acceleration sensors 81-1, 81-2. Accordingly, the sensor 120 may determine a direction of bending based on the degree of variations of the pitch angle and roll angle as sensed at the acceleration sensors 81-1, 81-2, respectively.

Meanwhile, although the exemplary embodiment illustrated in FIG. 7A has the arrangement of acceleration sensors 81-1, 81-2 on both edges of the display 110 in transversal direction with reference to the front surface of the display 110, the vertical arrangement as the one illustrated in FIG. 7B may also be implemented, in which case the sensor 120 senses a direction of bending according to the measured values of the acceleration sensors 81-3, 81-4 in vertical direction, in response to bending of the display 110 in vertical direction.

Meanwhile, in addition to the arrangement of the acceleration sensors in the left-, right-side edges or upper-, lower-side edges of the display 110 (FIGS. 7A, 7B), the acceleration sensors may also be arranged in all of the upper-, lower-, left-, and right-side edges, or on corner areas.

Meanwhile, in addition to the acceleration sensor explained above, it is also possible to sense the direction of bending using gyro sensor or geomagnetism sensor. The gyro sensor detects angular velocity when the rotational motion occurs, by measuring Corioli's force acting in the direction of velocity. According to the measured value of the gyro sensor, it is possible to detect to which direction the rotation is occurred, i.e., the direction of bending. The geomagnetism sensor senses azimuth angle by using two-axis or three-axis fluxgate. When implemented, the geomagnetism sensors arranged on respective edges of the display 100 move upon bending of the edge, according to which the geomagnetism sensors output electric signal corresponding to such change in geomagnetism. The flexible display apparatus my calculate yaw angle using the values outputted from the geomagnetism sensors. Accordingly, it is possible to determine various bending characteristics such as bending area or direction, according to the calculated change in yaw angle.

As explained above, the sensor 120 may sense bending of the display 110 in various manners. The constitution of the sensors and methods for sensing may be implemented in the flexible display apparatus 100 individually or in combination. In addition to the above exemplary embodiment where the sensor 120 senses the bending of the display 110, other alternatives are also possible. For example, the controller 130 may determine bending of the display 120 based on the result of sensing transmitted from the sensor 120.

Meanwhile, the sensor 120 may sense touching of a user on the screen of the display 110. In this case, the sensor 120 may include a resistive or capacitive touch sensor and sense coordinates and size of the area on the display 110 touched by the user or size of the touching pressure, based on the electric signal generated upon touching on the screen of the display 110.

The controller 130 controls the overall operation of the flexible display apparatus 100. The controller 130 may particularly determine the bending of the display 110 based on the result of sensing at the sensor 120. That is, using the resistance values outputted from the bend sensor or the strain gauges, the controller 130 may determine the presence or absence of bending, location of bending area, size of the bending area, number of bending areas, size of bending line, location of bending line, number of bending lines, direction of bending, angle of bending or frequency of bending. This will not be redundantly explained below, but referenced to the description provided above with reference to FIGS. 3 to 7.

Meanwhile, the display 110 may display image data of three-dimensional (3D) space. The image data of 3D space may include road view data.

To be specific, the road view data refers to map service data that may include panoramic images which represent 360° actual views of the large and small roads across the country. For example, the road view data may be photographed and generated through fisheye lens, which is special-purpose lens designed to photograph with 180 or above camera angle, or may be generated by reconstructing numerous previously-photographed images into panorama form.

Alternatively, and in accordance with one or more exemplary embodiments, the road view data may be comprised of 3D rendered graphics representing the views similar to the photographed images contained in the map service data. Specifically, rendering a 3D space may be done by using any one of at least wireframe rendering, polygon-based rendering, scanline rendering, ray tracing, or radiosit. The modeled 3D space may be represented by at least one of polygonal modeling, curve modeling, and digital sculpting. Further, a modeling technique used to model may include any one of at least a constructive solid geometry technique, an implicit surfaces technique, and a subdivision surfaces technique. Once modeled the 3D space can be used to generate 3D image data that may include a plurality of 3D images that can each have differing origin viewpoints.

Further, the road view data may be previously stored in the flexible display apparatus 100, or received from an external server via network. In this example, the flexible display apparatus 100 may additionally include a communicator capable of network communication.

Meanwhile, the controller 130 may display part of the image data of 3D space to correspond to the bending state, when the display 110 bends.

To be specific, the controller 130 may determine a viewpoint with respect to the 3D space that corresponds to an arrangement of a plurality of sub-areas, when the display 110 bends and divides into the plurality of areas, and display the image data photographed, rendered, or modeled at the determined viewpoint through the plurality of sub-areas, respectively. The 'image data' as used herein may be panoramic image photographed (or generated) at a viewpoint of the respective sub-areas, among the plurality of panoramic images that construct the road view data. That is, the controller 130 may determine the panoramic image photographed at a viewpoint of the respective sub-areas of the display 110 and display the determined panoramic image on the respective sub-areas. This will be explained in greater detail below with reference to FIGS. 8 to 18.

Figure 8A:
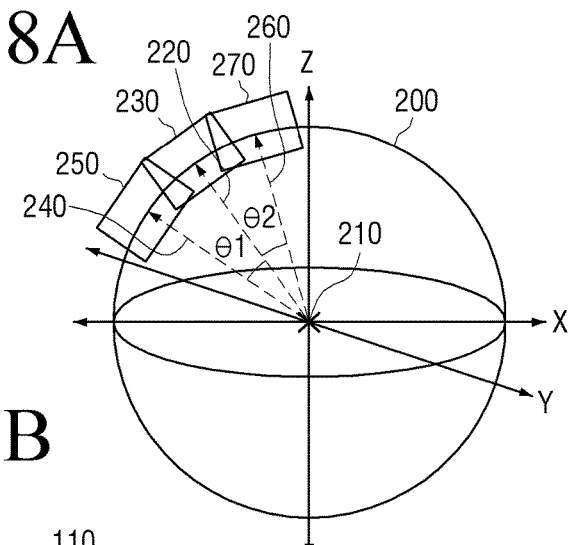

FIGS. 8A through to 18D are views provided to explain a method for displaying a screen on a bent display, according to an exemplary embodiment.

First, FIG. 8A is a view provided to explain road view data. Referring to FIG. 8A, the road view data is determined based on a reference location 210, which is the location of the camera, and a variable which is the photographing direction 220 of the camera. The 'photographing direction' 220 as used herein refers to direction vectors as defined by the 3D orthogonal coordinate system (X, Y, Z) with the reference location 210 as an origin, and may be a viewpoint of photographing an image at the reference location 210 to generate road view data.

Accordingly, the controller 130 may detect the road view data photographed in the photographing direction 220 and display the same. That is, with the reference location 210 applied as a starting point, the controller 130 may detect the road view data 230 based on the image at a contacting surface where the endpoint of the direction vector with respect to the photographing direction 220 meets the sphere 200 and display the detected road view data 230.

Meanwhile, when the display 110 bends, at least one of the plurality of sub-areas formed upon bending may move. That is, on the 3D orthogonal coordinate system (x, y, z), based on the assumption that the display 110 is in x-y plane, at least one area of the display 110 may move to (+) direction of Z axis or to (−) direction of Z axis.

In the above case, the controller 130 may determine the viewpoint of the area with moved location due to the bending, with reference to the viewpoint at which the road view data displayed before the bending was photographed, and detect the road view data photographed at the determined viewpoint.

To that purpose, on a 3D orthogonal coordinate system (x, y, z) with bending line as z-axis, and one of the intersecting points between bending lines and the display 110 as the origin, the controller 130 calculates an angle between an area (i.e., area on x-y plane) constructed by the area that is not moved by the bending ("non-displaced area"), and an area moved by the bending ("displaced area"). To be specific, when the display 110 bends, the controller 130 calculates the angle of bending of the display 110 using the resistance values outputted from the bending lines of the display 110 (FIG. 5), and determines the calculated angle of bending to be the angle between x-y plane and the displaced area.

Figure 8B:
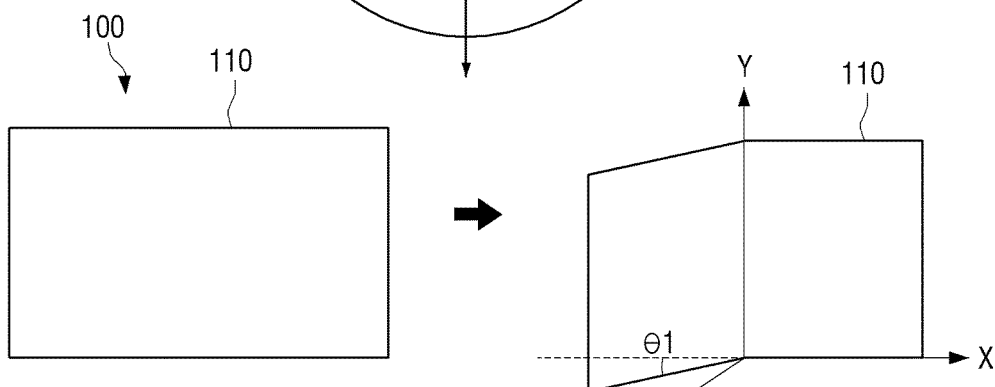

For example, referring to FIG. 8B, it is assumed that the left side of the display 110 bends in Z+ direction. The controller 130 may determine the angle ($\theta_1$) between the displaced area and x-y plane, when the angle of bending is calculated to be $\theta_1$. Further, referring to FIG. 8C, it is assumed that the right side of the display 110 bends. The controller 130 may determine the angle ($\theta_2$) between the displaced area and x-y plane, when the angle of bending is calculated to be $\theta_2$.

After that, the controller 130 rotates the viewpoint at which the road view data displayed before bending ("pre-bending road view data") was photographed by an amount determined by the calculated angle, and determines a viewpoint of the displaced area. In determining the viewpoint of the displaced area, the controller 130 may add or subtract the calculated angle to or from the viewpoint where the pre-bending road view data was photographed, according to the sector on the x-y plane to which the displaced area belongs.

Referring to FIG. 8B, when the left side of the display 110 bends in Z+ direction so that the displaced area belongs to sector x(−)y(+) on x-y plane, the controller 130 may determine a viewpoint of the displaced area, by subtracting the calculated angle from the viewpoint where the pre-bending road view data was photographed. That is, referring to FIG. 8A, the controller 130 may determine a viewpoint of the displaced area, by moving the viewpoint where the pre-bending road view data was photographed, i.e., by moving the viewpoint to which the photographing direction 220 faces, counterclockwise as much as $\theta_1$. The controller 130 may detect the road view data photographed at the photographing direction 240 corresponding to the determined viewpoint. The controller 130 may detect the road view data 250 based on the image of the contacting surface where the endpoint of the direction vector with respect to the photographing direction 240 meets the sphere 200.

Figure 8C:
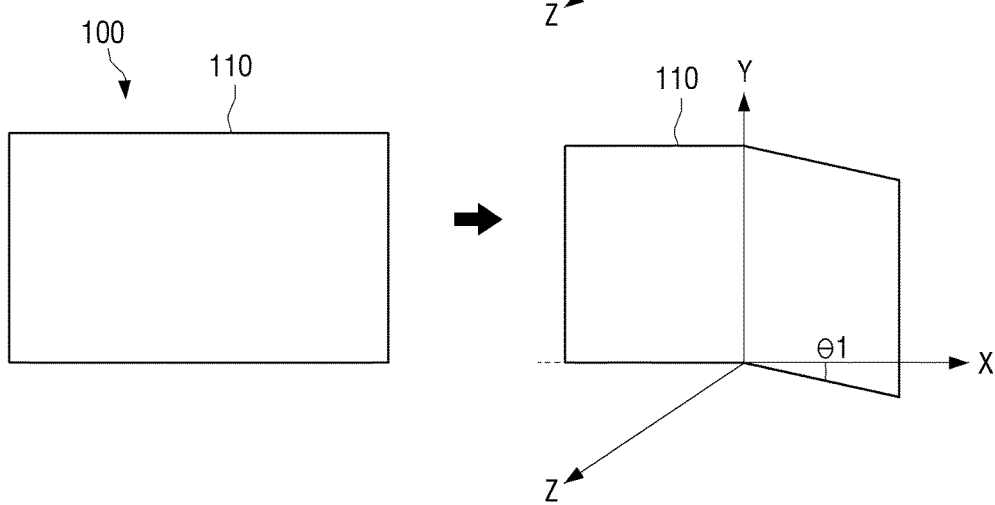

Further, referring to FIG. 8C, the controller 130 may determine a viewpoint of the displaced area by adding the calculated angle to the viewpoint where the pre-bending road view data was photographed when the right side of the display 110 bends in Z+ direction so that the displaced area belongs to sector x(+)y(+) on x-y plane. That is, referring to FIG. 8A, the controller 130 may determine a viewpoint of the displaced area by moving the viewpoint where the pre-bending road view data was photographed, i.e., by moving the viewpoint to which the photographing direction 220 faces, counterclockwise as much as $\theta_2$. The controller 130 may detect the road view data photographed at the photographing direction 260 corresponding to the determined viewpoint. To be specific, the controller 130 may detect the road view data 270 based on the image of the contacting surface where the endpoint of the direction vector with respect to the photographing direction 260 meets the sphere 200.

Meanwhile, the controller 130 may display the road view data on the non-displaced areas and the displaced areas, respectively. This will be explained in greater detail below with reference to FIGS. 9A through 16C. For ease of explanation, FIGS. 9A through 16C illustrate screens of the same size in enlargement or reduction. Further, while the road view data include a plurality of panoramic images, a method for displaying road view data on the respective areas using one sheet of panoramic image will be explained with reference to FIGS. 9A through 16C for convenience of explanation.

First, the controller 130 displays the pre-bending road view data, on the non-displaced area.

For example, it is assumed that the left side of the display 110 bends to Z+ direction as much as $\theta_1$. The controller 130 may display the road view data, which has been displayed on the right side with reference to bending line, on the non-displaced area. That is, the controller 130 may display the road view data which has been displayed on the non-displaced area as is.

The controller 130 may display the road view data photographed at a viewpoint of the corresponding area, on the displaced area.

In the exemplary embodiments explained above, the controller 130 may display the road view data, which is photographed at a viewpoint subtracted by $\theta_1$ from the viewpoint where the pre-bending road view data was photographed, on the displaced area.

Figure 9A:
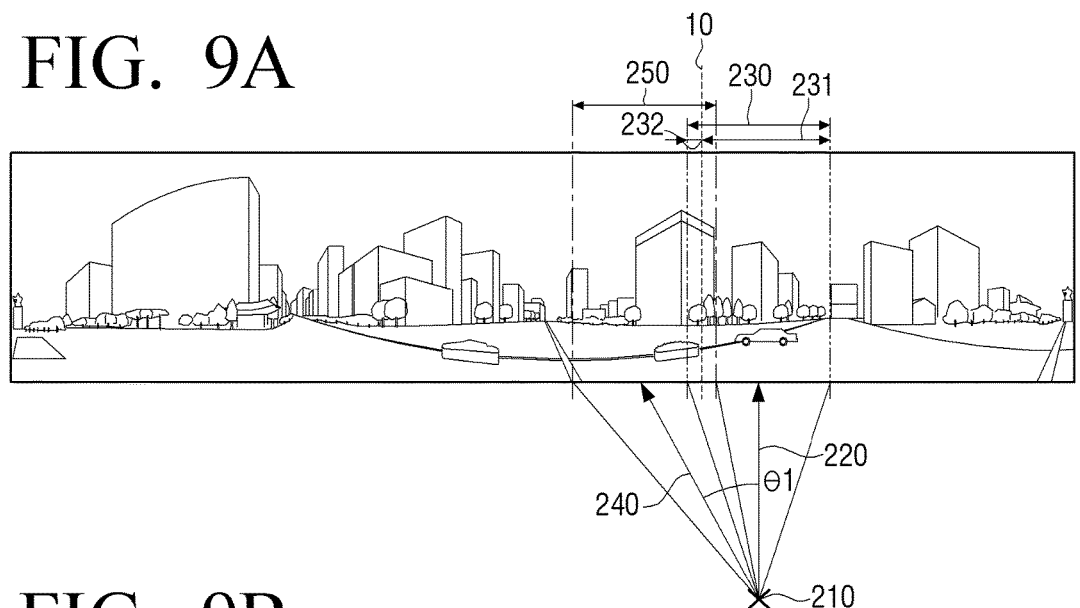
Figure 9B:
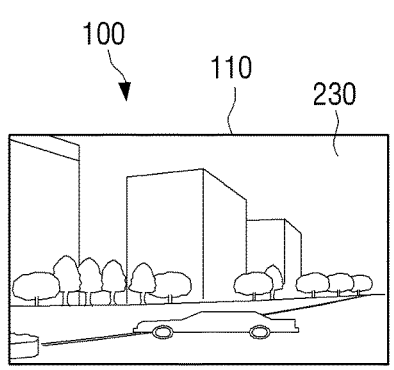

That is, with reference to the panoramic image as illustrated in FIG. 9A, it is assumed that the road view data 230 photographed in the photographing direction 220 is displayed on the display 110 (see FIG. 9B). Then, as the left side of the display 110 bends to Z+ direction as much as $\theta_1$, the pre-bending road view data 230 may be divided into road view data 231 displayed on right side with reference to the bending line 10 and road view data 232 displayed on left side with reference to the bending line 10.

Figure 9C:
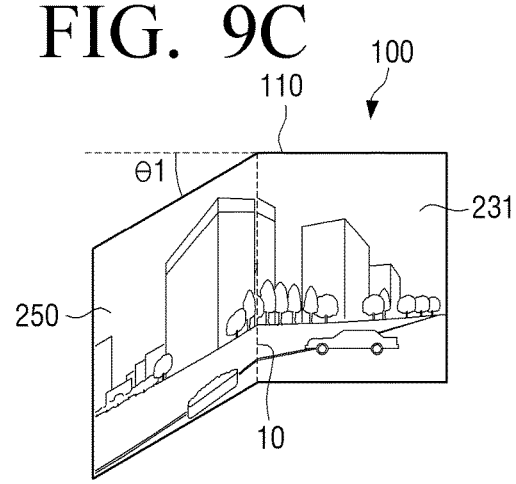

Accordingly, referring to FIG. 9C, on the non-displaced area, the road view data 231 displayed on the right side with reference to the bending line 10 is displayed. On the displaced area, the road view data, which is photographed at a viewpoint moved by $\theta_1$ counterclockwise from the viewpoint in the photographing direction 220, i.e., the road view data 250 photographed in the photographing direction 240 is displayed.

Meanwhile, the controller 130 may display all the pre-bending road view data, on the non-displaced area. In this case, because the non-displaced area has a smaller screen size than before bending of the display 110, the controller 130 may adjust the pre-bending road view data to suit the screen size of the non-displaced area, before displaying the road view data on the non-displaced area.

Figure 10A:
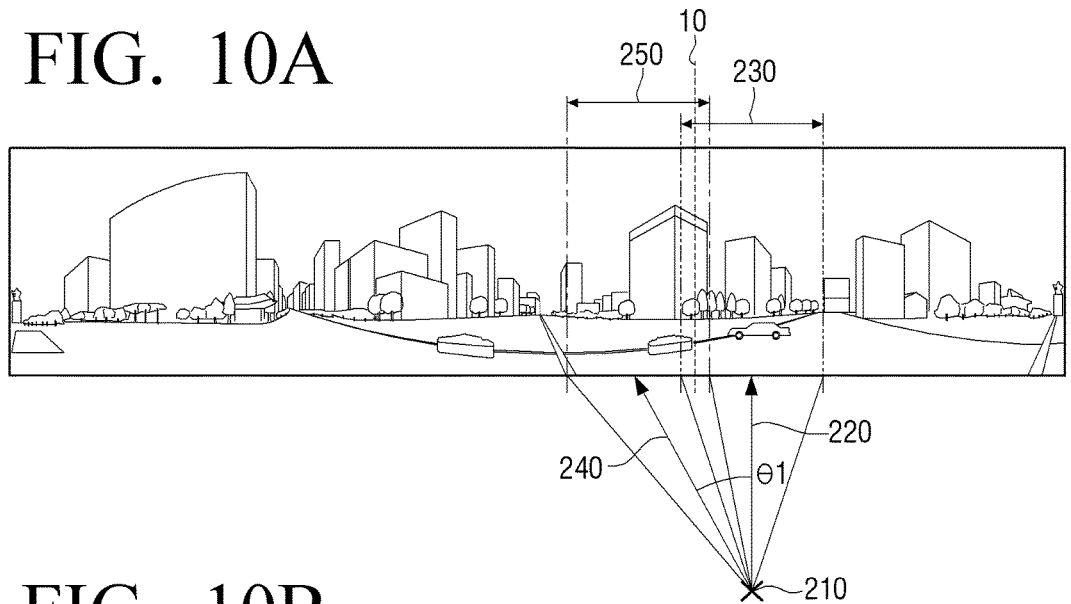
Figure 10B:
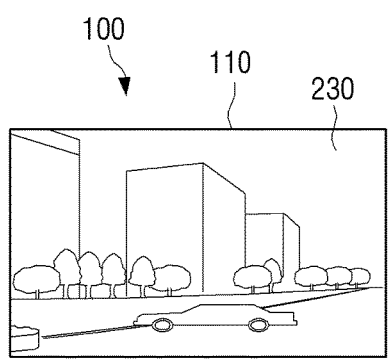
Figure 10C:
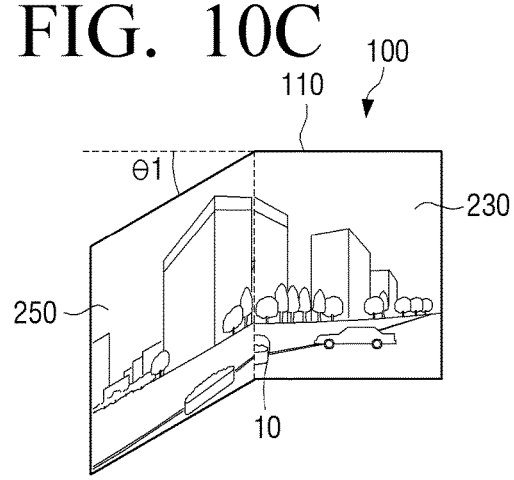

For example, referring to FIGS. 10A to 10C, the pre-bending road view data 230 may be displayed on an non-displaced area, while the road view data, that is photographed at a viewpoint moved counterclockwise by $\theta_1$ from the viewpoint to which the photographing direction 220 faces, i.e., the road view data 250 photographed in the photographing direction 240 may be displayed on the displaced area.

Meanwhile, the controller 130 may display part of the road view data corresponding to the displaced area, on the displaced area.

To that purpose, the flexible display apparatus 100 may store in advance the information about overlapping road view data between all or part of the road view data photographed at a specific viewpoint and road view data photographed at a viewpoint rotated by a preset angle from the corresponding viewpoint. Accordingly, the controller 130 may determine the overlapping image between the road view data photographed at a specific viewpoint and the road view data photographed at a viewpoint rotated by a preset angle from the corresponding viewpoint, and detect the corresponding data.

For example, the controller 130 displays the road view data displayed on the non-displaced area on the non-displaced area as is. The controller 130 then determines overlapping image between the pre-bending road view data displayed on the non-displaced area and the road view data corresponding to the displaced area, remove the data regarding the overlapped image among the road view data corresponding to the displaced area and display the result on the displaced area.

Figure 11A:
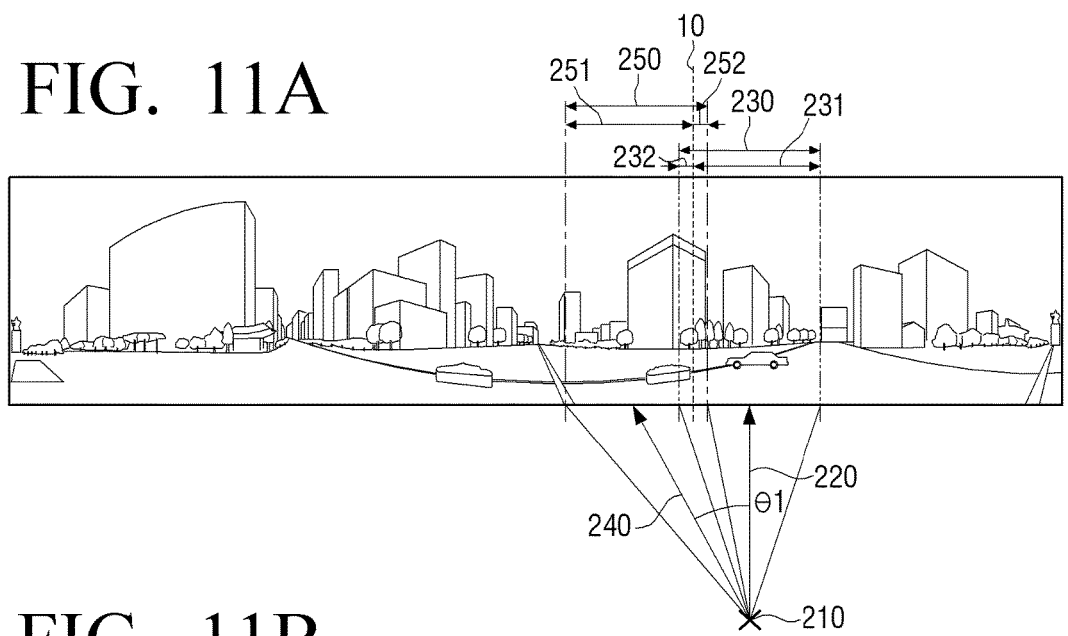
Figure 11B:
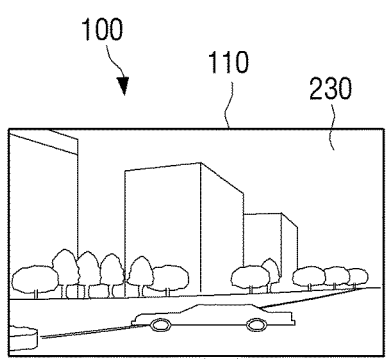
Figure 11C:
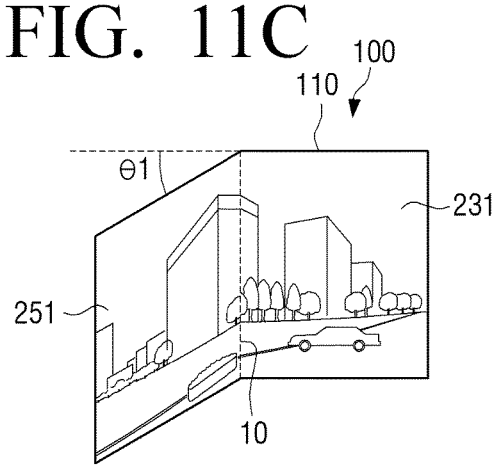

For example, referring to FIGS. 11A to 11C, when the display 110 bends, the road view data 231 displayed on the right side with reference to the bending line 10 is displayed on the non-displaced area. Meanwhile, the road view data 250 photographed in the photographing direction 240 and the road view data 231, which is displayed on the non-displaced area, are overlapped as much as data 252. Accordingly, the road view data 251 may be displayed on the displaced area after the overlapping data 252 is removed from the road view data 250.

In another exemplary example, the controller displays the pre-bending road view data on the non-displaced area. The controller 130 may then determine the overlapped image in the pre-bending road view data and the road view data corresponding to the displaced area, remove the overlapped image data from the road view data corresponding to the displaced area, and display the result on the displaced area.

Figure 12A:
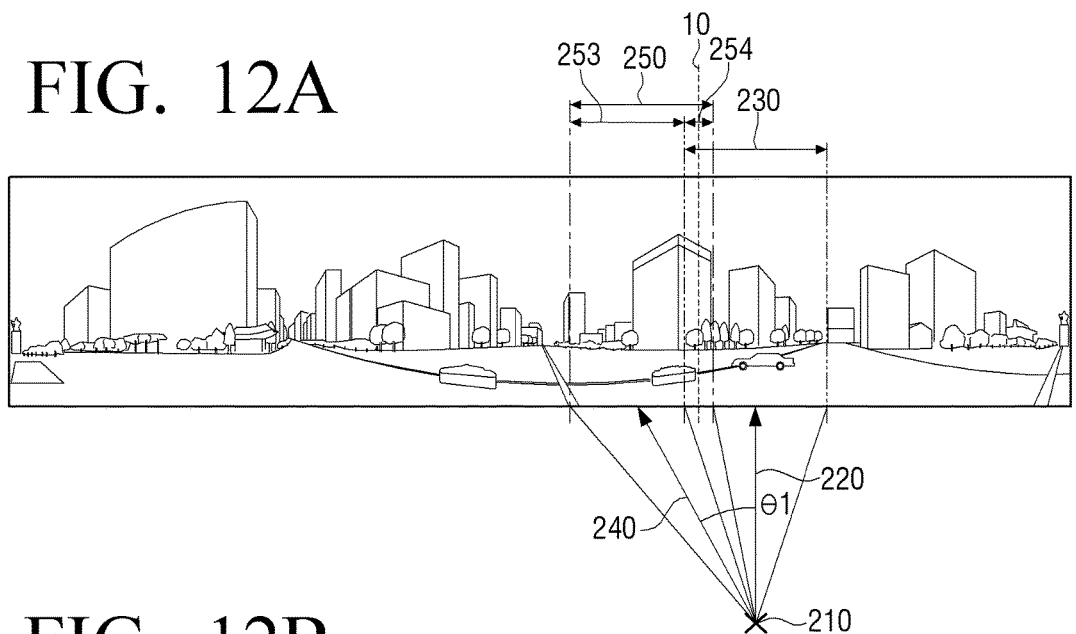
Figure 12B:
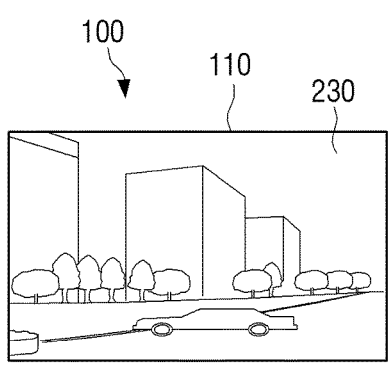
Figure 12C:
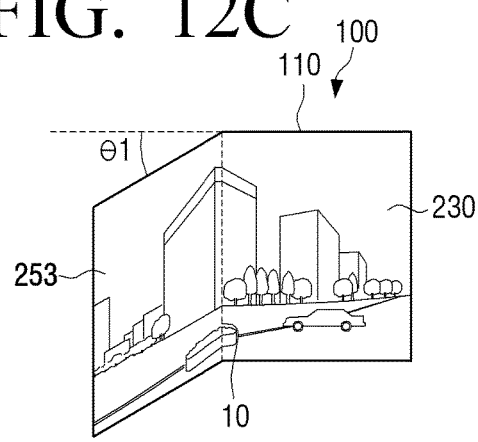

For example, with reference to FIGS. 12A to 12C, when the display 110 bends, the pre-bending road view data 230 is displayed on the non-displaced area. Meanwhile, the road view data corresponding to the displaced area, i.e., the road view data 250 photographed in the photographing direction 240 and the pre-bending road view data 230 are overlapped with each other as much as data 253. Accordingly, the road view data 253 is displayed on the displaced area after the overlapped data 254 is removed from the road view data 250.

Meanwhile, it is assumed that the right side of the display 110 bends to Z+ direction as much as $\theta_2$. In this case, the controller 130 may display the road view data displayed on the left side with reference to the bending line, on the non-displaced area. That is, the controller 130 may display the road view data displayed on the non-displaced area as is.

In the above exemplary example, the controller 130 may display the road view data photographed at a viewpoint of a corresponding area, on the displaced area.

In the exemplary embodiments explained above, the controller 130 may display the road view data on the displaced area, in which the displayed road view data is photographed at a viewpoint which is obtained by adding $\theta_2$ to the viewpoint at which the pre-bending road view data was photographed.

Figure 13A:
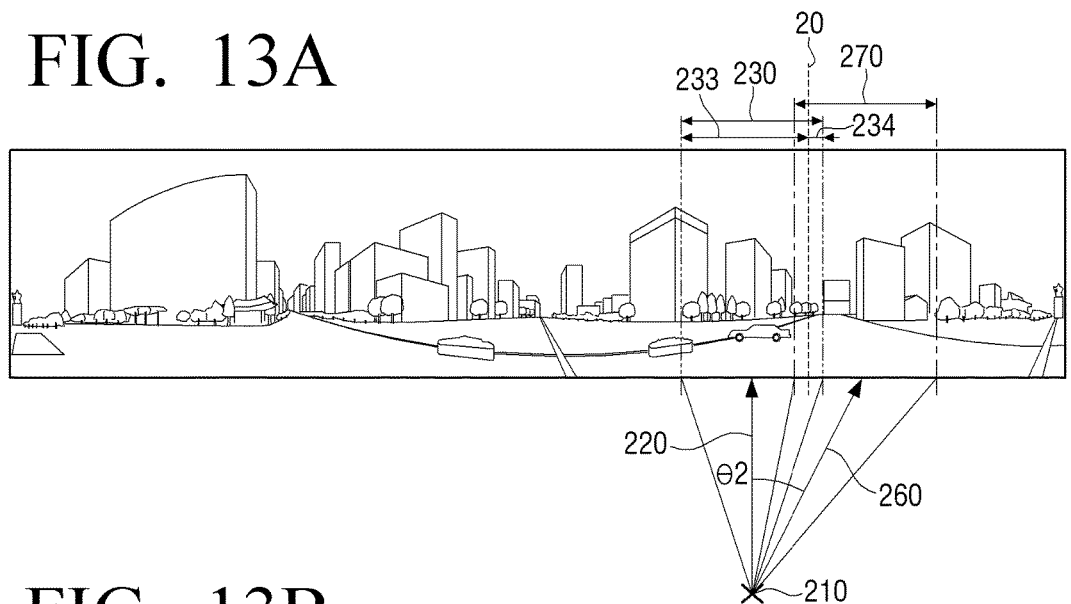
Figure 13B:
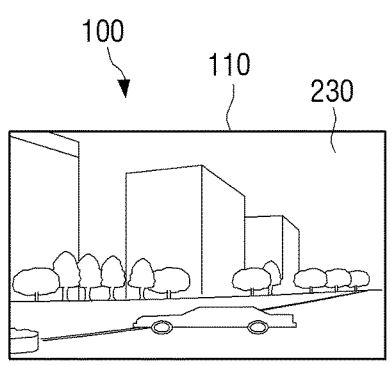

That is, with reference to the panoramic image as the one illustrated in FIG. 13A, it is assumed that the road view data 230 photographed in the photographing direction is displayed on the display 110 (see FIG. 13B). After that, when the right side of the display 110 bends to Z+ direction as much as $\theta_2$, the road view data 230 may be divided into the road view data 233 displayed on the left side with reference to the bending line 20 formed by bending of the display 110, and the road view data 234 displayed on the right side with reference to the bending line 20.

Figure 13C:
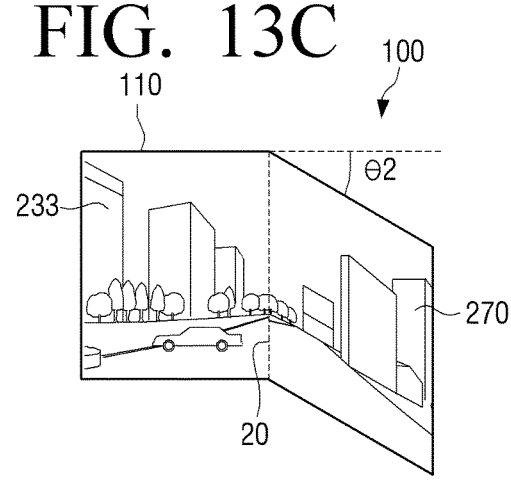

Accordingly, referring to FIG. 13C, the road view data 233 displayed on the left side with reference to the bending line 20 is displayed on the non-displaced area. On the displaced area, the road view data photographed at a viewpoint moved as much as $\theta_2$ clockwise from the viewpoint in the photographing direction 220, i.e., the road view data photographed in the photographing direction 260 is displayed.

Meanwhile, the controller 130 may not display all the pre-bending road view data on the non-displaced area. That is, the non-displaced area has a smaller screen size than before the bending of the display 110 when the display 110 bends. Accordingly, the controller 130 may adjust the pre-bending road view data to suit the screen size of the non-displaced area before displaying the same on the non-displaced area.

Figure 14A:
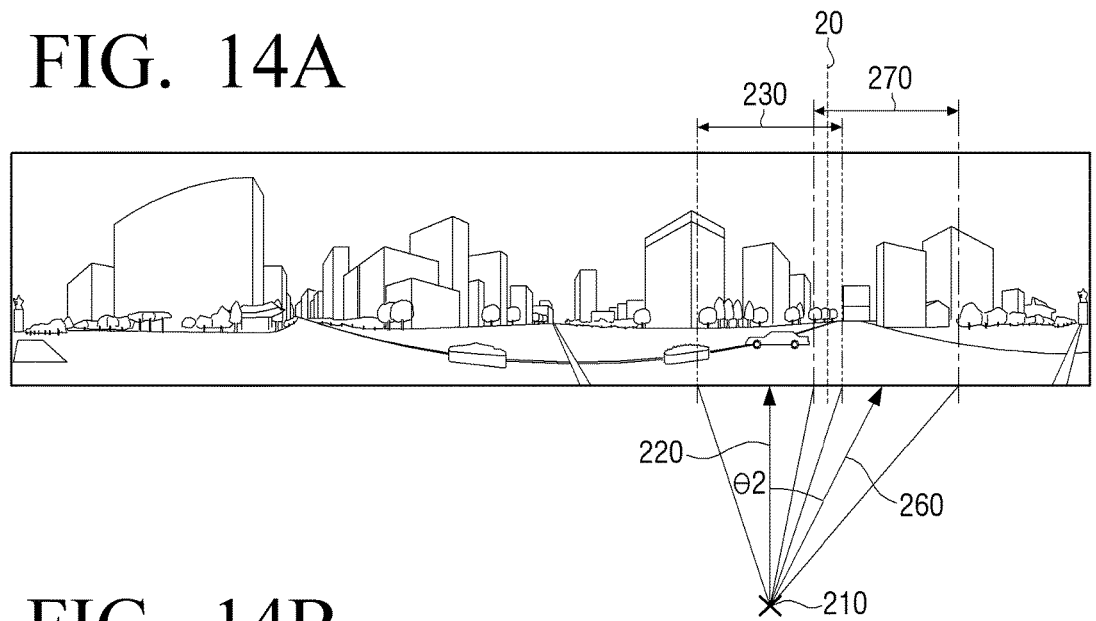
Figure 14B:
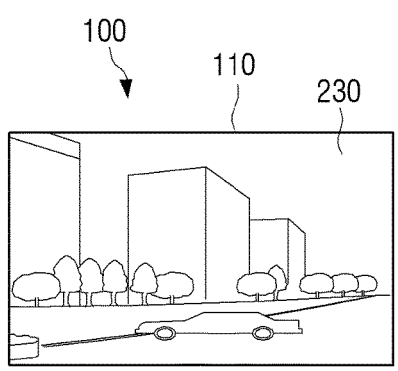
Figure 14C:
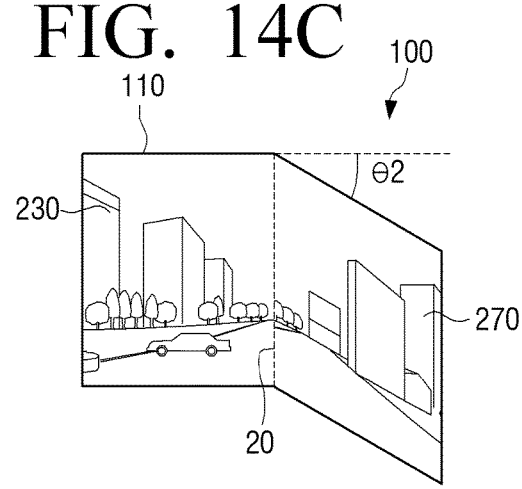

For example, referring to FIGS. 14A to 14C, the pre-bending road view data 230 may be displayed on the non-displaced area, while the road view data photographed at a viewpoint moved as much as $\theta_2$ clockwise from the viewpoint in the photographing direction 220, i.e., the road view data 270 photographed in the photographing direction 260 may be displayed on the displaced area.

Meanwhile, the controller 130 may display part of the road view data corresponding to the displaced area, on the displaced area.

The flexible display apparatus 100 may store in advance the information about the overlapped road view data between all or part of the road view data photographed at a specific viewpoint, and road view data photographed at a viewpoint rotated from the corresponding viewpoint as much as a preset angle. Accordingly, the controller 130 may determine overlapped image between the road view data photographed at a specific viewpoint and road view data photographed at a viewpoint rotated by a preset angle from the corresponding viewpoint and detect the corresponding data.

For example, the controller 130 displays the road view data displayed on the non-displaced area on the non-displaced area as is. The controller 130 then determines overlapping image between the pre-bending road view data displayed on the non-displaced area and the road view data corresponding to the displaced area, remove the data regarding the overlapped image in the road view data corresponding to the displaced area and display the result on the displaced area.

Figure 15A:
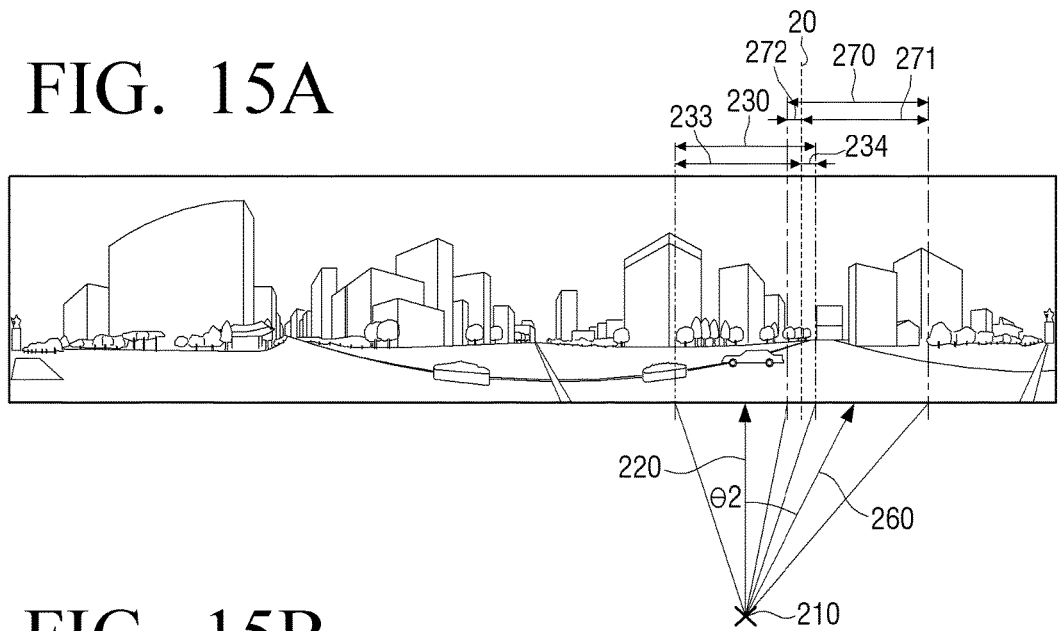
Figure 15B:
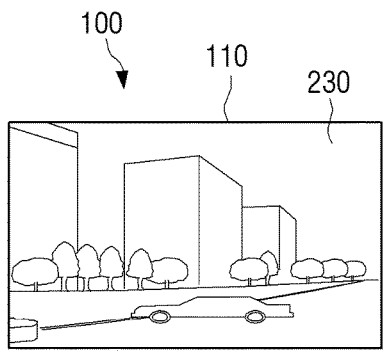
Figure 15C:
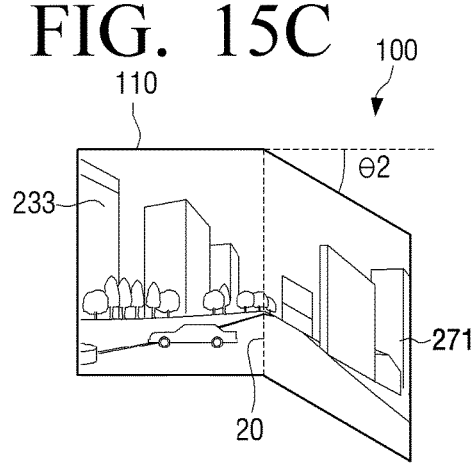

For example, referring to FIGS. 15A to 15C, when the display 110 bends, the road view data 233 displayed on the left side with reference to the bending line 20 is displayed on the non-displaced area. Meanwhile, the road view data corresponding to the displaced area, i.e., the road view data 270 photographed in the photographing direction 260 and the pre-bending road view data 230 displayed on the non-displaced area are overlapped with each other as much as data 272. Accordingly, the road view data 271 may be displayed on the displaced area after the overlapped data 272 is removed from the road view data 270.

In another exemplary example, the controller displays the pre-bending road view data on the non-displaced area. The controller 130 may then determine overlapped image in the pre-bending road view data and the road view data corresponding to the displaced area, remove the overlapped image data from the road view data corresponding to the displaced area, and display the result on the displaced area.

Figure 16A:
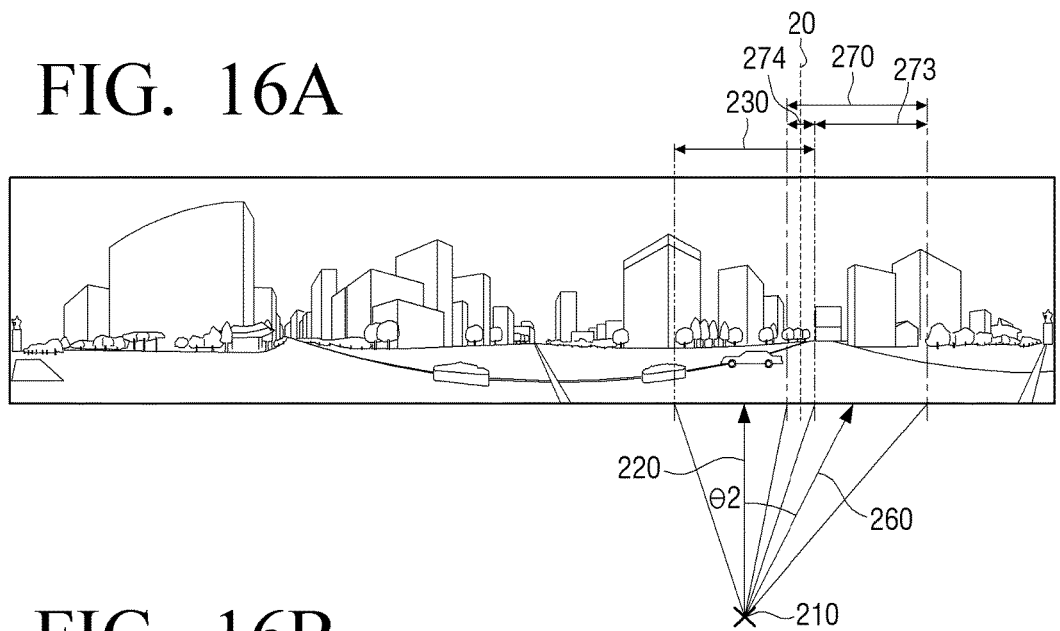
Figure 16B:
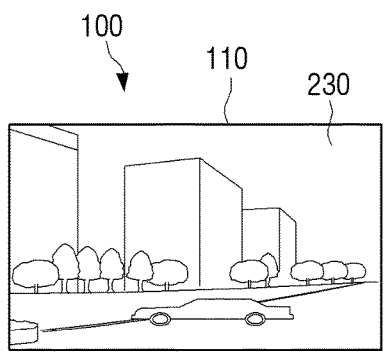
Figure 16C:
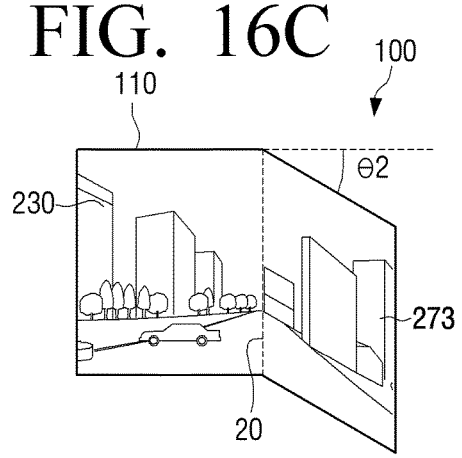

For example, with reference to FIGS. 16A to 16C, when the display 110 bends, the pre-bending road view data 230 is displayed on the non-displaced area. Meanwhile, the road view data corresponding to the displaced area, i.e., the road view data 270 photographed in the photographing direction 260 and the pre-bending road view data 230 are overlapped with each other as much as data 274. Accordingly, the road view data 273 is displayed on the displaced area after the overlapped data 274 is removed from the road view data 270.

Meanwhile, when the display 110 rotates, changing the arrangement of the plurality of sub-areas, the controller 130 may determine a viewpoint for a three-dimensional space corresponding to the plurality of sub-areas in the changed arrangement and display the image data photographed at the determined viewpoint on each of the plurality of sub-areas of the changed arrangement.

To be specific, the controller 130 may rotate the viewpoint of photographing the road view data corresponding to the respective sub-areas to determine a viewpoint of each of the sub-areas, and display the road view data photographed at the determined viewpoint on each of the sub-areas.

To that purpose, the sensor 120 may include a gyro sensor or a geomagnetism sensor, and transmit information about the direction and angle of rotation to the controller 130 as the display 110 rotates. The controller 130 calculates an angle between each of the rotated sub-area and x-y plane, based on the information about the direction and angle of rotation of the display 110.

Figure 17A:
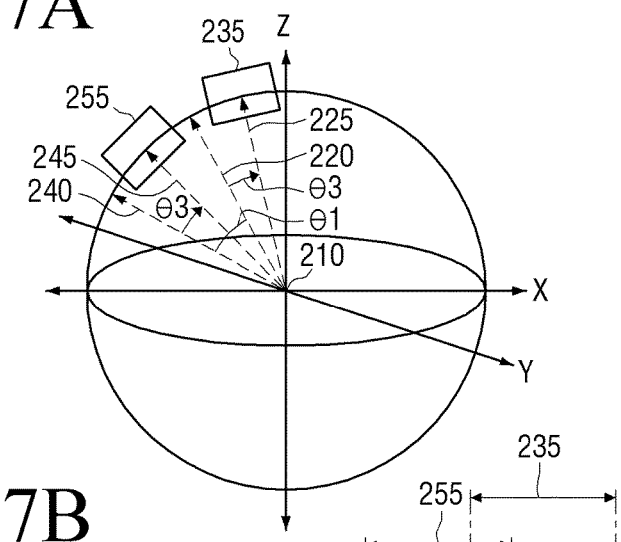
Figure 17B:
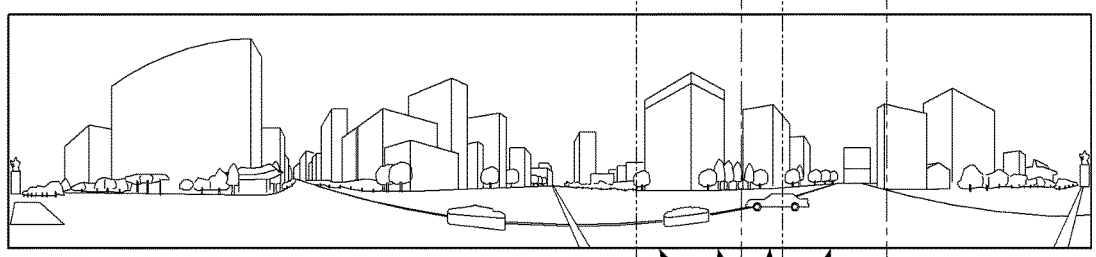
Figure 17C:
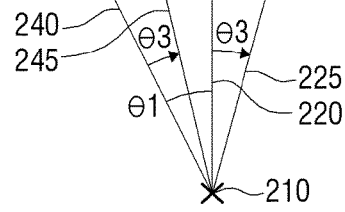
Figure 17D:
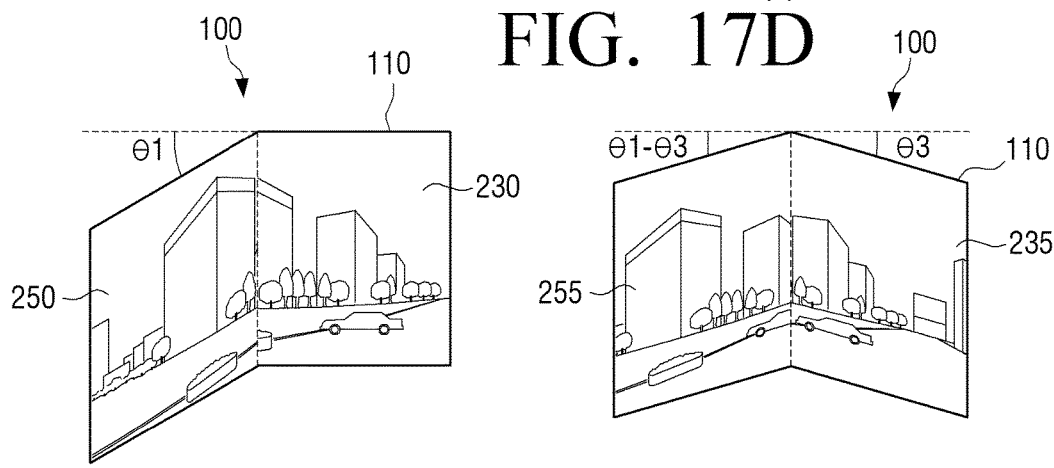

For example, referring to FIG. 17A, when the left side of the display 110 bends to Z+ direction as much as $\theta_1$, the viewpoint of the non-displaced area may be the photographing direction 220, while the viewpoint viewed by the displaced area may be the photographing direction 240.

When the bent display 110 rotates as much as $\theta_3$, the controller 130 may calculate the viewpoint of the respective sub-areas, based on the direction and angle of rotation. For example, referring to FIG. 17A, when the display 110 is rotated leftward by $\theta_3$, the controller 130 may calculate a viewpoint of the area displaying the road view data photographed in the photographing direction 220, by adding $\theta_3$ to the viewpoint in the photographing direction 240. Accordingly, the viewpoints of the respective sub-areas may be the viewpoints in the photographing directions 225, 245.

Further, the controller 130 may detect the road view data photographed at viewpoints in the rotated, sub-areas respectively, and display the detected road view data on the sub-areas, respectively. That is, referring to FIGS. 17B to 17D, the road view data 235 photographed at a viewpoint in the photographing direction 225 may be displayed on an area where the road view data 230 photographed at a viewpoint in the photographing direction 220 has been displayed, while the road view data 255 photographed at a viewpoint in the photographing direction 245 may be displayed on an area where the road view data 250 photographed at a viewpoint in the photographing direction 240 has been displayed.

In another exemplary embodiment, referring to FIG. 18A, when the right side of the display 110 bends to Z+ direction as much as $\theta_2$, the viewpoint of the non-displaced area may be the photographing direction 220, while the viewpoint of the displaced area may be the photographing direction 260.

The controller 130 may calculate viewpoints of the respective sub-areas based on a direction of rotation, when the display 110 rotates as much as $\theta_4$. For example, referring to FIG. 18A, when the bent display 110 rotates rightward as much as $\theta_4$, the controller 130 calculates the viewpoint of the area of displaying the road view data photographed in the photographing direction 260 by subtracting $\theta_4$ from the viewpoint in the photographing direction 220, and calculate the viewpoint of the area of displaying the road view data photographed in the photographing direction 260 by subtracting $\theta_4$ from the viewpoint in the photographing direction 220. Accordingly, viewpoints of the respective sub-areas may be in the photographing directions 227 and the photographing direction 267.

The controller 130 may detect the road view data photographed at the viewpoints of the respective sub-areas and display the respective detected road view data on the respective sub-areas. That is, referring to FIGS. 18B to 18D, the road view data photographed 237 at the viewpoint in the photographing direction 220 may be displayed on an area which has displayed the road view data 237 photographed at the viewpoint in the photographing direction 220, while the road view data 270 photographed at the viewpoint in the photographing direction 267 may be displayed on an area which has displayed the road view data 270 photographed at the viewpoint in the photographing direction 260.

Meanwhile, in certain exemplary embodiments (e.g., FIG. 17C), it is assumed that the road view data explained with reference to FIG. 10C is displayed on the respective sub-areas, while in other exemplary embodiments (e.g., FIG. 18C), the assumption is that the road view data explained with reference to FIG. 14C is displayed. However, other exemplary embodiments are also possible. For example, when the road view data as that illustrated in FIGS. 9C, 11C and 12C is displayed on the respective sub-areas of FIG. 17C, the road view data corresponding to the rotated state may also be displayed, or when the road view data as that illustrated in FIGS. 13C, 15C, 16C is displayed on the respective sub-areas, the road view data corresponding to the rotated state may also displayed.

Further, in addition to an exemplary embodiment where the road view data photographed at viewpoints of the respective sub-areas may be displayed (see FIGS. 17D, 18D), the road view data may be displayed in consideration of the bending line (see FIGS. 9A to 16C) or the road view data removed of overlapping portion may be displayed.

Further, in addition to the exemplary embodiment where the road view data photographed at viewpoints of the respective sub-areas is displayed, when the display 110 bends inward (That is, when bending in Z+ direction), other exemplary embodiments are possible. That is, a screen corresponding to the arrangement of the respective sub-areas may be displayed, when the display 110 bends outward (That is, when bending in Z− direction). In this case, the controller 130 may display the road view data which is displayed with bending in Z+ direction, at the same angle as that of Z− bending of the display 110.

Further, in addition to an exemplary embodiment where the data of the road view data that corresponds to the viewpoints of the respective sub-areas is displayed, other exemplary embodiments are also possible. That is, the controller 130 may display the image of the plurality of two-dimensional (2D) images that is photographed at the viewpoints of the respective sub-areas. In this case, the plurality of 2D images may be stored in the flexible display apparatus 100 in advance, or received from an external server (not illustrated).

Alternatively, the controller 130 may determine the viewpoints of the respective sub-areas by rotating the reference position as much as the angle of rotating the display 110, and display the road view data photographed at the determined viewpoints.

For example, it is assumed that the left side of the display 110 bends in Z− direction as much as $\theta_5$ in a state that the road view data 230 is displayed on the display 110. In this case, the controller 130 rotates the direction vector facing the reference position 210 as much as $\theta$ with reference to a starting point where the endpoint of the direction vector in the photographing direction 230 meets the sphere 200 ("endpoint-sphere intersection"), and sets a new reference position based on a point where the rotated direction vector meets x-y plane. The controller 130 then detects road view data based on a contacting surface of an intersecting point between the endpoint of the direction vector facing toward the intersection point between the endpoint of the direction vector in the photographing direction 230 and the sphere 200, and the sphere 200 at the newly set reference point and display the same on the displaced sub-areas.

In another exemplary embodiment, in a state that the road view data 230 is displayed on the display 110, it is assumed that the right side of the display 110 bends to Z− direction as much as $\theta$. In this case, the controller 130 rotates the direction vector facing the reference position 210 counterclockwise as much as $\theta_5$ from a starting point where the endpoint of the direction vector in the photographing direction 230 meets the sphere 200, and sets a new reference position based on an intersecting point between the rotated direction vector and x-y plane. The controller 130 may then detect road view data based on a contacting surface of an intersecting point between the endpoint of the direction vector facing toward the intersecting point between the endpoint of the direction vector with respect to the photographing direction 230 and the sphere 200, and the sphere 200, at the newly set reference position, and display the same on the displaced sub-areas.

Meanwhile, the display 110 may display an object. The 'object' as used herein may encompass object, person or building with 3D configuration. That is, the display 110 may display various images photographed from the object with 3D configuration.

The controller 130 may control the display 110 to display an image corresponding to the arrangement of a plurality of sub-areas on the sub-areas, among multi-viewpoint images of the object. To that purpose, the flexible display apparatus 100 may store the multi-viewpoint images of the object, or receive the same from an external server (not illustrated). The flexible display apparatus 100 may additionally include a communicator for networked communication, and receive an image corresponding to the arrangement of the sub-area.

The 'multi-viewpoint image' as used herein refers to an image of an object with 3D configuration photographed at, or generated with, a plurality of viewpoints. This will be explained in greater detail below with reference to FIGS. 19 and 20.

Figure 19:
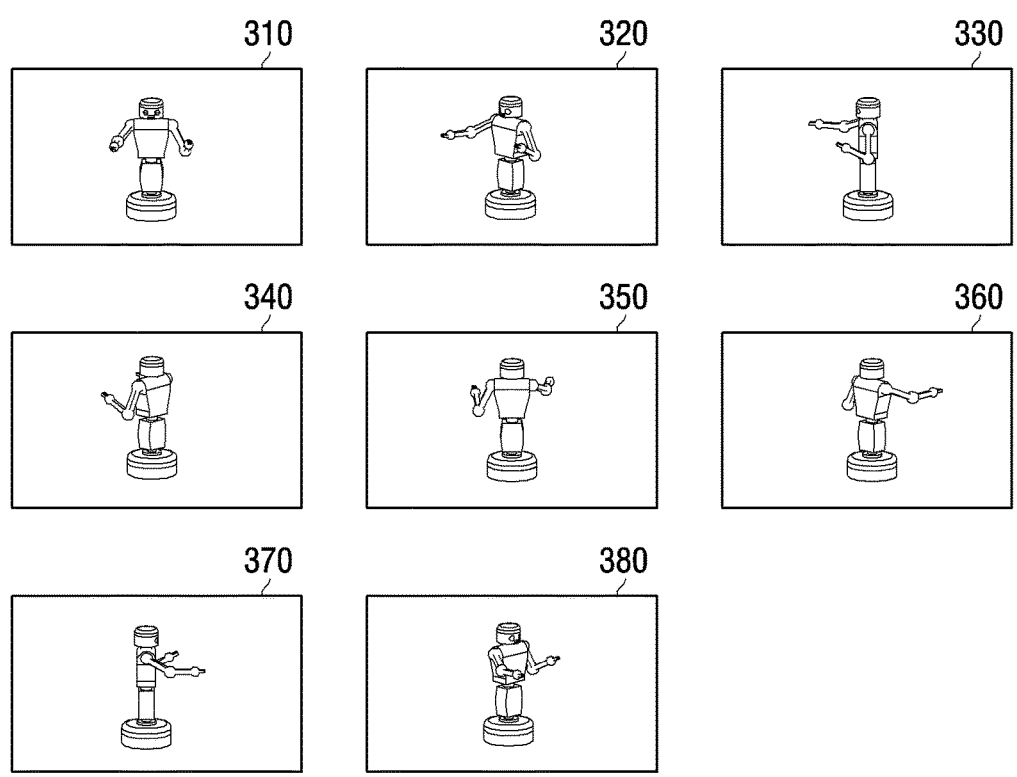
FIGS. 19 and 20 are views provided to explain multi-viewpoint images according to one or more exemplary embodiments.
Figure 20:
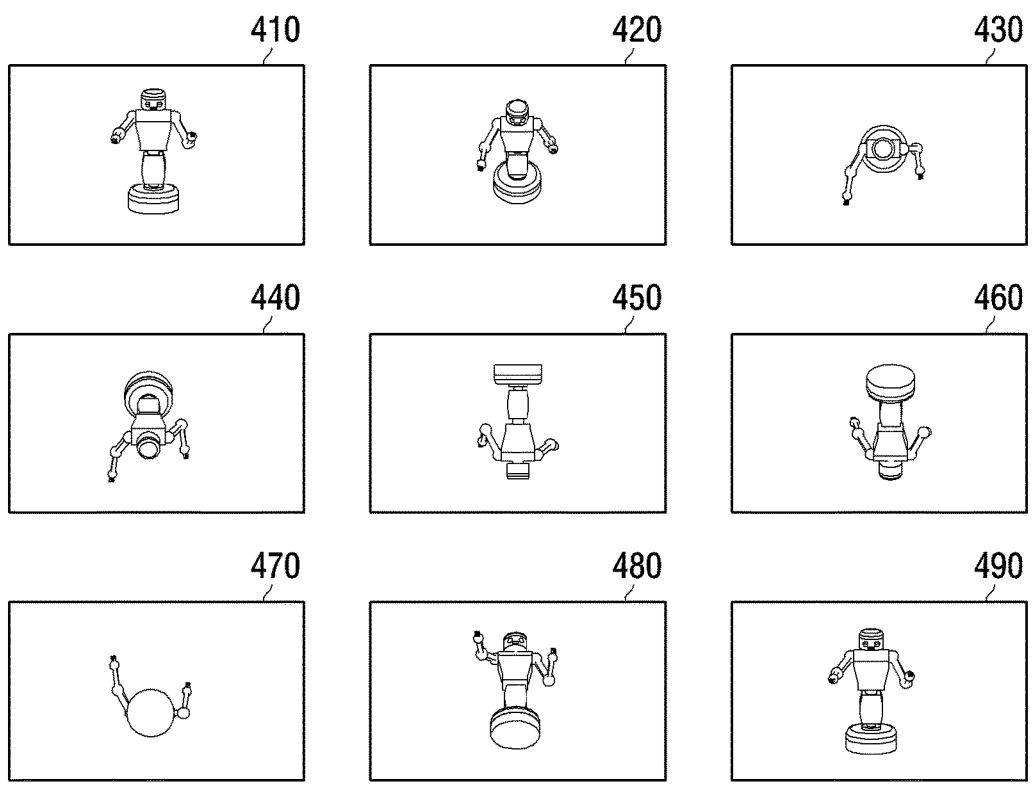

FIGS. 19 and 20 are views provided to explain multi-viewpoint image according to an exemplary embodiment. For convenience of explanation, it is assumed that the multi-viewpoint image of FIGS. 19 and 20 are those of an object with 3D configuration that are photographed from a plurality of viewpoints.

The multi-viewpoint image may include images of the object, which are photographed along imaginary sphere of radius that corresponds to a preset distance from the object, with reference to the object. That is, the multi-viewpoint image may include images of the object photographed at various viewpoints along the imaginary sphere.

For example, with reference to FIG. 19, the multi-viewpoint image may include a frond object image 310 photographed in front of the object with 3D configuration, and rightward object images 320 to 380 photographed sequentially from a point at a predetermined angle to the rightward direction with reference to the front. Further, with reference to FIG. 20, the multi-viewpoint image may include a front object image 410 photographed in front of the object with 3D configuration, and upper-ward object images 420 to 480 photographed sequentially from a point at a predetermined angle to the upward direction with reference to the front.

Meanwhile, the images illustrated in FIGS. 19 and 20 are exemplary examples of the images included in the multi-viewpoint images. That is, the multi-viewpoint images, which are photographed from the object along an imaginary sphere, may include the images of the object that are photographed sequentially from a point at a predetermined angle diagonally to the front of the object.

Meanwhile, among the multi-viewpoint images, the controller 130 may display the images that correspond to the bending state of the display 110 on the respective sub-areas. This will be explained in greater detail below with reference to FIGS. 21 to 25.

FIGS. 21 to 25 are views provided to explain a method for displaying a screen according to an arrangement of the sub-area, according to an exemplary embodiment.

The controller 130 determines the arrangement of a plurality of areas divided by the bending of the display 110, based on the result of sensing at the sensor 120.

To that purpose, the sensor 120 may include an acceleration sensor (i.e., gravity sensor or G sensor). The acceleration sensor senses the direction in which the gravity acts on the display 110. Accordingly, based on the sensing result of the acceleration sensor, the controller 130 may determine the posture of the display 110, i.e., the direction of arrangement of the display 110 and degree of tilting. The direction of the arrangement of the display 110 may include information on whether the display 110 is arranged on horizontal or vertical direction, and the degree of tilting of the display 110 may include degree of tilting of the display 110, arranged in horizontal or vertical direction, with reference to the direction of gravity.

The controller 130 may then determine the angle and direction of bending of the display 110 by referring to the sensing result of the bend sensor, and determine the arrangement state of a plurality of sub-areas in comprehensive consideration of the determined results.

For example, when the display 110 has the bending state as the one illustrated in FIG. 21, the controller 130 may determine that the first sub-area 110-1 is arranged horizontally without tilting, while the second sub-area 110-2 is arranged with 90° bending to Z− direction from the right side, with reference to the first sub-area 110-1. In another exemplary embodiment, when the display 110 has the bending state as the one illustrated in FIG. 22, the controller 130 may determine that the first sub-area 110-1 is arranged vertically without tilting, while the second sub-area 110-2 is arranged with 90° bending to Z− direction from upper side, with reference to the first sub-area 110-1.

Meanwhile, depending on the arrangement state of a plurality of sub-areas, the controller 130 determines the viewpoints of the plurality of sub-areas viewing the 3D object. To be specific, when a plurality of imaginary lines passing the centers of the respective sub-areas and in perpendicular relations to the respective sub-areas meet, and when the 3D object is arranged at a point where the plurality of lines meet, the controller 130 may determine the viewpoints of the respective sub-areas viewing the 3D object.

Among the multi-viewpoint images, the controller 130 may detect the images corresponding to the viewpoints of the respective sub-areas viewing the 3D object and display the detected images on the respective sub-areas. To be specific, the controller 130 may detect the images of the 3D object photographed in the same direction as the direction of the respective sub-areas facing the 3D object, and display the detected images on the respective sub-areas.

Figure 23:
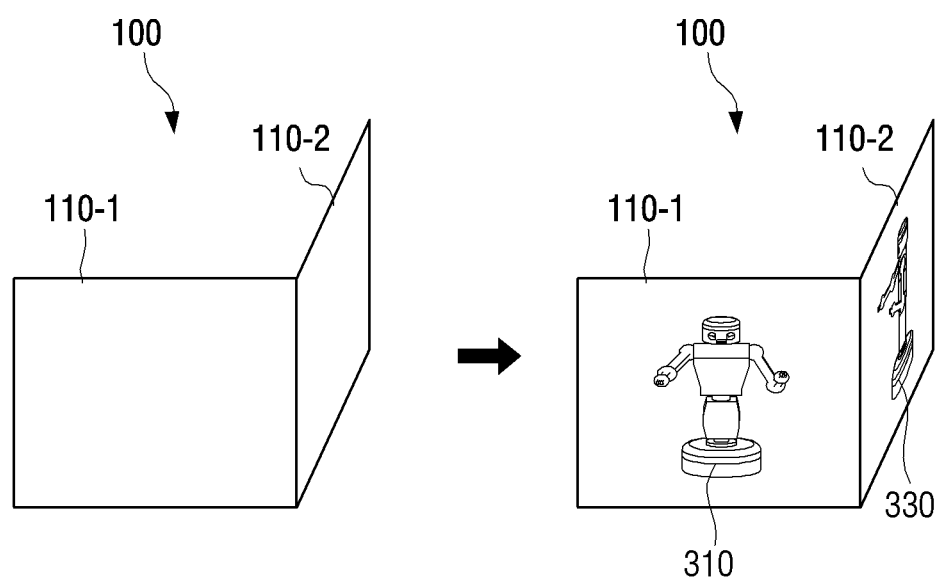

For example, referring to FIG. 23, it is assumed that the first sub-area 110-1 is arranged horizontally without tilting, while the second sub-area 110-2 is arranged with 90° bending to Z− direction from the right side, with reference to the first sub-area 110-1.

In this case, the controller 130 determines that the first sub-area is viewing the 3D object in the front, while the second sub-area 110-2 is viewing the 3D object at a point 90° away from the front side in the rightward direction.

Accordingly, among the multi-viewpoint images, the controller 130 displays the image of the 3D object photographed from the front on the first sub-area 110-1, while displaying the images photographed 90° away from the front of the 3D object to the rightward direction on the second sub-area 110-2. For example, in the case of multi-viewpoint image illustrated in FIG. 19, the controller 130 may display the image 310 on the first sub-area 110-1, and display the image 330 on the second sub-area 110-2 (FIG. 23).

Meanwhile, the controller 130 may display the object that has been displayed on the display 110 on one of the plurality of areas, and display the image corresponding to the angle of bending of the display 100 among the multi-viewpoint images of the object on the rest sub-areas.

To that purpose, the controller 130 may determine the pre-bending arrangement state of the display 110 and, among the multi-viewpoint images, may display the image corresponding to the determined arrangement state on the display 110.

To be specific, the controller 130 may determine the pre-bending viewpoint of the display 110 with which the display 110 views the 3D object before bending, and among the multi-viewpoint images, detect the image photographed at the pre-bending viewpoint of the display 110 of viewing the 3D object and display the same.

For example, when the display 110 is arranged in the horizontal direction without tilting (see FIG. 24), the controller 130 determines that the display 110 is viewing the 3D object from the front The controller 130 may display the image 310 on the display 110, among the multi-viewpoint images.

After that, when the display 110 bends, the controller 130 determines the arrangement state of the respective sub-areas in consideration of the angle and direction of bending, and displays the image among the multi-viewpoint images that corresponds to the determined arrangement state on the respective sub-areas.

When at least one of the plurality of sub-areas, formed by bending of the display 110, maintain the previous arrangement state after the bending of the display 110, the image that has been displayed on the display 110 before bending may be displayed on the sub-areas with maintained arrangement state. Regarding the rest sub-areas, the controller 130 may display the image among the multi-viewpoint images that corresponds to the bending state of the corresponding sub-area.

For example, it is assumed that the display 110 bends, according to which the first sub-area 110-5 maintains the same arrangement state before bending, while the second sub-area 110-6 is bent from the left side to Z− direction by 90° with reference to the first sub-area 110-5.

In this case, the controller 130 may display the image 310 on the first sub-area 110-5 which has the same arrangement state as the display 110 before bending. The controller 130 may determine that the second sub-area 110-6 is arranged to a direction where the 3D object is viewed 90° to the left side with reference to the front side, and display the image of the 3D object photographed 90° to the left side with reference to the front, on the second sub-area 110-6. For example, in the case of multi-viewpoint image illustrated in FIG. 19, the controller 130 may display the image 370 on the second sub-area 110-6 (see FIG. 24).

Meanwhile, the sensor 120 may sense the rotation with reference to the display 110. For example, the sensor 120 may sense the direction and angle of rotation of the display 110 through geomagnetism sensor or gyro sensor and transmit the sensing result to the controller 130.

When the display 110 rotates so that the arrangement state of a plurality of sub-areas changes, the image that has been displayed on the respective sub-areas may be replaced with the images corresponding to the changed arrangement state and displayed. To be specific, the controller 130 may determine the arrangement state of the plurality of sub-areas based on the direction and angle of rotation of the display 110, and display the image among the multi-viewpoint images that corresponds to the determined arrangement state on the plurality of sub-areas, respectively.

Figure 25:
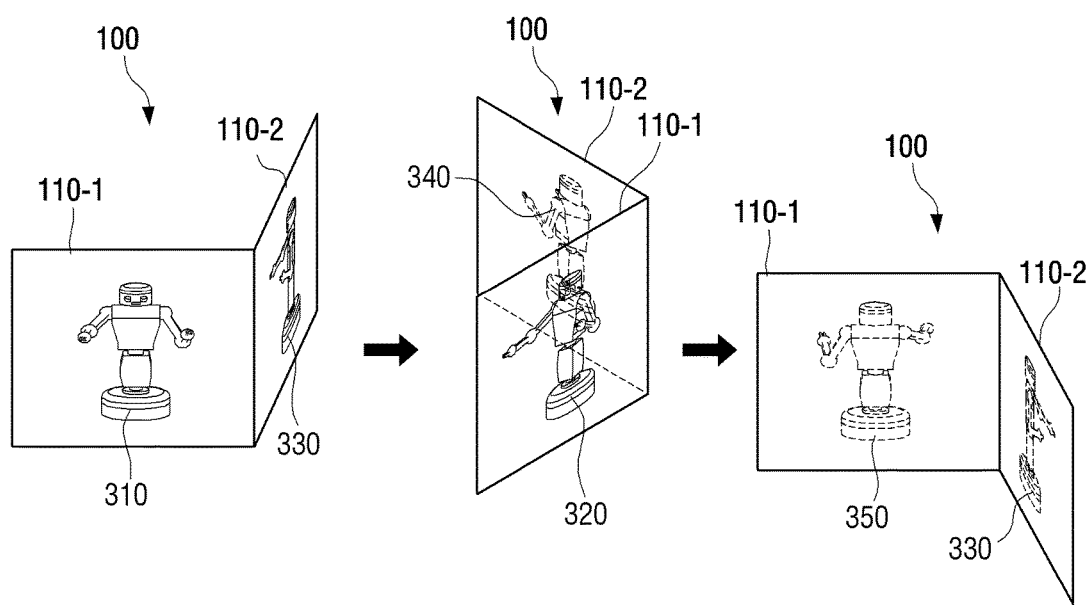

For example, referring to FIG. 25, when the first sub-area 110-1 is arranged in a horizontal direction without tilting, while the second sub-area 110-2 is arranged with 90° bending to Z− direction from the right side with reference to the first sub-area 110-1, the controller 130 may display the images 310, 330 of FIG. 19 on the first and second sub-areas 110-1, 110-2, respectively.

After that, when the display 110 rotates, the controller 130 again determines the arrangement states of the plurality of sub-areas based on the direction and angle of rotation. For example, when the first and second sub-areas 110-1, 110-2 rotate by 45° to the right side (FIG. 24), the controller 130 may determine, with reference to the pre-rotation arrangement states, that the sub-areas 110-1, 110-2 are rotated to the right side by 45°.

The controller 130 may then determine the viewpoints of the respective sub-areas which changed arrangement states due to rotation, detect from the multi-viewpoint images the image photographed at the viewpoints of the respective sub-areas and display the result on the respective sub-areas. In this case, the controller 130 may determine the viewpoints of the respective, rotated sub-areas by displacing the viewpoints of the respective sub-areas to the direction of rotation of the display 110 and detect the images photographed at the determined viewpoints and display the result.

Figure 24:
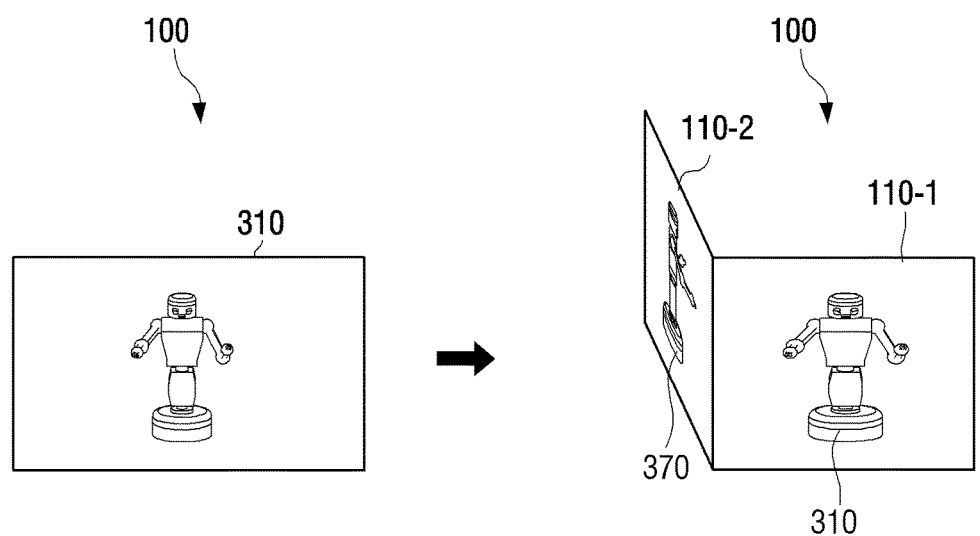

For example, referring to FIG. 24, because the respective sub-areas are rotated to the right side by 45°, the controller 130 detects the images of the 3D object photographed at points respectively 45° to the right side from the directions of photographing the images 310, 330, and displays the results on the respective sub-areas 110-1, 110-2. Accordingly, the image 320 of the 3D object photographed 45° to the right side from the front side is displayed on the first sub-area 110-1, while the image 340 of the 3D object photographed 45° to the right side from the 90° point on the right side, i.e., the image 340 photographed 135° to the right side from the front side is displayed on the second sub-area 110-2. Further, referring to FIG. 24, when the respective sub-areas 110-1, 110-2 are rotated 45° back to the right side, the image 330 of the 3D object photographed 90° point is displayed on the first sub-area 110-1, while the image 350 of the 3D object photographed from the rear surface is displayed on the second sub-area 110-2.

Meanwhile, in addition to the exemplary embodiment where the display 110 bends outward (i.e., where the display 110 bends to Z− direction) and the images among the multi-viewpoint images, that are photographed at viewpoints of the respective sub-areas are displayed, other exemplary embodiments are possible. That is, when the display 110 bends inward (i.e., when the display 110 bends to Z+ direction), the screen corresponding to the arrangement state of the respective sub-areas may be displayed. In this case, the controller 130 may display the image for displaying on the respective sub-areas formed by bending in Z− direction, also when the display 110 bends in Z+ direction.

Further, although the display 110 bends once in the exemplary embodiment explained above regarding displaying of screen according to the arrangement state of the respective sub-areas, this is only one exemplary example. That is, the display 110 may bend two times, causing the entire area of the display to be divided into three sub-areas, in which case, among the multi-viewpoint images, the images matching the arrangement state of the respective sub-areas may also be displayed on the respective sub-areas.

In addition to the exemplary embodiments explained above, the flexible display apparatus 100 may display various screens according to the arrangement state of the sub-areas as these are formed upon bending of the display 110.

Figure 26A:
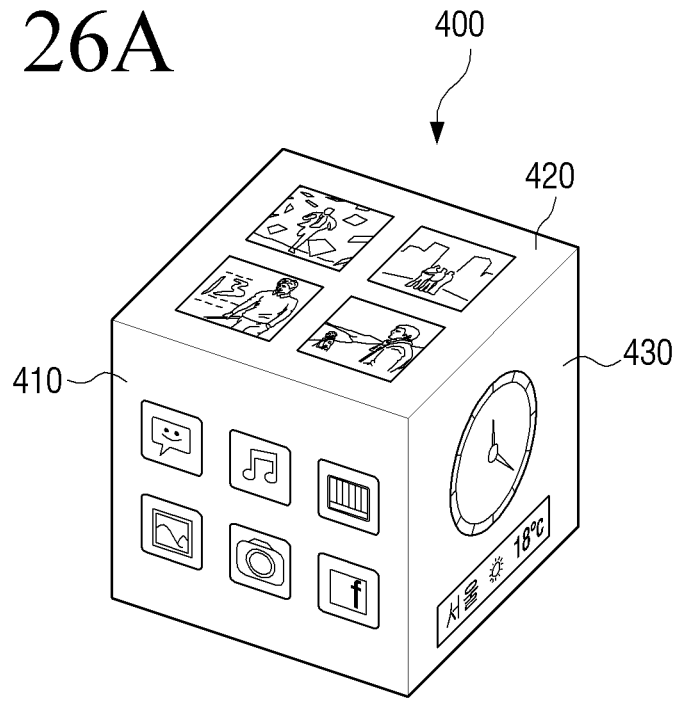
Figure 26B:
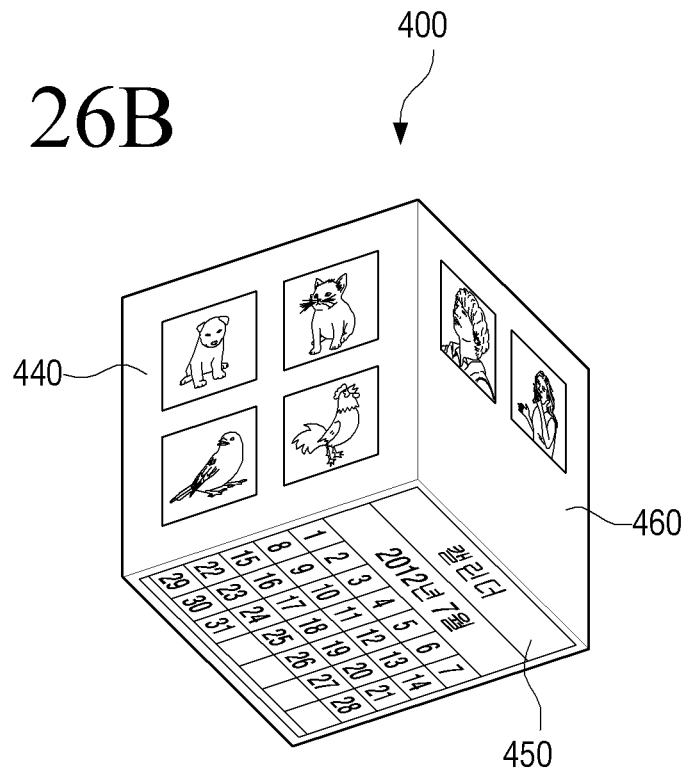
Figure 27:
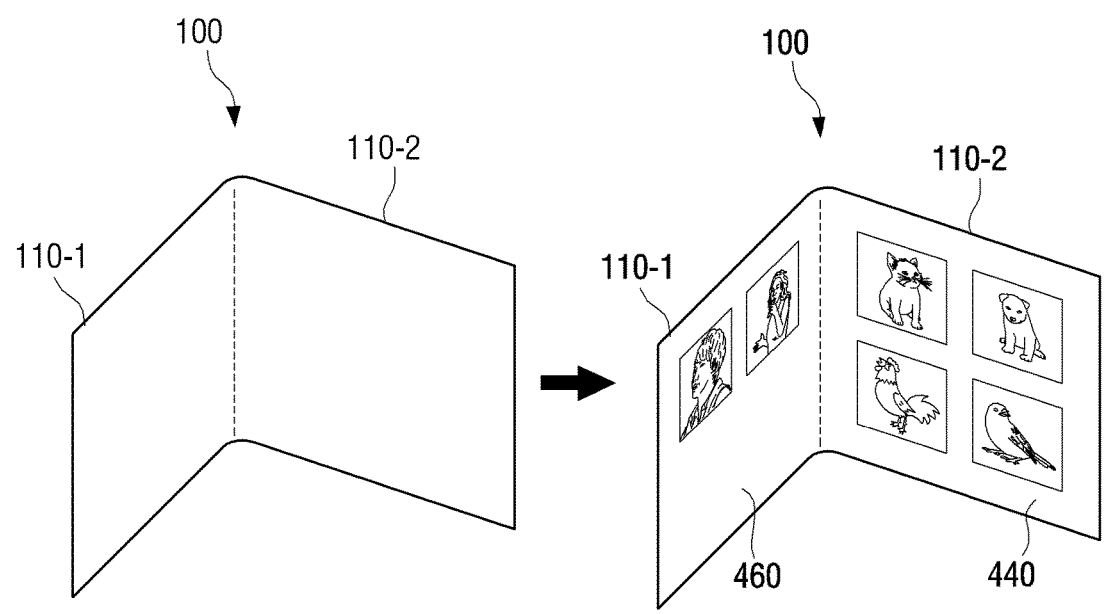
Figure 28:
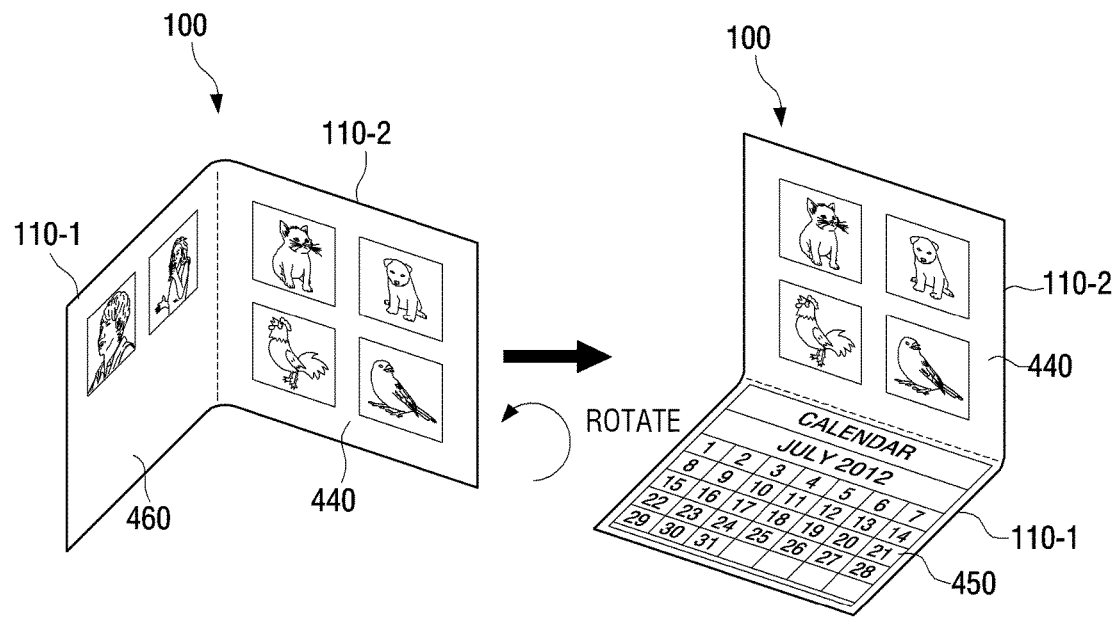

FIGS. 26 to 28 are views provided to explain a method for displaying a screen according to arrangement state of the sub-areas, according to another exemplary embodiment.

Meanwhile, in another exemplary embodiment, the controller 130 may determine a UI plane that corresponds to the arrangement state of the sub-areas among a plurality of UI planes that construct a 3D UI, and display graphic information about the determined UI plane on the respective sub-areas.

The 3D UI may be polygonal 3D UI, which may display UI screens on respective planes. For example, the 3D UI may be a hexagonal shape as illustrated in FIGS. 26A and 26B, with respective UI planes displaying UI screens. FIG.

26A illustrates the 3D UI from the front upper direction, and FIG. 26B illustrates the 3D UI from the rear lower direction.

Referring to FIGS. 26A and 26B, the respective UI planes of the hexagonal UI 400 may include various UI screens, in which case the flexible display apparatus 100 may store the graphic information to be displayed on the respective UI planes, i.e., UI screen information.

For example, the hexagonal UI 400 may include a first UI plane 410 including icons of applications installed in the flexible display apparatus 100, a second UI plane 420 including thumbnail images of the videos playable on the video application, a third UI plane 430 including various widgets, a fourth UI plane 440 including images playable on a camera application, a fifth UI plane 450 including calendar for implementing on a calendar application, and a sixth UI plane 460 including album image for the music files executable on a music application.

However, various other exemplary embodiments are possible, in addition to the hexagonal UI illustrated in FIGS. 26A and 26B with UI screens constructing the respective UI planes.

Meanwhile, the 3D UI may be stored in the flexible display apparatus 100 in advance or provided from an external server via network. In this case, the flexible display apparatus 100 may additionally include a communicator for network communication, and may receive graphic information (i.e., UI screen information) about the respective UI planes corresponding to the arrangement state of the sub-areas.

The controller 130 determines the arrangement state of a plurality of sub-areas based on the sensing result of the sensor 120. To that purpose, the sensor 120 may include an acceleration sensor to sense the posture of the display 110, and also include a bend sensor to sense angle and direction of bending of the display 110. Meanwhile, the controller 130 may determine the arrangement state of the plurality of sub-areas in comprehensive consideration of the sensing results of the sensor 120.

First, the controller 130 may determine posture of the display 110 based on the sensed value of the acceleration sensor. To be specific, the controller 130 may determine the direction of arranging the display 110 (i.e., in horizontal direction or vertical direction) and the degree of tilting to the direction of gravity, using the sensed values outputted from the acceleration sensor in response to the tilting of the display 110.

The controller 130 may display at least two UI screens among the plurality of UI screens of the 3D UI on the respective sub-areas, depending on the arrangement state of the respective sub-areas. For example, the controller 130 may determine the UI planes of the hexagonal UI that match the respective sub-areas according to the arrangement state of the respective sub-areas, and display the UI screens constructing the determined UI planes on the respective sub-areas.

For example, referring to FIG. 27, the second sub-area 110-2 is arranged horizontally without tilting, while the first sub-area 110-1 is bent from the left side of the second sub-area 110-2 by 90° to the Z+ direction, in which case the controller 130 may determine that the first sub-area 110-1 matches the left-side plane of the hexagon (i.e., the sixth UI plane 460 in FIGS. 26A and 26B), and the second sub-area 110-2 matches the rear plane of the hexagon with reference to the front plane (i.e., the fourth UI plane 440 in FIGS. 26A and 26B). Accordingly, the controller 130 may display the UI screen 460, which is the album image UI screen for the music files executable on a music application, on the first sub-area 110-1, and display the UI screen 440, which is the playable image on a camera application, on the second sub-area 110-2.

Meanwhile, when the display 110 rotates in a state that the UI screen is displayed, the controller 130 may determine a UI plane that corresponds to the rotated sub-area among the UI planes, in accordance with the arrangement state of the respective, rotated sub-areas, and display the graphic information corresponding to the determined UI plane on the respective sub-areas. To that purpose, the sensor 120 may sense the direction and angle of rotation of the display 110 with a geomagnetism sensor or gyro sensor, and transmit the sensed result to the controller 130.

To be specific, when the display 110 rotates, the controller 130 may determine the arrangement of the respective, rotated sub-areas, and detect the UI plane that corresponds to the arrangement state of the respective sub-areas on the 3D UI. That is, the controller 130 may detect the UI plane that matches the arrangement state of the respective, rotated sub-areas.

For example, it is assumed that the respective sub-areas 110-1, 110-2 illustrated in FIG. 27 are rotated by 90° to the upright relation to each other as illustrated in FIG. 28. In this case, the controller 130 may determine that the first sub-area 110-1 is tilted vertically to a parallel relationship with the ground, while the second sub-area 110-2 is bent from the upper side of the first sub-area 110-1 to Z+ direction by 90°.

Accordingly, the controller 130 may determine that the rotated first sub-area 110-1 matches the bottom plane (i.e., the fifth UI plane 450 in FIGS. 26A and 26B) of the hexagon, while the second sub-area 110-2 matches the rear plane of the hexagon (i.e., the sixth UI plane 460 in FIGS. 26A and 26B). The controller 130 may display the UI screen 460 including album image of the music files executable on a music application on the first sub-area 110-1, and display the UI screen 450 including calendar executed on the application on the second sub-area 110-2.

In this case, based on the posture of the display 110 as determined through the acceleration sensor, the controller 130 may rotate the direction of displaying the UI screen. That is, when the display 110 is arranged in horizontal direction, the controller 130 may display the UI screen in the horizontal direction, while, when the display 110 is arranged in the vertical direction, the controller 130 may rotate the UI screen to the vertical direction and display the same.

Meanwhile, in addition to the exemplary embodiment explained above where the display 110 bends inward (i.e., bends in Z+ direction), and the UI screen matching the respective sub-areas are displayed, other exemplary embodiments are possible. That is, the display 110 may bend outward (i.e., bend in Z− direction), in which case the UI screen corresponding to the arrangement state of the respective sub-areas may be displayed. In this case, the controller 130 may display the image for displaying on the respective sub-areas formed by bending in Z+ direction, when the display 110 bends in Z− direction.

Figure 29A:
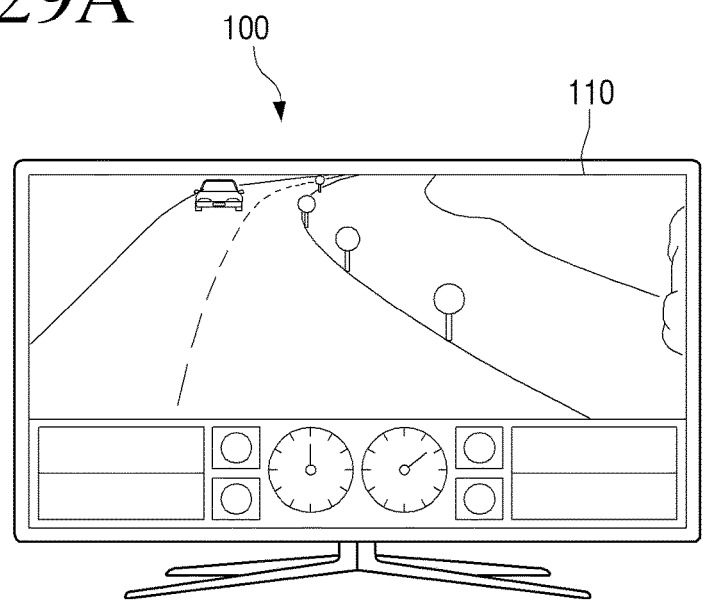
Figure 29B:
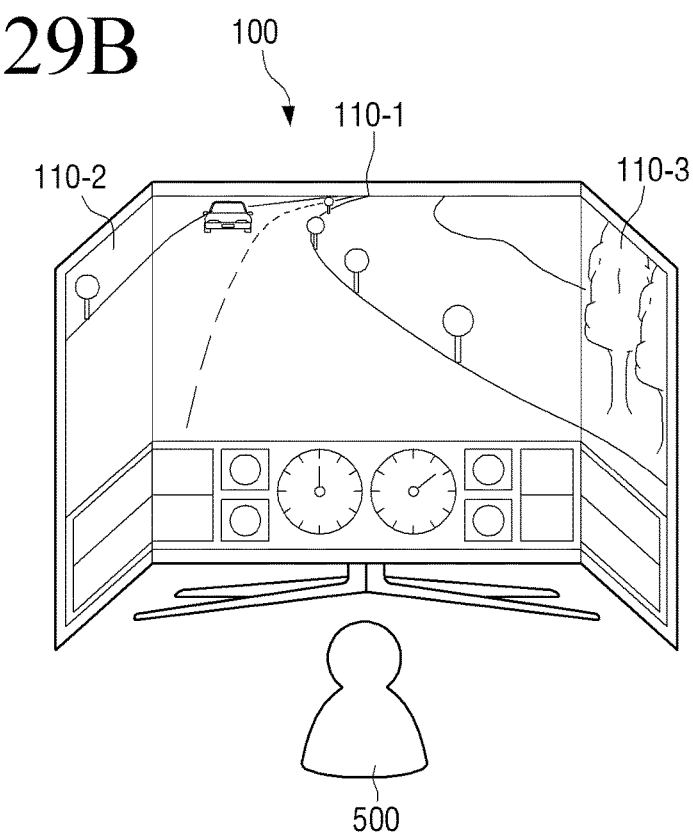

FIGS. 29A and 29B are views provided to explain a method for displaying a screen according to an arrangement state of the sub-areas, according to another exemplary embodiment. FIGS. 29A and 29B are provided particularly to explain a method for displaying a game screen on a plurality of sub-areas. After that, referring to FIG. 29B, when the display 110 bends twice, the display 110 may be divided into a plurality of sub-areas. That is, the display 110 may be divided into a first sub-area 110-1 arranged horizontally without tilting, a second sub-area 110-2 bent from left side with reference to the first sub-area 110-1 to Z+ direction, and a third sub-area 110-3 bent with reference to the first sub-area 110-1 from the right side to Z+ direction.

In this case, with reference to a spot 500 in the 3D space, the first sub-area 110-1 is in the front, the second sub-area 110-2 is on the left, and the third sub-area 110-3 is on the right. Accordingly, the game execute screen facing front is displayed on the first sub-area 110-1, the game execute screen facing left is displayed on the second sub-area 110-2, and the game execute screen facing right is displayed on the third sub-area 110-3.

Meanwhile, the controller 130 may control the display 110 to maintain bending once the display 110 is bent. To that purpose, the flexible display apparatus 100 may include a plurality of polymer films, and the controller 130 may control the display 110 to maintain bending by applying voltage to the polymer films.

Figure 30A:
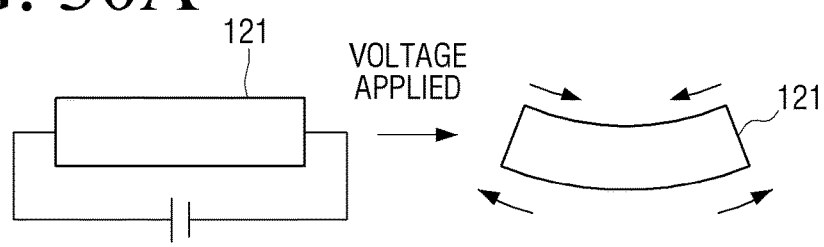
FIGS. 30A and 30B are views provided to explain a method of a flexible display apparatus for maintain bending, according to one or more exemplary embodiments.
Figure 30B:
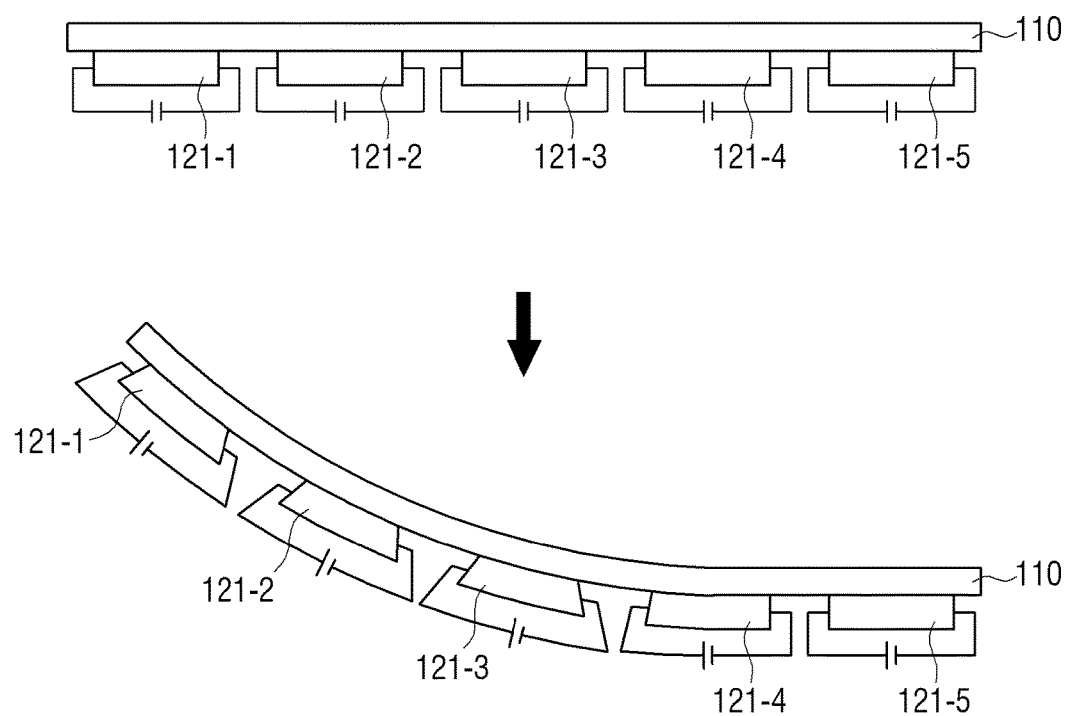
Figure 32:
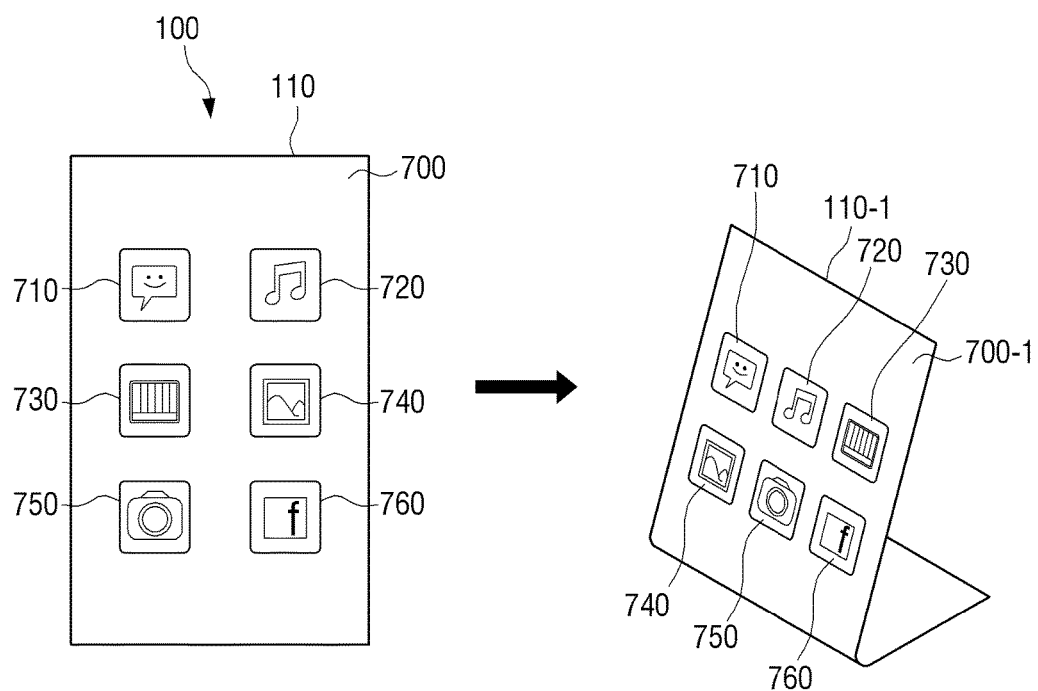
FIGS. 32 through 37 are views provided to explain a method of a flexible display apparatus for displaying a screen on sub-areas, according to one or more exemplary embodiments.
Figure 33:
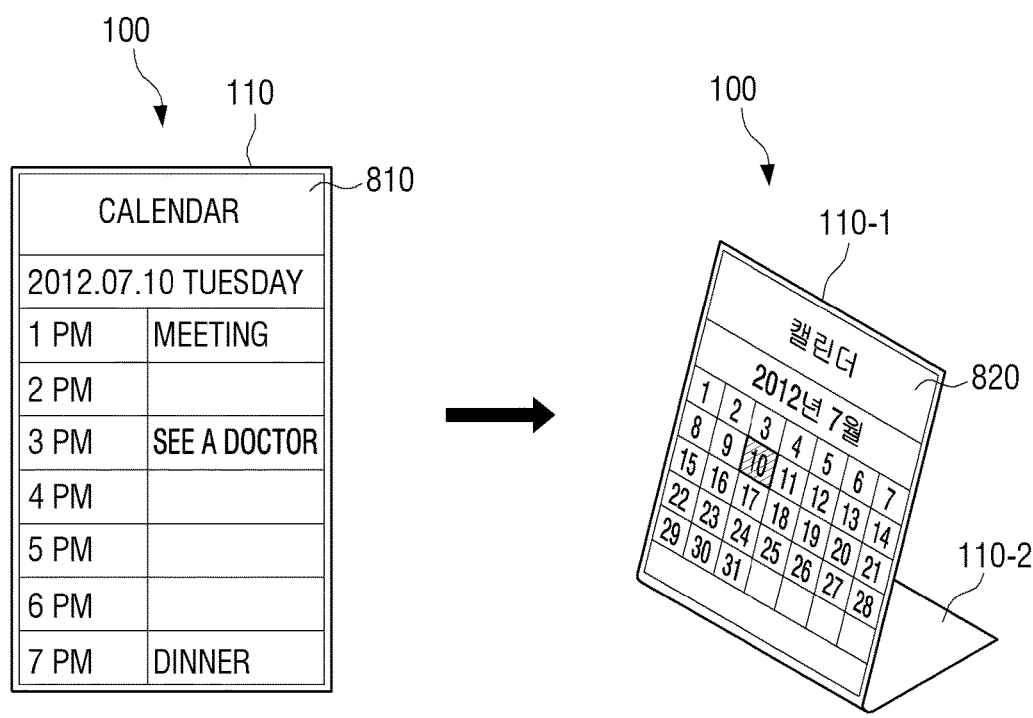

FIGS. 30A and 30B are views provided to explain a method of the flexible display apparatus for maintaining bending, according to an exemplary embodiment.

As explained above, the flexible display apparatus 100 may include a plurality of polymer films formed on one or both surfaces of the display 110.

The polymer film is a dielectric elastomer from silicone or urethane group, which has electrodes on one and the other sides, respectively, and deforms according to potential difference of the voltage applied to the respective electrodes.

For example, when a predetermined size voltage is applied to the polymer film 121 (FIG. 30A), the upper portion of the polymer film 121 contracts, while the lower portion extends. Accordingly, the controller 130 may control the display 110 to maintain bending, by applying voltage to the polymer film 121 and thus deforming the polymer film 121.

Meanwhile, the flexible display apparatus 100 may store in advance information ('control information') about which of the polymer films arranged in the display 110 is to be applied with voltage to bend the display 110 to a predetermined state, how much voltage is to be applied to the polymer films, or in which order the voltage is to be applied to the polymer films. Accordingly, using the pre-stored control information, the controller 130 may apply the voltage to the polymer film to maintain the bending of the display 110.

To be specific, when the display 110 bends, the controller 130 may determine bending state such as location of the bending area, and angle and direction of bending, based on the sensed result of the sensor 120. The controller 130 may then determine the location of the polymer film to be applied with the voltage to maintain the bending of the display 110, the size of the voltage to be applied, or the order of applying the voltage, by using the pre-stored control information, and control the display 110 to maintain bending by applying the voltage to the polymer film accordingly.

For example, it is assumed that the left side of the display 110 bends to Z+ direction by 45° (FIG. 30B). In this case, the controller 130 may control the display 110 to maintain the bending of the left side to Z+ direction by 45°, by applying a predetermined size of voltage to the polymer films 121-1 to 121-5 positioned in the bending area.

Meanwhile, although the exemplary embodiment explained above is depicted as having five polymer films, this is only for illustrative purpose and should not be construed as limiting. Accordingly, the number and size of the polymer films may be varied according to the size of the display 110.

Further, in addition to the exemplary embodiment explained above where the flexible display apparatus 100 includes polymer films to maintain the bending of the display 110, other exemplary embodiments are also possible. Accordingly, the flexible display apparatus 100 may include a string, a piezoelectric element (e.g., series bimorph piezoelectric element, parallel bimorph piezoelectric element), an electro active polymer (EAP), an electro mechanical polymer (EMP), or the like to maintain the bending of the display 110.

For example, when the flexible display apparatus 100 includes a string, the controller 130 may maintain the bending of the display 110 may varying the tensile force of the string. That is, when the display 110 deforms, the display 110 is subject to a counteractive force by its own elasticity to return to the flat state. In this case, the controller 130 may provide the physical force to counterbalance the counteractive force to the string to thus control the display 110 to maintain bending.

Further, the flexible display apparatus 100 may include a shape memory alloy (not illustrated). To be specific, the shape memory alloy refers to an alloy with a property to revert to the original shape before deformation, once the temperature reaches or exceeds the transition temperature. The 'transition temperature' as used herein refers to a unique temperature of a material of transition.

That is, the shape memory alloy may change its form by generating heat with the resistance within a metal, when an electric signal is provided thereto. That is, the shape memory alloy is so fabricated to memorize the bent shape so that it maintains flat state in usual state but deforms to the original, bent shape when the internal temperature reaches transition temperature by generating heat due to internal resistance in response to an electric signal provided thereto. The shape memory alloy may be implemented as nickel-titanium alloy, copper-zinc-aluminum alloy, or the like.

Meanwhile, the controller 130 may selectively provide an electric signal to the shape memory alloy (not illustrated). To be specific, the controller 130 may provide the shape memory alloy with an electric signal that corresponds to the angle of bending of the display 110. To that purpose, the shape memory alloy may be implemented as a plurality of shape memory alloys that memorize bent shapes of different angles. That is, the controller may control the display 110 to maintain bending at respective angles of bending, by providing electric signals to the shape memory alloys that memorize the bent shapes at respective angles of bending, among a plurality of shape memory alloys.

Meanwhile, in certain exemplary embodiments, the controller 130 may control the display 110 to maintain bending, in response to a separate user command inputted thereto to direct to maintain bending, or when the bending at or above a specific angle is maintained for more than a preset time.

Meanwhile, when the entire area of the display 110 is divided into a plurality of sub-areas, the controller 130 may selectively activate a plurality of sub-areas according to the arrangement state of the display 110 and display the screen on the activated divided areas.

To be specific, when the display 110 is so arranged that one of the plurality of sub-areas is in contact with a supporting surface, the controller 130 may inactivate the sub-area contacting the supporting surface, while activating the rest sub-areas. Further, when the display 110 is so arranged that the plurality of sub-areas are arranged in such a manner that all the plurality of sub-areas are not in contact with the supporting surface, all the plurality of sub-areas may be activated.

To that purpose, when the display 110 bends, the controller 130 may determine that the display 110 is divided into a plurality of sub-areas with reference to the bending line in vertical, horizontal or diagonal direction.

The controller 130 may determine the arrangement state of the display 110 based on whether or not the respective sub-areas contact the supporting surface, and activate or inactivate the sub-areas depending on the arrangement state of the display 110. The 'supporting surface' as used herein may include a table, a floor, or a bodily part of a user (e.g., palm of a hand). To that purpose, the sensor 120 may include proximity sensors, and acceleration sensors arranged on upper, lower, left, right edges, respectively. This will be explained in greater detail below with reference to FIG. 31.

FIG. 31 is a view provided to explain a method of a flexible display apparatus for determining whether or not the display contacts the supporting surface, according to an exemplary embodiment.

The controller 130 may determine whether or not the sub-areas are adjoined with the supporting surface, based on the sensed values of the acceleration sensors and the proximity sensors arranged at respective sub-areas.

To be specific, when the sub-areas are in proximity or contact to the supporting surface and the display surface of the sub-areas are bent to face the supporting surface (i.e., the direction of gravity) of the display surface, the controller 130 may determine that the corresponding sub-areas are in contact with the supporting surface. In this case, the controller 130 may inactivate the sub-areas adjoining the supporting surface, while activating the sub-areas not adjoining the supporting surface to thus display a screen on the activated sub-areas.

Meanwhile, when determining that the plurality of sub-areas are formed by bending of the display 110, but that there is no sub-area adjoining the supporting surface, the controller 130 may activate all the sub-areas to display a screen on the respective sub-areas.

For example, referring to FIG. 31A, it is assumed that the display 110 is divided into the first and second sub-areas 110-1, 110-2 by the bending of the display 110. In this case, the second sub-area 110-2 is placed to adjoin a table surface 600 so as to be in proximity to, or in contact with the table surface 600, and the display surface of the second sub-area 110-2 is bent toward the supporting surface. In this case, the controller 130 determines the bending of the display 110 based on the adjoining of the second sub-area 110-2 to the supporting surface, and thus activates the first sub-area 110-1 and inactivates the second sub-area 110-2.

Meanwhile, referring to FIG. 31B, it is assumed that the display 110 is divided into a first sub-area 110-3 and a second sub-area 110-4 by the bending. In this case, none of the first and second sub-areas 110-3, 110-4 adjoins the table surface 600, nor they are bent toward the direction of the supporting surface. Accordingly, the controller 130 determines that there is no sub-area adjoining the supporting surface, and therefore, activates all the first and second sub-areas 110-3, 110-4.

Meanwhile, FIGS. 31A and 31B illustrate the display 110 in bent state on the table surface. To that purpose, the controller 130 may control the display 110 to maintain the bending. This will not be redundantly explained below, but reference to the above explanation with reference to FIG. 30.

Further, in addition to the exemplary embodiment explained above in which the proximity sensors and the acceleration sensors are arranged on the upper, lower, left and right sides of the display 110 to determine arrangement state of the display 110, other exemplary embodiments are also possible.

Accordingly, it is possible to determine contact or non-contact with the supporting surface based on the pressure exerted on the supporting surface through pressure sensor or the like, instead of the proximity sensor. Further, touch sensor may be implemented to determine contact with part of the body of the user.

Further, it is also possible to determine whether the sub-areas are adjoined with the supporting surface, using a light receiving sensor. That is, the sub-areas adjoined with the supporting surface do not receive light due to blockage of the supporting surface. Accordingly, after the display 110 is bent and divided into a plurality of sub-areas, it may be determined that certain sub-areas are adjoined with the supporting surface, when there are certain sub-areas that do not receive the light.

Furthermore, it is possible to determine whether or not the sub-areas are adjoined with the supporting surface, by using a camera. Because the sub-areas adjoined with the supporting surface are hidden due to the presence of the supporting surface, a photographed image of the corresponding sub-areas will be in black. Accordingly, it is possible to determine that the sub-area with black photographed image is the one that is adjoined with the supporting surface.

Further, the acceleration sensor may be provided on only one of the left and right edges of the display 110, and only one of the upper and lower edges of the display 110. In this case, based on the sensed value of the acceleration sensor, the controller 130 may determine a direction of the sub-areas where the acceleration sensor is arranged, and determine the direction of the rest sub-areas using the determined direction of the sub-area and the angle of bending of the display 110.

For example, it is assumed that the acceleration sensor is provided in the first sub-area 110-1, while there is no acceleration sensor provided in the second sub-area 110-2 (see FIG. 31A). In this case, the controller 130 determines the angle between the first sub-area 110-1 and the direction of gravity, based on the sensed value of the acceleration sensor. The controller 130 may calculate an angle between the second sub-area 110-2 and the direction of gravity, based on the determined angle of the first sub-area 110-1 and the angle of bending of the display 110 (i.e., angle between the first and second sub-areas 110-1, 110-2). Accordingly, the controller 130 may determine whether or not the sub-area without the acceleration sensor faces the direction of supporting surface.

Meanwhile, in addition to the exemplary embodiment explained above in which the display 110 is bent one time in horizontal direction, other exemplary embodiments are possible. That is, the controller 130 may determine the arrangement state of the display 110 with the same method as the one implemented when the display 110 is bent two or more times in horizontal direction, one or more times in a vertical direction, or in a horizontal and a vertical direction, and selectively activate the sub-areas depending on the result of determination.

Meanwhile, the controller 130 may selectively activate the sub-areas depending on the arrangement state of the display 110 and display a screen on the activated sub-areas. The screen may include content playing screen such as image video, music, or text, various webpage screen, or UI screen.

In this case, the controller 130 may turn off display elements that correspond to the inactivated sub-areas, among the display elements distributed across the entire area of the display 110. By doing so, the controller 130 may prevent exposure of the inactivated sub-areas, which are the areas of the display 110 adjoined with the supporting surface, to the user and therefore, may turn off the display elements distributed in such inactivated sub-areas to save unnecessary power consumption.

For example, it is assumed that the display panel 113 is implemented as an organic light emitting diode. The OLED includes light emitting elements per pixel, which are turned on/off in pixel unit. Accordingly, the controller 130 may turn off the OLED by blocking power supply to the OLED arranged in the inactivated sub-areas. Alternatively, the display panel 113 may be implemented as an LCD, in which case a separate backlight is necessary. Accordingly, the controller 130 may cut off power supply to the backlight arranged on the inactivated sub-areas. To that purpose, the backlight may be grid form or the like, to enable provision of backlight to the LCD on the basis of areas.

In one exemplary embodiment, the controller 130 may control so that a black image or no image is displayed on the inactivated sub-areas. For example, it is possible to reduce power consumption by displaying black image as in the case of OLED, in which case the black image may be displayed on the OLED arranged in the inactivated sub-areas.

Further, the controller 130 may display a screen on the activated sub-areas, which will be explained in detail below with reference to FIGS. 32 to 37.

FIGS. 32 to 37 are views provided to explain a method of a flexible display apparatus for displaying a screen on the sub-areas, according to an exemplary embodiment. FIGS. 32 to 37 particularly illustrate the display 110 placed on a supporting surface, with a predetermined angle of bending.

First, the controller 130 may change a layout of the screen to match the size of the activated sub-areas. To be specific, in a flat state, the controller 130 may change at least one of the size of the objects included in the displayed screen, and location of arrangement, and display a screen on the sub-areas. The 'object' as used herein may include an icon, a widget, or an image.

For example, it is assumed that a home screen 700, including icons 710 to 760 of the applications installed on the flexible display apparatus 100, is displayed on the display 110. After that, as the display 110 is divided into the first and second sub-areas 110-1, 110-2 upon bending, and the second sub-area 110-2 is adjoined with the supporting surface, the controller 130 may display the home screen 700-1 with changed location of icon arrangement on the first sub-area 110-1.

Meanwhile, the controller 130 may vary the layout of the screen depending on an application in driving. That is, referring to FIG. 33, it is assumed that a daily calendar 810 is displayed on the display 110 in accordance with the driving of the calendar application, and that the display 110 is bent and the second sub-area 110-2 is adjoined with the supporting surface. In this case, the controller 130 may display a monthly calendar 820 on the first sub-area 110-1 in accordance with the changed screen layout.

Further, the controller 130 may vary the size of the screen to suit the size of the activated sub-area. That is, the controller 130 may scale the size of the screen displayed on the display 110 to suit the size of the activated sub-area and display a screen on the sub-area.

Figure 34:
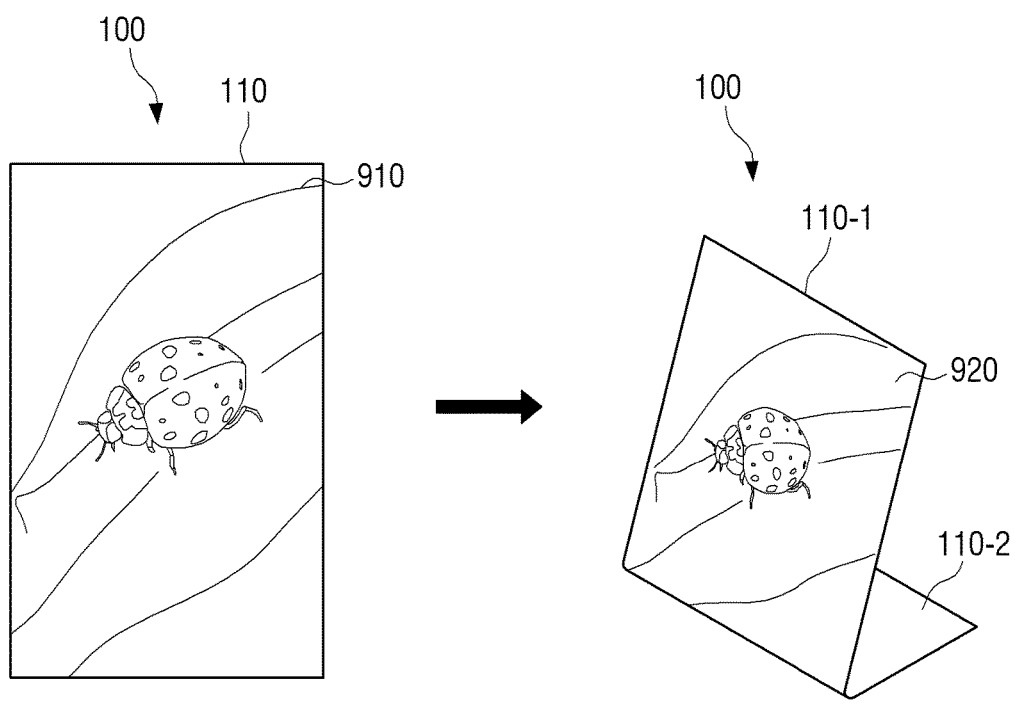

For example, referring to FIG. 34, it is assumed that an image 910 is displayed on the display 110. After that, as the display 110 is bent and divided into the first and second sub-areas 110-1, 110-2, and the second sub-area 110-2 is adjoined with the supporting surface, the controller 130 may reduce the size of the displayed image 910 and display the result on the first sub-area 110-1.

Meanwhile, in addition to the exemplary embodiment explained above in which the size of the screen is varied to suit the size of the activated sub-area, other exemplary embodiments are also possible. Accordingly, the controller 130 may display a screen with a preset ratio on the activated sub-area.

For example, it is assumed that the size of the activated sub-area (e.g., resolution) is 1920*1200. To display 4:3 screen on the activated sub-area, the controller 130 may calculate a size of the displayed screen based on the size of the activated sub-area. That is, because the horizontal resolution is 1200 and the vertical resolution is 1200*4/3, which gives 1600, the controller 130 may adjust the size of the screen to 1600*1200 and display the result on the activated sub-area.

Meanwhile, the controller 130 may adjust the direction of displaying the screen on the activated sub-screen, depending on the direction of arrangement of the sub-areas.

That is, when the display 110 is bent and then rotated so that one of the sub-areas is adjoined with the supporting surface, the controller 130 may rotate the screen to correspond to the direction where the activated sub-area is arranged and display the result. To be specific, based on the sensed value of the acceleration sensor arranged on the activated sub-area, the controller 130 may determine the posture of the activated sub-area in relation to the direction of gravity, and rotate the screen to the direction of gravity, and display the result on the activated sub-area.

Figure 35:
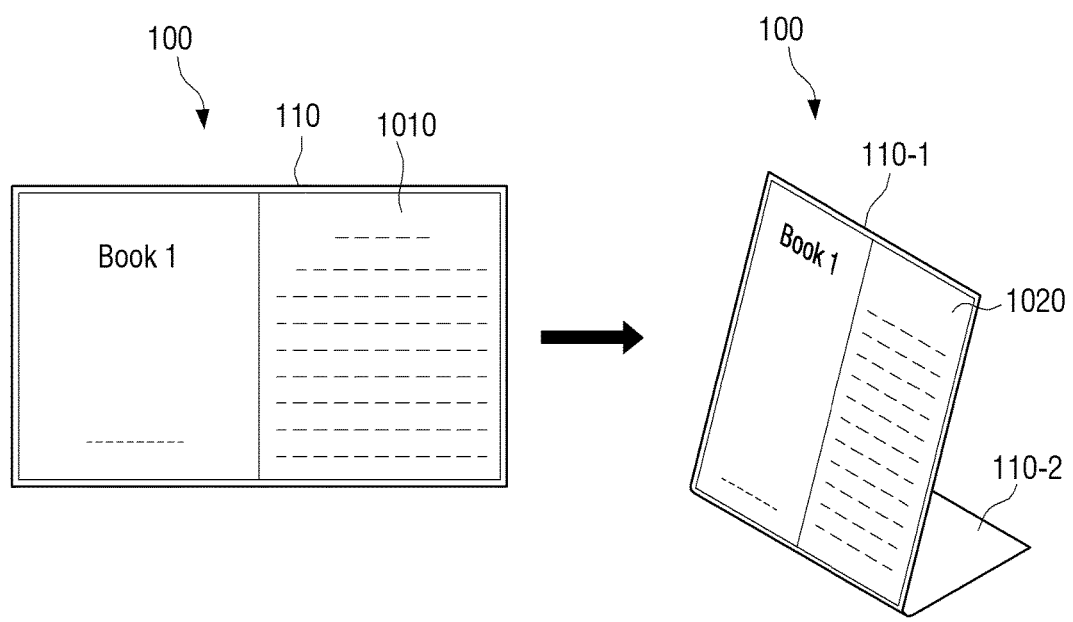

For example, referring to FIG. 35, it is assumed that the e-book application is driven, so that an e-book screen 1010 is displayed on the display 110, and that the right side of the display 110 is then bent to Z− direction by 90° and rotated by 90°, with the second sub-area 110-1 among the sub-areas being adjoined with the supporting surface. In this case, the controller 130 may adjust the size of the e-book screen 1010, displayed before the rotation, to suit the size of the first sub-area 110-2 and rotate by 90° so that the rotated e-book screen 1020 is displayed on the first sub-area 110-1.

Meanwhile, the controller 130 ma determine a screen to be displayed on the respective sub-areas according to the size of the activated sub-areas, respectively, when the display 110 is so arranged that none of the plurality of sub-areas is adjoined with the supporting surface.

To be specific, the controller 130 may display the same screen on the respective sub-areas, when a difference of areas of the respective, activated sub-areas is within a preset error range. Further, when the difference of areas of the respective, activated sub-areas exceeds the preset error range, the controller 130 may display different screens on the sub-areas, respectively. The 'preset error range' as used herein may be set at the factory, or set and modified by the user.

In certain exemplary embodiment, the controller 130 may differently adjust the direction of displaying a screen on the respective, activated sub-areas, depending on the direction of arranging the respective, activated sub-areas. That is, based on the sensed value of the acceleration sensor arranged on each of the activated sub-areas, the controller 130 may determine the direction of arranging the activated sub-areas in relation with the direction of gravity. The controller 130 may rotate the screen to the direction of gravity and display the screen on the respective, activated sub-areas.

Figure 36:
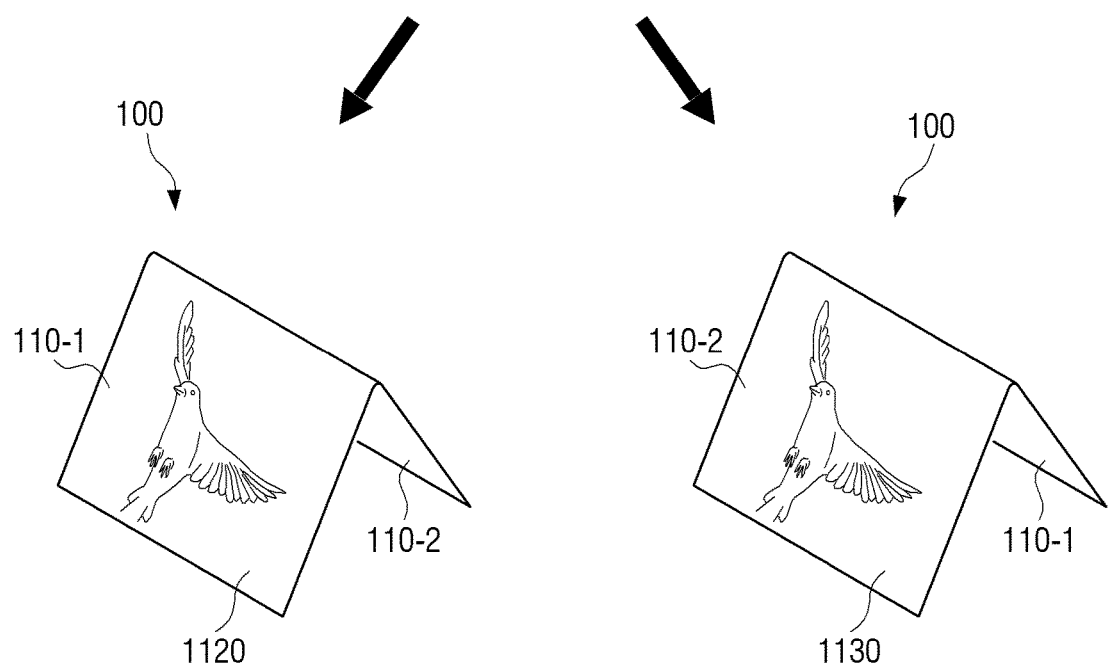
Figure 37:
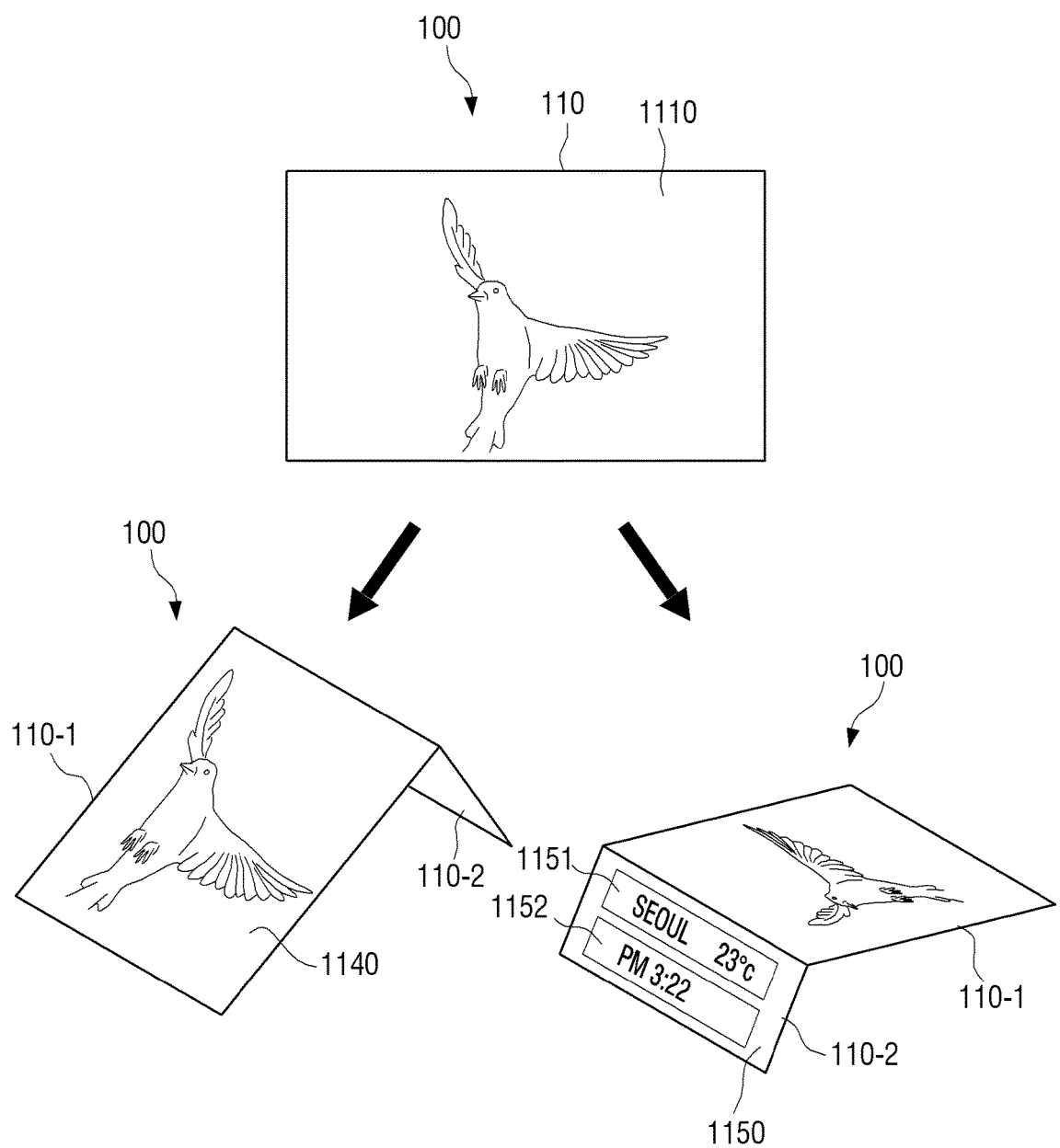

For example, referring to FIGS. 36 and 37, it is assumed that the display 110 displaying an image 1110 is bent, and none of the first and second sub-areas 110-1, 110-2 are adjoined with the supporting surface.

In this case, referring to FIG. 36, when a difference of areas of the first and second sub-areas 110-1, 110-2 is within a preset error range, the controller 130 may display the same images 1120, 1130 as the image 1110 displayed before bending on the respective sub-areas. In this case, the sizes of the images 1020, 1030 may be reduced in accordance with the sizes of the respective sub-areas 110-1, 110-2, and the images 1020, 1030 may be rotated to suit the direction of arranging the respective sub-areas 110-1, 110-2 and displayed.

Meanwhile, referring to FIG. 37, when the difference of areas of the first and second sub-areas 110-1, 110-2 exceeds a preset error range, the controller 130 may display the same image 1140 as the pre-bending image 1010 on the first sub-area 110-1, while displaying a widget screen 1150 including a weather-related widget 1151 and a time-related widget 1152 on the second sub-area 110-2. Again, the screen may be displayed to suit the size and direction of arranging the respective sub-areas. Further, the same screen as the pre-bending screen may be displayed on the larger sub-area among the sub-areas.

Meanwhile, in addition to the exemplary embodiment explained above in which the display 110 includes one display surface, i.e., in which a single-sided display is provided, other exemplary embodiments are also possible. Accordingly, the display 110 may be implemented as a dual-sided display which may include a first display surface and a second display surface facing the first display surface.

In this case, when certain area of the first surface of the two surfaces of the display 110 is arranged to be adjoined with the supporting surface, the activated area may be determined among the rest areas of the two surfaces that are not adjoined with the supporting surface and the screen may be displayed accordingly on the activated area.

To be specific, when a user command is inputted, directing to select at least one of: the entire area of the second surface of the two surfaces of the controller 130; area facing the area adjoined with the supporting surface among the entire area of the second surface; and the rest area of the first surface, the controller 130 may determine activated area according to the user command. The user command may be a user manipulation which is touching on the display 110.

To that purpose, the sensor 120 may include proximity sensors on upper, lower, left and right sides of the first surface of the display 110, and on upper and lower or left and right edges of the second surface, and the controller 130 may determine one of the first and second surfaces of the display 110 as the surface of the sub-area adjoined with the supporting surface, based on the sensed result of the sensor 120.

The controller 130 may determine an activated area based on a surface to which user's touch manipulations are inputted and accordingly display a screen on the determined activated area, when the user's touch manipulation is inputted regarding at least one of: the other surface of the sub-area that is not adjoined with the supporting surface; and one and the other surface of the rest sub-areas.

In additional to the above exemplary embodiment in which the display 110 is divided into two sub-areas by one bending, other exemplary embodiments are also possible. That is, the display 110 may be divided in to at least three sub-areas by at least two bendings, in which case the sub-areas adjoined with the supporting surface may be inactivated, while the rest sub-areas that are not adjoined with the supporting surface are activated.

For example, in a state that the screen is displayed on the entire area of the display 110, when the display 110 is twice bent and the entire area of the display 110 is divided into three sub-areas, and when one of the three sub-areas is adjoined with the supporting surface, the controller 130 may inactivate the sub-area adjoined with the supporting surface and change the screen layout so that the screen is displayed on the rest sub-areas of the three sub-areas.

For example, in a state that the display 110 displays a home screen including nine icons therein, upon twice bending of the display 110 and adjoining of one of the three sub-areas divided by the two bending of the display 110 with the supporting surface, the sub-area adjoined with the supporting surface is inactivated, and at least one of the nine icons may be moved and displayed on the two sub-areas. In this case, the number of icons for displaying in the respective sub-areas may be determined to be in proportion with the size of the sub-areas.

Figure 38:
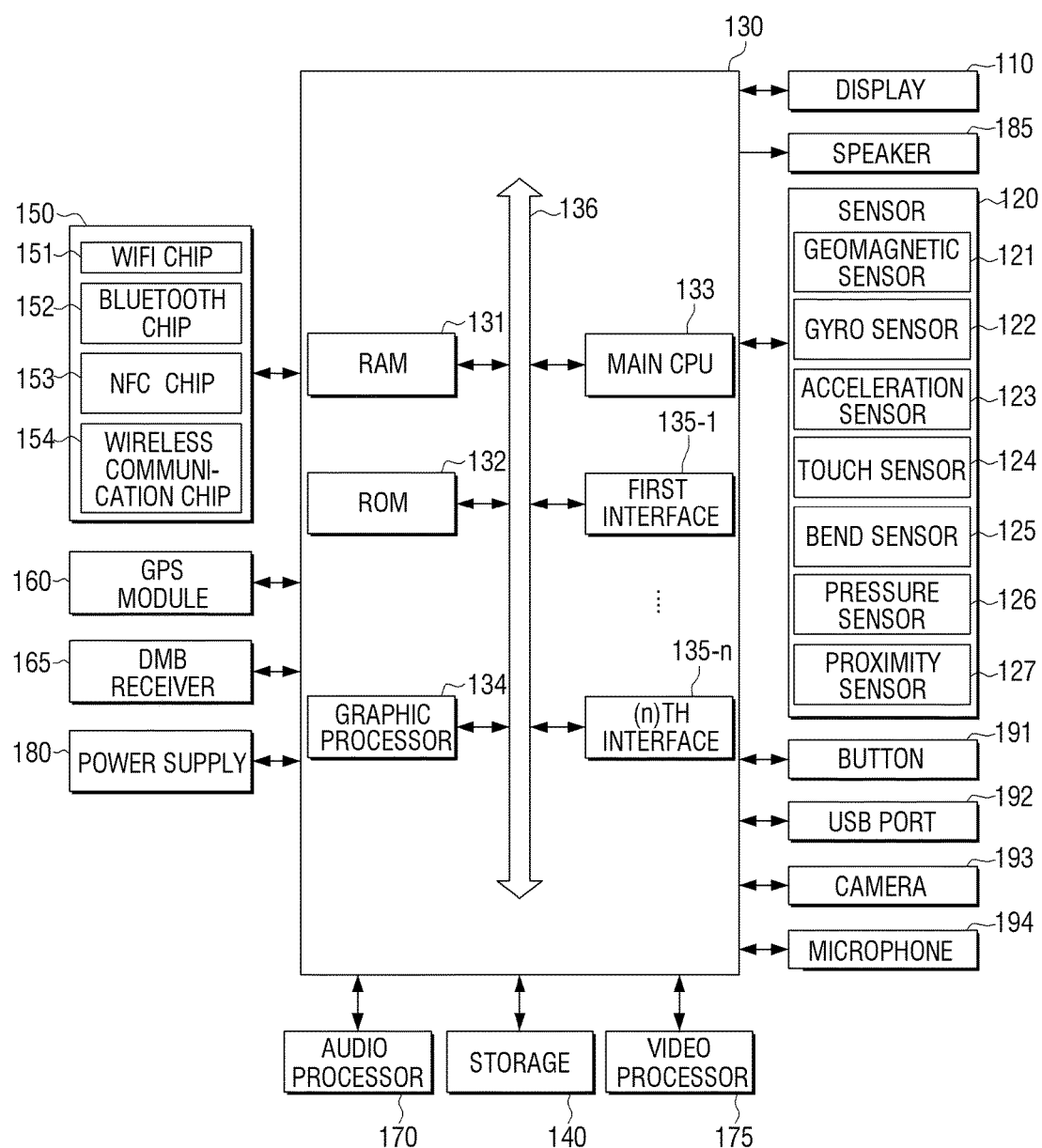
FIG. 38 is a detailed block diagram of a flexible display apparatus according to an exemplary embodiment.

FIG. 38 is a view provided to explain detailed constitution of a flexible display apparatus according to an exemplary embodiment. Referring to FIG. 38, the flexible display apparatus 100 may include those illustrated in FIG. 1 and additionally include a communicator 150, a GPS module 160, a DMB receiver 165, an audio processor 170, a video processor 175, a power supply 180, a speaker 185, a button 191, a USB port 192, a camera 193 and a microphone 194.

The sensor 120 may include a geomagnetism sensor 121, a gyro sensor 122, an acceleration sensor 123, a touch sensor 124, a bend sensor 124, a pressure sensor 126, and a proximity sensor 127. The sensor 120 may sense not only the bending gesture, but also various manipulations inputted to the flexible display apparatus 100 such as touch, rotating, tilting, pressure, approaching, or the like.

The geomagnetism sensor 121 is provided to sense the rotational state of the flexible display apparatus 100 and direction of movement. The gyro sensor 122 is provided to sense the rotational angle of the flexible display apparatus 100. Both the geomagnetism sensor 121 and gyro sensor 122 may be provided, or only one may be provided, in which case the rotational state of the flexible display apparatus is still sensed.

The acceleration sensor 123 is provided to sense the degree of tilting of the flexible display apparatus 100. The acceleration sensor 123 may also be used to sense bending characteristic such as direction of bending of the flexible display apparatus 100.

The touch sensor 124 may be resistive or capacitive. The capacitive touch sensor uses dielectric coating on the surface of the display 110 to sense fine electricity excited to the user's body upon touching of the user's body on the surface of the display 110, and to calculate touch coordinates. The resistive touch sensor includes two electrode plates placed on each other so that the plates above and below the spot touched by the user come into contact to thus sense electric flow, thereby calculating touch coordinates. Various other touch sensors 124 may also be implemented.

The bend sensors 125 may be implemented in various forms and numbers, to sense bending characteristic of the flexible display apparatus 100. The construction and operation of the bend sensor 125 will not be redundantly explained below, but referenced to various exemplary examples provided above with reference to FIGS. 3A through 6C.

The pressure sensor 126 senses the size of pressure exerted on the flexible display apparatus 100 when the user inputs touch or bending manipulation, and provides the result to the controller 120. The pressure sensor 126 may include a piezo film embedded in the display 110 to output electric signal corresponding to the size of pressure. Meanwhile, in addition to the exemplary embodiment of FIG. 38 in which the touch sensor 124 and the pressure sensor 126 are provided separately from each other, other exemplary embodiments are possible. Accordingly, when the touch sensor 124 is implemented as a resistive touch sensor, the resistive touch sensor may play a role of the pressure sensor 126.

The proximity sensor 127 is provided to sense an approaching motion which does not directly contact the display surface. The proximity sensor 127 be implemented as various forms of sensors including, for example, high frequency resonating type which forms high frequency magnetic field and sense electric current as induced by the magnetic field changing in response to the approaching of an object, a magnetic type which utilizes magnet, or a capacitive type which senses changing capacitance in response to approaching of an object. The proximity sensor 127 may particularly be arranged on upper and lower or left and right edges of the display 110 to sense whether or not the display 110 is adjoined with the supporting surface.

The controller 130 analyzes various sense signals form the sensor 120 to analyze user's intention and accordingly performs an operation in compliance with the intention. That is, as explained above, based on the sensed result at the sensor 120, the controller 130 may determine whether or not the display 110 is bent, and arrangement state of the display 110, and accordingly perform a suitable operation.

Additionally, the controller 130 may perform a control operation according to various input manners including, for example, touching, motioning, voice input or button input. The touching may include a simple touch, a tap, a touch-and-hold, a move, a flick, a drag-and-drop, a pinch in, a pinch out, or various other manipulations.

For example, the controller 130 may execute an application stored in the storage 140 to construct an execute screen and display the same, and play various content stored in the storage 140. The 'content' as used herein may refer to various multimedia content such as image, text, music, or video.

Meanwhile, the storage 140 may store various data. For example, the storage 140 may store graphic information corresponding to map screen, road view data, multi-viewpoint image, or respective UI planes of a 3D UI.

Further, the controller 130 may control the communicator 150 to communicate with external devices. The communicator 150 is configured to perform communication with various types of external devices via network. The communicator 150 may include a Wi-Fi chip 151, a Bluetooth chip 152, an NFC chip 153, and a wireless communication chip 154, with which the communicator 150 may receive contents from various types of external devices and transmit the contents to these external devices. Further, the controller 130 may control an external communicator 150 to receive various data from the external server such as, for example, map screen, road view data, multi-viewpoint image, graphic information on UI screen, and many others.

The Wi-Fi chip 151, the Bluetooth chip 152, and the NFC chip 153 communicate in WiFi, Bluetooth and NFC communication manners. The NFC chip 153 refers to a chip operating in near field communication (NFC) manner, using, among various RF-ID frequency bands such as 135 kHz, 13.56 MHz, 433 MHz, 860~960 MHz, 2.45 GHz, the 13.56 MHz band. The Wi-Fi chip 151 or the Bluetooth chip 152 may require prior transmission and reception of connection-related information such as SSID or session key before communication is connected to exchange various information. The wireless communication chip 154 performs communication according to various communication specifications such as IEEE, Zigbee, 3rd Generation (3G), 3rd Generation Partnership Project (3GPP), or Long Term Evolution (LTE). The wireless communication chip 154 particularly enables accessing and communicating with a web server, via mobile communication network.

The GPS module 160 receives from a Global Positioning System (GPS) satellite a GPS signal and calculates current position of the flexible display apparatus 100. That is, the GPS module 160 may receive from the satellite a GPS signal and generate position information including latitude, altitude and longitude of the current position of the flexible display apparatus 100. To be specific, the GPS module 160 may receive signals received from a plurality of GPS satellites, to calculate a distance between the satellites and the receiver using a time difference between the time of transmission and time of reception. The GPS module 160 then calculates the current position of the flexible display apparatus 100 in comprehensive consideration of the distances calculated among the plurality of satellites, and locations of the satellites, by a calculation method such as trilateration.

The DMB receiver 165 is configured to receive and process a Digital Multimedia Broadcasting (DMB) signal.

The power supply 180 is configured to supply power to the respective components of the flexible display apparatus 100. The power supply 180 may include cathode collector, cathode, electrolyte, anode, and anode collector and cladding. The power supply 180 may be a secondary battery which is rechargeable and dischargeable. Considering the bendability of the flexible display apparatus 100, the power supply 180 may be implemented to be flexible to be bent along with the flexible display apparatus 100. In this case, the collector, electrode, electrolyte or cladding may be formed from a flexible material.

The audio processor 170 is configured to process audio data. The audio processor 170 may perform various processing such as decoding or amplification, or noise filtering of the audio data.

The video processor 175 is configured to process video data. The video processor 175 may perform various image processing such as decoding, scaling, noise filtering, frame rate converting, or resolution converting of the video data. The video processor 175 may particularly scale a screen or change a resolution to suit the activated sub-area.

The display 110 may display various screens or objects under control of the controller 130. For example, the controller 130 may process various images, texts or videos stored in the storage 140 through the audio processor 170 and the video processor 175 into a form processable at the display 110, so that the processed signal is displayed on the display 110.

Further, the controller 130 may display a GUI on the display 110 to receive various user commands. For example, the controller 130 may cause a GUI to be displayed to receive user command related to various functions supported by the flexible display apparatus 100, such as a user command to playback contents, display a map screen, display road view data, or display multi-viewpoint image.

For example, in response to a user command to display map screen, the controller 130 may control the display 110 to display a map screen received from an external server (not illustrated). In this case, the controller 130 may display a map screen within a preset distance from the current position of the flexible display apparatus as calculated at the GPS module 160. In response to a user command to display road view data, the controller 130 may display the road view data photographed with reference to a specific position on the map screen, and display the data corresponding to the respective sub-areas according to the bending state of the display 110.

The speaker 185 is configured to output not only the audio data processed at the audio processor 170, but also various alarm sound or voice messages.

The button 191 may include various types of buttons such as mechanical button, touch pad, or wheel formed on a random area of the front, side or rear side of the main body of the flexible display apparatus 100. Various user manipulations may be inputted through the button 191 concerning power on/off or other operations of the flexible display apparatus 100.

The USB port 192 is where the USB memory or USB connector can connect, through which various contents are received from external devices or transmitted thereto.

The camera 193 is configured to photograph still images or video according to user control, and may be arranged on the front and rear surfaces of the flexible display apparatus 100.

The microphone 194 is configured to convert user voice or other sound inputted thereto into audio data. The controller 130 may use user voice inputted through the microphone 194 for a call, or convert into audio data and store in the storage 140.

When the camera 193 and the microphone 194 are provided, the controller 130 may perform control operation according to the user voice as inputted through the microphone 194 or the user motion as perceived through the camera 193. That is, the flexible display apparatus 100 may operate in motion control mode or voice control mode.

For example, in motion control mode the controller 130 may activate the camera 193 to photograph a user, and traces changes in user's motion to thus perform control operation such as power on or off. Further, in voice control mode, the controller 130 may operate in voice recognition mode, by analyzing the user voice inputted through the microphone and performing control operation according to the analyzed user voice.

Various input ports may also be provided to connect to various external terminals such as headset, mouse or LAN.

The operation of the controller 130 as explained above may be implemented on a program stored in the storage 140. The storage 140 may store various data such as operating system (O/S) software to drive the flexible display apparatus 100, various applications, data inputted or set during the implementation of the applications, or contents.

The controller 130 controls the overall operation of the flexible display apparatus 100 using various programs stored in the storage 140.

The controller 130 may include a RAM 131, a ROM 132, a main CPU 133, a graphic process 134, a first to (n)th interfaces 135-1~135-n, and bus 136.

The RAM 131, the ROM 132, the main CPU 133, the first to (n)th interfaces 135-1~135-n may be connected to each other via the bus 136.

The first to (n)th interfaces 135-1 to 135-n may be connected to various components explained above. One of the interfaces may be a network interface which is connected to an external device via network.

The main CPU 133 accesses the storage 140 and performs booting using the O/S stored in the storage 140. The main CPU 133 performs various operations using various programs, contents or data stored in the storage 140.

The ROM 132 stores command language set for system booting. When power is supplied in accordance with turn-on command, the main CPU 133 copies the O/S stored in the storage 140 onto the RAM 131 and executes the O/S to boot the system, in accordance with the command languages stored in the ROM 132.

The graphic processor 134 constructs various screens according to control of the main CPU 133. To be specific, the graphic processor 134 calculates display state value of the screen, and performs rendering based on the calculated display state value, to thus generate a screen. The 'display state value' as used herein may include attribute values such as coordinates of a location at which the object is to be displayed, form, size, or color of the object.

Meanwhile, in addition to the constitution of the flexible display apparatus 100 as illustrated in FIG. 38, various other constitutions are possible. Depending on exemplary embodiments, some of the components of FIG. 38 may be omitted, modified or added with new components.

Meanwhile, as explained above, the controller 130 may perform various operations by executing the programs stored in the storage 140.

Figure 39:
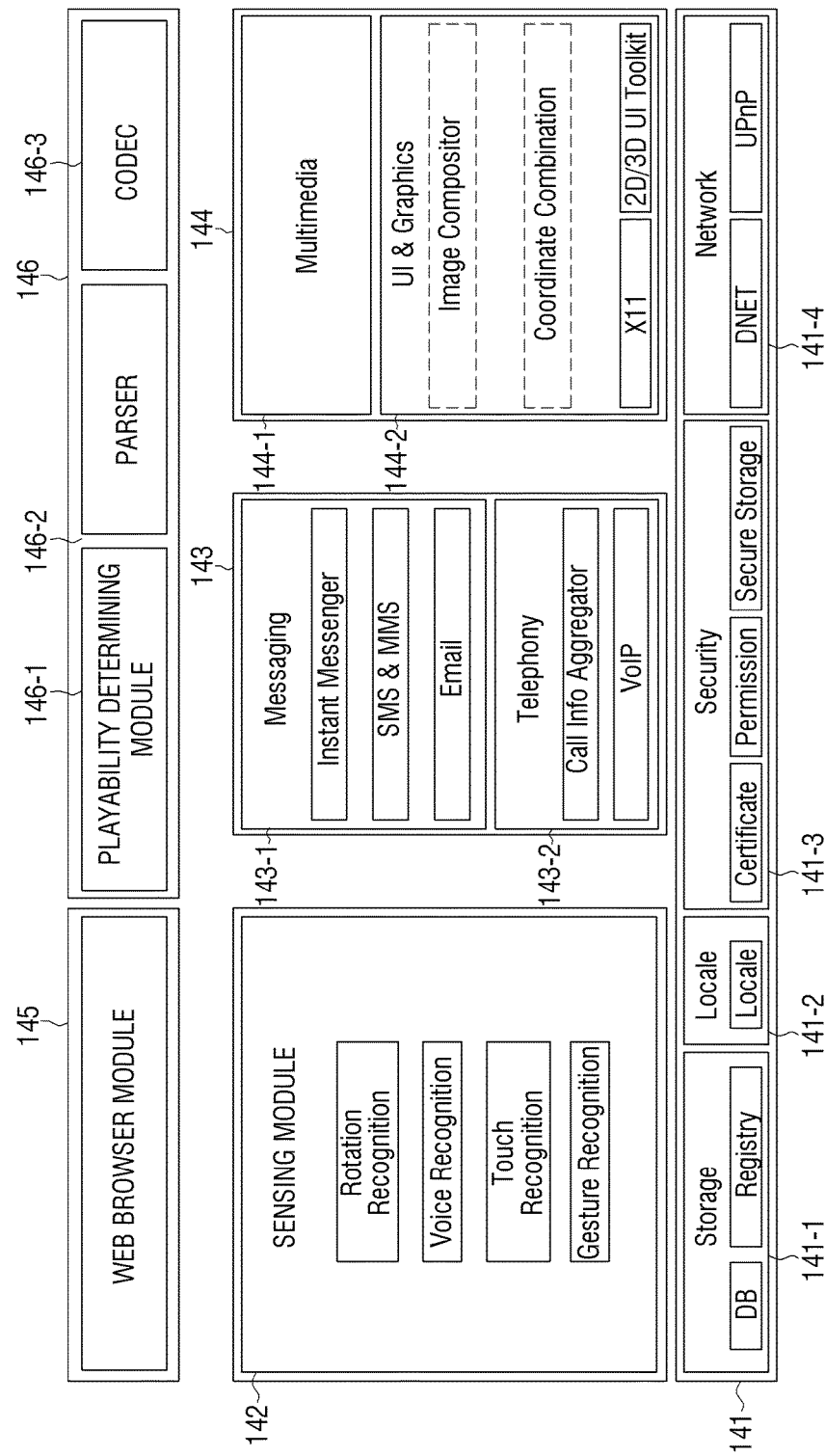
FIG. 39 is a view provided to explain software hierarchy stored in a storage, according to an exemplary embodiment.

FIG. 39 is a view provided to explain software hierarchy stored in the storage, according to an exemplary embodiment. Referring to FIG. 39, the storage 140 may include a base module 141, a sensing module 142, a communication module 143, a presentation module 144, a web browser module 145, and a content processing module 146.

The base module 141 refers to a base of the modules which processes the signal transmitted from the respective hardware of the flexible display apparatus 100 and transmits the result to the upper-layer modules.

The base module 141 includes a storage module 141-1, a location-based module 141-2, a security module 141-3, and a network module 141-4.

The storage module 141-1 is a program module to manage database (DB) or registry. The main CPU 133 accesses the database inside the storage 140 using the storage module 141-1, and reads out various data. The location-based module 141-2 is the program module that supports location-based service in association with various hardware such as GPS chip, or the like. The security module 141-3 is a program module that supports hardware certification, request permission, or secure storage, and the network module 141-4 is a module to support network connection and includes INET module and UPnP module.

The sensing module 142 manages and uses information about external input and external device. The sensing module 142 includes rotation recognition module, voice recognition module, touch recognition module, and gesture recognition module. The rotation recognition module is a program to calculate angle and direction of rotation, using the sensed values from the sensors such as geomagnetism sensor 121, or gyro sensor 122. The voice recognition module is a program to analyze the voice signals collected at the microphone 194 and extract user voice, the touch recognition module is a program to detect touch coordinates using the sensed values from the touch sensor 124, and the gesture recognition module is a program to recognize the user gesture by analyzing the image photographed at the camera 194.

The communication module 143 performs external communication. The communication module 143 may include a messaging module 143-1 such as a messenger program, a short message service (SMS) & multimedia message service (MMS), or email program, and a call module 143-2 including call info aggregator program module or VoIP module.

The presentation module 144 is provided to construct a display screen. The presentation module 144 may include a multimedia module 144-1 to playback and output contents, and UI & graphic module 144-2 to perform UI and graphic processing. The multimedia module 144-1 may include a player module, a camcorder module, or a sound processing module. Accordingly, the presentation module 144 performs playing operation of playing back various contents and generating screen and sound. The UI & graphic module 144-2 may include an image compositor module to composite images, a coordinate compositor module to composite coordinates on the screen on which images are to be displayed, an XII module to receive various events from the hardware, or a 2D/3D UI toolkit to provide tools to construct 2D or 3D UI.

The web browser module 145 refers to a module that accesses web server by web browsing. The web browser module 145 may include various modules including a web view module, a download agent module to perform downloading, a bookmark module, or webkit module.

The contents processing module 146 is software to process the contents stored in the storage 140. The playability determining module 146-1 is a program operating by the algorithm to compare the playability information and content attributes. The parser 146-2 and codec 146-3 are software provided to the video processor 175 for the purpose of content processing. The parser 146-2 is generally implemented as software, and the codec 146-3 is implementable as software or hardware.

Other various application modules such as navigation service module, or game module may also be included.

The program modules illustrated in FIG. 39 may be partially omitted or modified, or new component may be added, depending on types and characteristics of the flexible display apparatus 100. For example, when the flexible display apparatus 100 is a smart phone, e-book application, game application and other utility programs may be additionally provided. Further, some of the program modules of FIG. 39 may be omitted.

Figure 40:
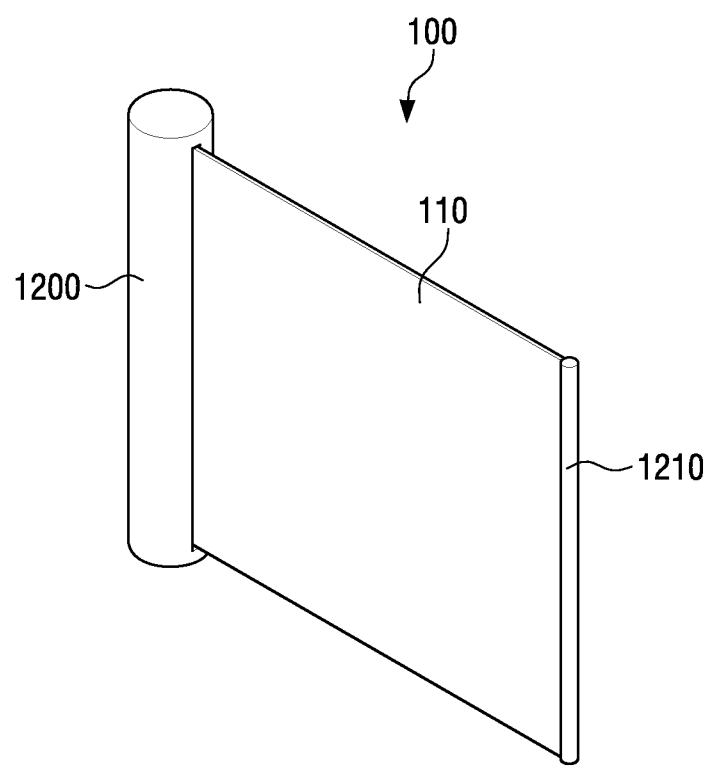
FIGS. 40 and 41 illustrates a flexible display apparatus according to one or more exemplary embodiments.

FIG. 40 illustrates a flexible display apparatus according to an exemplary embodiment.

Referring to FIG. 40, the flexible display apparatus 100 may include a main body 1200, a display 110, and a grip 1210.

The main body 1200 is like a casing that accommodates the display 110 therein. The main body 1200 may include a rotatable roller to roll the display 110. Accordingly, when not in use, the display 110 may be rolled about the rotatable roller into the main body 1200 and stowed.

When the user grips the grip 1210 and pulls out, the rotatable roller rotates to the opposite direction of the rolling. Accordingly, rolling is undone, and the display 110 is withdrawn out of the main body 1200. The rotatable roller may include a stopper (not illustrated). Accordingly, when the user pulls the grip 1210 by more than a predetermined distance, the rotatable roller is stopped by the stopper and the display 110 is fixed.

Meanwhile, when the user presses the button provided in the main body 1200 to release the stopper, the stopper is released, letting the rotatable roller to rotate in the opposite direction. As a result, the display 110 can be rolled back into the main body 1200. The stopper may have a switch configuration to stop the gear operation to rotate the rotatable roller. Any related art rolling structure may be applied to the rotatable roller and the stopper, and this will not be illustrated or explained in detail.

Meanwhile, the main body 1200 includes a power supply (not illustrated). The power supply may be implemented in the form of a battery connector where the disposable battery is mounted, a secondary battery for repeated recharging and use of the user, or solar cell that generates power using solar heat. When implemented as the secondary battery, the power supply may be recharged after the user connects the main body 1200 and external power source by wire. Meanwhile, in addition to the exemplary embodiment of FIG. 40 in which cylindrical structured main body 1200 is employed, the main body 1200 may take various shape such as rectangle or other polygons.

Figure 41:
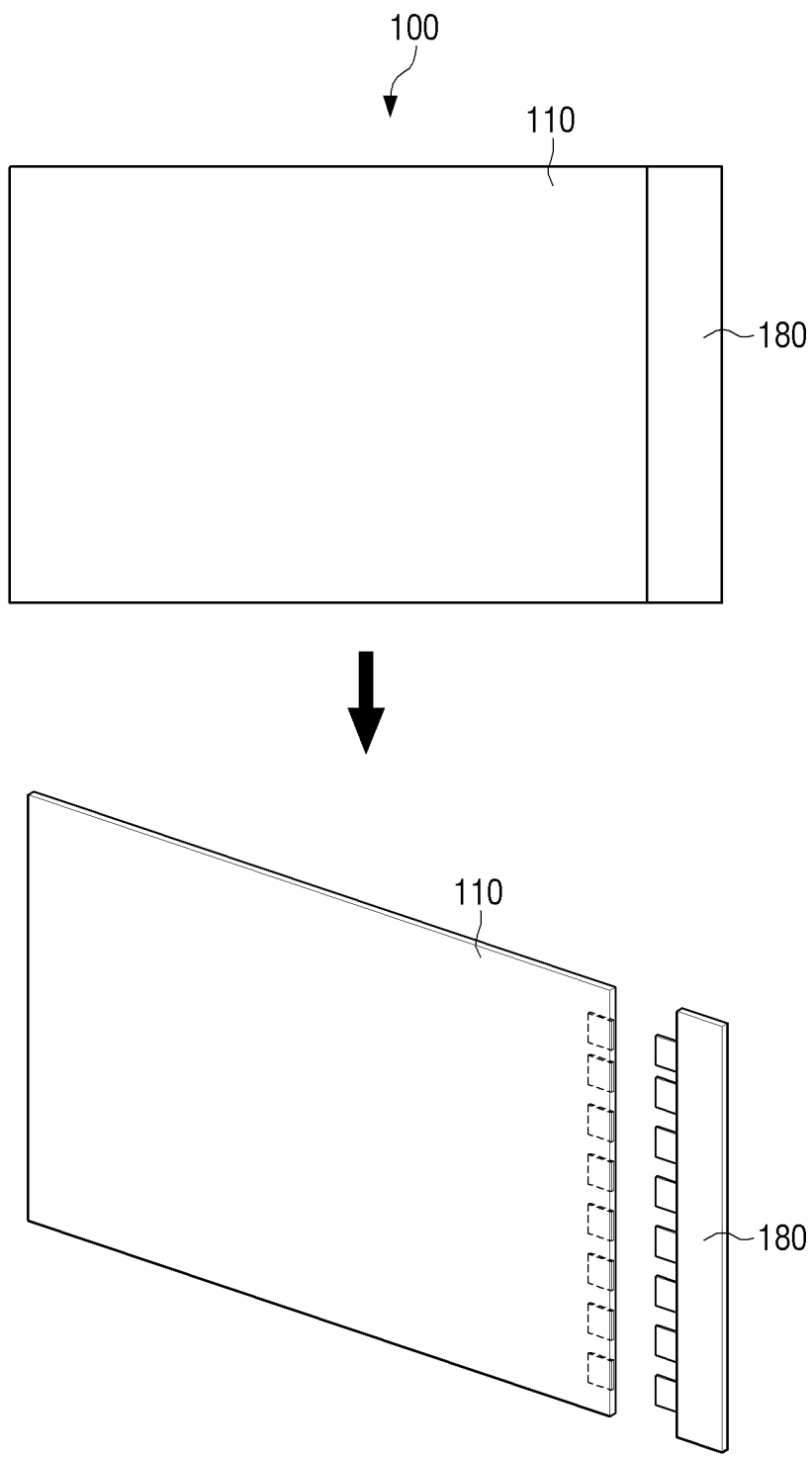

FIG. 41 illustrates a flexible display apparatus according to another exemplary embodiment. Referring to FIG. 41, the power supply 180 may be provided on one edge of the flexible display apparatus 100 and is detachable and attachable.

The power supply 180 may be formed from flexible material and thus is bendable along with the display 110. That is, the power supply 180 may include anode collector, anode, electrolyte, cathode, cathode collector and cladding for the above.

In one exemplary embodiment, the collector may be formed from TiNi-based alloy with good elasticity, pure metal such as copper or aluminum, conductive material such as pure metal coated with carbon, carbon, or carbon fiber, or conductive polymer such as polypyrrol.

The anode may be formed from metal such as lithium, sodium, zinc, magnesium, cadmium, hydrogen storage alloy, or lead, or non-metal such as carbon, or anode material such as polymer electrode material like organic sulfur.

The cathode may be formed from sulfur or metal sulfide, lithium transition metal oxide such as $LiCoO_2$, or cathode material such as $SOCl_2$, $MnO_2$, $Ag2O$, $Cl_2$, $NiCl_2$, $NiOOH$, or polymer electrode. The electrolyte may be implemented as gel type using PEO, PVdF, PMMA, or PVAC.

The cladding may use general polymer resin. For example, PCV, HDPE or epoxy resin may be used. Any other material that can prevent string-shaped battery from breakage and that can bend or curve freely may be used as the cladding.

The cathode and anode of the power supply 180 may include connectors to be electrically connected to outside.

Referring to FIG. 41, the connector is protruded from the power supply 180, and the display 110 includes a recess in the corresponding location, size and shape to those of the connector. Accordingly, by the coupling between the connector and the recess, the power supply 180 is connected to the display 110. The connector of the power supply 180 may be connected to a power connect pad inside the flexible display apparatus 100 to supply power.

In addition to the exemplary embodiment illustrated in FIG. 41 in which the power supply 180 is provided in the attachable and detachable form to and from the one edge of the flexible display apparatus 100, various other exemplary embodiments are possible. Accordingly, the location and shape of the power supply 2400 may vary depending on the characteristic of the product. For example, when the flexible display apparatus 100 has a considerable thickness, the power supply 2400 may be mounted to a rear surface of the flexible display apparatus 100.

Figure 42:
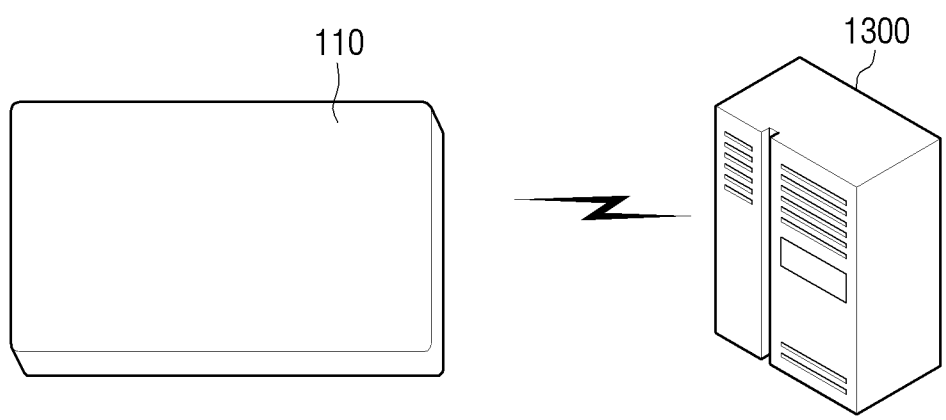
FIG. 42 is a view provided to explain a system according to an exemplary embodiment.

FIG. 42 is a view provided to explain a system according to an exemplary embodiment. Referring to FIG. 42, the system may include a flexible display apparatus 100 and an external server 1300.

The external server 1300 may store various data and transmit the stored data to the flexible display apparatus 100 in response to a request by the flexible display apparatus 100. For example, the external server 1300 may store therein at least one of map screen, road view data, multi-viewpoint image, and graphic information about respective UI planes of 3D UI.

Meanwhile, the flexible display apparatus 100 may request the external server 1300 to transmit data and display the data received from the external server 1300.

For example, the controller 130 may request the external server 1300 to transmit a map screen, and control the communicator 150 to receive the map screen from the external server 1300. The controller 130 may control the communicator 150 to transmit the information about a spot selected by the user on the map screen and receive the road view data photographed at the user-selected spot. To be specific, when the display 110 is bent and divided into a plurality of sub-areas, the controller 130 may control the communicator 150 to transmit information about the viewpoints of the respective sub-areas to the external server 1300 and receive from the external server 1300 the road view data photographed at the viewpoints of the respective sub-areas. Accordingly, the controller 130 may display the road view data corresponding to the respective sub-areas.

Figure 43:
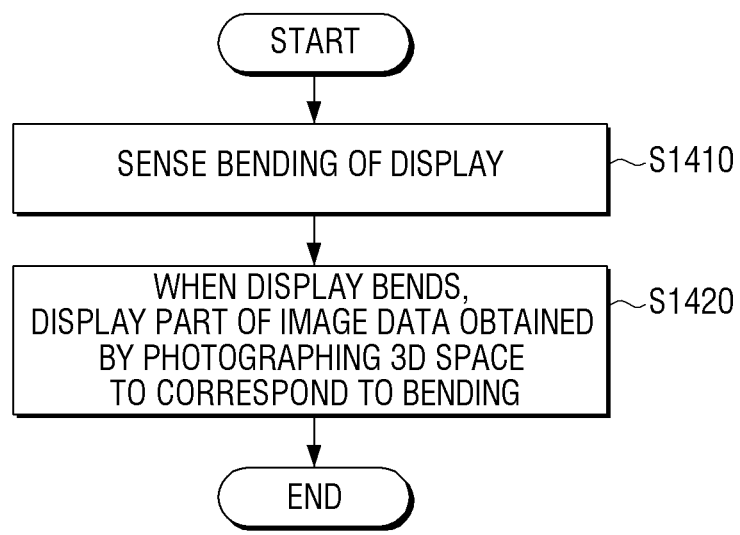
FIG. 43 is a flowchart provided to explain a control method of a flexible display apparatus according to an exemplary embodiment.

FIG. 43 is a flowchart provided to explain a control method of a flexible display apparatus according to an exemplary embodiment. The flexible display apparatus includes a bendable display.

First, at S1410, the bending of the display is sensed.

At S1420, when the display bends, part of the image data photographed from the 3D space is displayed to correspond to the bending. That is, when the display is bent and divided into a plurality of sub-areas, the viewpoints with respect to the 3D space that correspond to the arrangement state of the plurality of sub-areas are determined, and the image data photographed at the determined viewpoints are displayed on the plurality of sub-areas, respectively.

Meanwhile, when the display is rotated so that the arrangement state of the plurality of sub-areas changes, the viewpoints with respect to the 3D space corresponding to the plurality of sub-areas with varied arrangement state are determined, and the image data photographed at the determined viewpoints are displayed on the plurality of sub-areas with varied arrangement state, respectively.

The above will be referenced to the examples explained above with reference to FIGS. 8 to 18.

Figure 44:
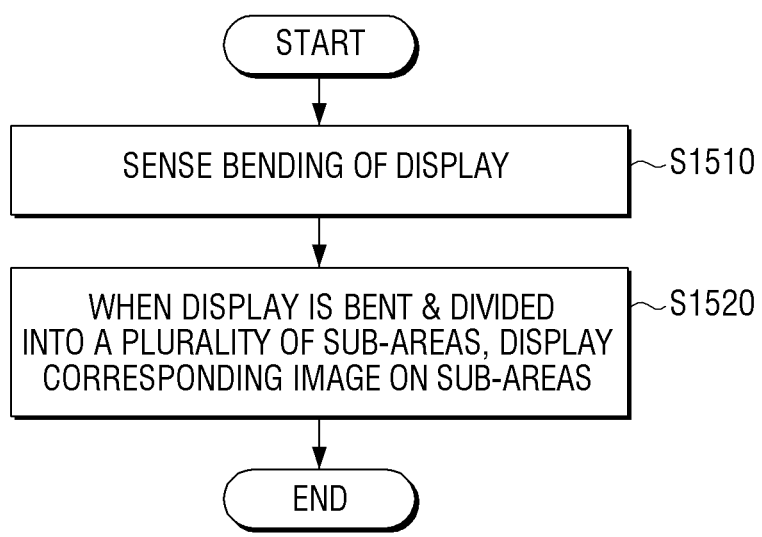
FIG. 44 is a flowchart provided to explain a control method of a flexible display apparatus according to an exemplary embodiment.

FIG. 44 is a flowchart provided to explain a control method of a flexible display apparatus according to an exemplary embodiment. The flexible display apparatus includes a bendable display.

First, at S1510, the bending of the display is sensed.

After that, at S1520, when the display is bent and divided into a plurality of sub-areas, among the multi-viewpoint images of the object, the image corresponding to the arrangement state of the plurality of sub-areas is displayed on the sub-areas. In this case, the object that has been displayed on the display may be displayed on one of the plurality of sub-areas, while the image, among the multi-viewpoint images of the object, corresponding to the angle of bending of the display is displayed on the rest sub-areas.

Meanwhile, when the display is rotated so that the arrangement state of the plurality of sub-areas is changed, the image that has been displayed on the plurality of sub-areas may be replaced with the image corresponding to the changed arrangement state and displayed. To be specific, the arrangement state of a plurality of sub-areas is determined based on the direction and angle of rotation of the display, and the image corresponding to the determined arrangement state, among the multi-viewpoint images of the object, is displayed on each of the plurality of sub-areas. This will be referenced to the explanation above with reference to FIGS. 19 to 24.

Figure 45:
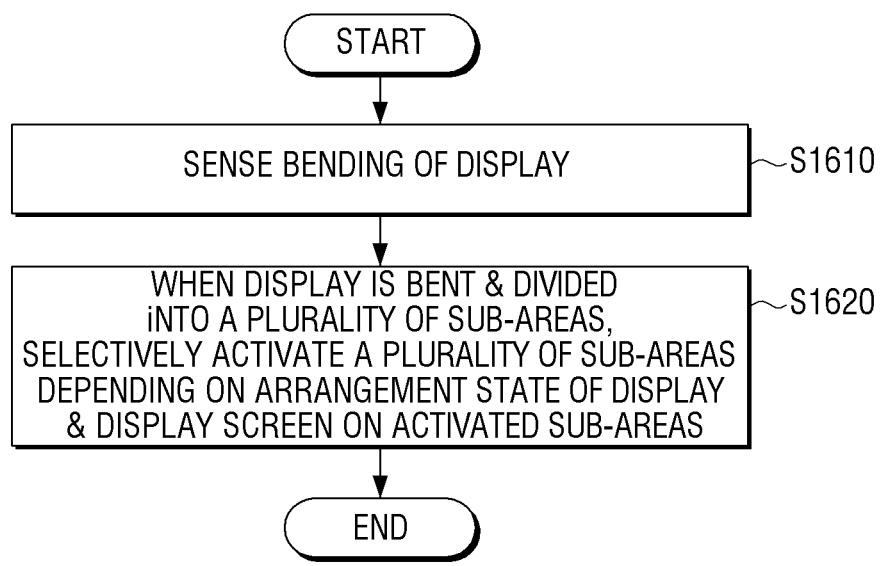
FIG. 45 is a flowchart provided to explain a control method of a flexible display apparatus according to an exemplary embodiment.

FIG. 45 is a flowchart provided to explain a control method of a flexible display apparatus according to an exemplary embodiment. The flexible display apparatus includes a bendable display.

First, at S1610, the bending of the display is sensed.

After that, when the display is bent and divided into a plurality of sub-area, the plurality of sub-areas are selectively activated according to the arrangement state of the display, and a screen is displayed on the activated sub-areas.

To be specific, when the display is arranged so that one of the plurality of sub-areas is adjoined with a supporting surface, the sub-area adjoined with the supporting surface may be inactivated, while the rest sub-areas are activated.

Further, when the display is arranged so that none of the plurality of sub-areas are adjoined with the supporting surface, all the sub-areas may be activated. In this case, the same screen may be displayed on the respective sub-areas, when a difference of areas between the activated sub-areas is within a preset error range.

Meanwhile, the direction of displaying a screen may be differently adjusted according to the direction of arrangement the respective activated sub-areas, and displayed on the respective activated sub-areas. That is, depending on the posture of the respective sub-areas, the screen may be rotated horizontally or vertically and displayed.

The above will be referenced to the explanation provided with reference to FIGS. 31 to 37.

Meanwhile, it is possible to determine a UI plane that corresponds to a plurality of sub-areas, according to the arrangement state of the plurality of sub-areas, based on the graphic information corresponding to the respective UI planes of the 3D polygonal UI, and display the graphic information corresponding to the determined UI plane on the plurality of sub-areas. That is, as explained above with reference to FIGS. 26 to 28, according to arrangement state of the respective sub-areas, the UI plane that matches each sub-area is determined among the UI planes of the 3D UI, and the UI screen constructing the determined UI plane is displayed on each of the sub-areas.

Further, the control method according to an exemplary embodiment may be provided as a program for sequentially implementing the control method, stored on a non-transitory computer readable medium.

The non-transitory computer readable medium refers to the medium that can store the data semi-permanently and readable by a device, rather than medium such as register, cache, or memory that store the data for a brief period of time. To be specific, the application or programs explained above may be stored on the non-transitory computer readable medium such as CD, DVD, hard disk, blu-ray disc, USB, memory card, or ROM.

Further, although the bus is not illustrated in the block diagrams of the display apparatus, the communication among the components of the display apparatus may be implemented via bus. Further, the display apparatus may additionally include a processor such as a CPU or microprocessor which can perform various steps explained above.

According to various exemplary embodiments, when the flexible display apparatus is bent and divided into a plurality of sub-areas, a screen that suits the respective sub-areas can be displayed. As a result, utilization of the flexible display apparatus increases.

The foregoing exemplary embodiments and advantages are merely exemplary and are not to be construed as limiting the exemplary embodiments. The present teaching can be readily applied to other types of apparatuses. Also, the description of the exemplary embodiments are intended to be illustrative, and not to limit the scope of the claims.

What is claimed is:

1. A flexible display apparatus comprising:
a flexible display configured to be deformable;
a sensor configured to sense bending of the flexible display; and
a processor configured to, in response to the bending of the flexible display being sensed while a portion of a panorama image is displayed on the flexible display, determine a bending location and a bending angle of the flexible display, convert at least one of a first image and a second image extracted from the panorama image based on the bending location and the bending angle, and display the converted at least one of the first image and the second image on a corresponding area of sub areas into which the flexible display is divided by the bending location,
wherein the first image and the second image are different portions of the panorama image and represent views from a same viewpoint.

2. The flexible display apparatus of claim 1,
wherein the panorama image is obtained from at least one of photographing a three-dimensional (3D) space, rendering the 3D space, and modeling the 3D space,
wherein the rendering comprises at least one of wireframe rendering, polygon-based rendering, scanline rendering, ray tracing, or radiosity, and
wherein the modeled 3D space is represented by at least one of polygonal modeling, curve modeling, and digital sculpting, and
wherein the modeling is performed by at least one of a constructive solid geometry technique, an implicit surfaces technique, and a subdivision surfaces technique.

3. The flexible display apparatus of claim 1,
wherein the processor is further configured to determine new viewing directions regarding a 3D space that corresponds to the sub-areas with a changed arrangement state, and display new images describing the 3D space viewed from a viewpoint in the new viewing directions on the sub-areas of the changed arrangement state in response to the display being rotated so that the arrangement state of the subareas is changed.

4. The flexible display apparatus of claim 1,
wherein a combination of the first image and the second image are displayed on the sub-areas and each of the sub-areas of the display respectively shows a part of the source image seamlessly.

5. The flexible display apparatus of claim 4,
wherein the combination of the first image and the second image displayed on the sub-areas of the display expands a coverage of the portion of the panorama image displayed on the display prior to the bending of the display.

6. A flexible display apparatus comprising:
a display that is deformable;
a sensor configured to sense deformation of the display; and
a processor configured to, in response to the display being bent and divided into the plurality of sub-areas while a first image from among a plurality of multi-viewpoint images of an object is displayed:
control the display to change a position of the first image on the display such that the first image is displayed on a first sub-area from among the plurality of sub-areas, and
display a second image from among the plurality of multi-viewpoint images of the object, the second image corresponding to an angle of bending of the display, on a second sub area from among the plurality of sub-areas.

7. The flexible display apparatus of claim 6,
wherein the sensor is further configured to sense a rotation with respect to the display, and
wherein the processor is further configured to replace the first image and the second image with other images from among the plurality of multi-viewpoint images of the object in response to the display being rotated without further bending while displaying the first image and the second image.

8. The flexible display apparatus of claim 6,
wherein the processor is further configured to determine an arrangement state of each of the plurality of sub-areas based on a direction and an angle of rotation of the display, and
wherein the display is further configured to display an image, from among multi-viewpoint images of the object, that corresponds to the determined arrangement state on each of the plurality of the sub-areas.

9. A method for controlling a flexible display apparatus comprising a flexible display, the method comprising:
sensing bending of the flexible display while a portion of a panorama image is displayed on the flexible display;
determining a bending location and a bending angle of the flexible display;
converting at least one of a first image and a second image extracted from the panorama image based on the bending location and the bending angle; and
displaying the converted at least one of the first image and the second image on a corresponding area of sub areas into which the flexible display is divided by the bending location,
wherein the first image and second image are different portions of the panorama image and represent views from a same viewpoint.

10. The control method of claim 9,
wherein the panorama image is obtained by at least one of photographing a three-dimensional (3D) space, rendering the 3D space, and modeling the 3D space,
wherein the rendering comprises at least one of wireframe rendering, polygon-based rendering, scanline rendering, ray tracing, or radiosity, and
wherein the modeled 3D space is represented by at least one of polygonal modeling, curve modeling, and digital sculpting, and
wherein the modeling is performed by at least one of a constructive solid geometry technique, an implicit surfaces technique, and a subdivision surfaces technique.

11. The control method of claim 9, further comprising,
rotating the display so that an arrangement state of the sub-areas is changed;
determining new viewing directions regarding a 3D space that corresponds to the sub-areas with changed arrangement state; and
displaying the new images describing the 3D space viewed from the viewpoint in the new viewing directions on the sub-areas with the changed arrangement state.

12. A method of controlling a flexible display apparatus comprising a display, the method comprising:
- sensing deformation of the display while displaying a first image from among a plurality of multi-viewpoint images of an object; and
- changing a position of the first image on the display such that the first image is displayed on a first sub-area from among a plurality of sub-areas; and
- displaying a second image from among the plurality of multi-viewpoint images of the object, the second image corresponding to an angle of bending of the display, on a second sub area from among the plurality of sub-areas.

13. The control method of claim 12, wherein the displaying comprises;
- replacing the first image and the second image with other images from among the plurality of multi-viewpoint images of the object in response to the display being rotated without further bending while displaying the first image and the second image.

14. The control method of claim 12, wherein the displaying further comprises:
- determining the arrangement state of each of the plurality of sub-areas based on a direction and an angle of rotation of the display; and
- displaying an image, from among multi-viewpoint images of the object, that corresponds to the determined arrangement state on each of the corresponding plurality of the sub-areas.

* * * * *